(12) United States Patent
Wheeler et al.

(10) Patent No.: US 10,490,257 B2
(45) Date of Patent: *Nov. 26, 2019

(54) COMPARISON OPERATIONS IN MEMORY

(71) Applicant: Micron Technology, Inc., Boise, ID (US)

(72) Inventors: Kyle B. Wheeler, Meridian, ID (US); Troy A. Manning, Meridian, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 321 days.

This patent is subject to a terminal disclaimer.

(21) Appl. No.: 15/346,526

(22) Filed: Nov. 8, 2016

(65) Prior Publication Data

US 2017/0053693 A1 Feb. 23, 2017

Related U.S. Application Data

(62) Division of application No. 14/715,001, filed on May 18, 2015, now Pat. No. 9,496,023.
(Continued)

(51) Int. Cl.
*G11C 11/4091* (2006.01)
*G11C 7/06* (2006.01)
(Continued)

(52) U.S. Cl.
CPC ......... *G11C 11/4091* (2013.01); *G11C 7/065* (2013.01); *G11C 7/1006* (2013.01);
(Continued)

(58) Field of Classification Search
CPC ............ G11C 11/4091; G11C 11/4087; G11C 11/4093; G11C 11/4096; G11C 7/065; G11C 7/1006; G11C 7/1012
(Continued)

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 101968970 2/2011
CN 102141905 8/2011
(Continued)

OTHER PUBLICATIONS

Notice of Preliminary Rejection for related Korea Patent Application No. 10-2017-7000074, dated Apr. 30, 2018, 7 pages.
(Continued)

*Primary Examiner* — Sung Il Cho
(74) *Attorney, Agent, or Firm* — Brooks, Cameron & Huebsch, PLLC

(57) ABSTRACT

One example of the present disclosure includes performing a comparison operation in memory using a logical representation of a first value stored in a first portion of a number of memory cells coupled to a sense line of a memory array and a logical representation of a second value stored in a second portion of the number of memory cells coupled to the sense line of the memory array. The comparison operation compares the first value to the second value, and the method can include storing a logical representation of a result of the comparison operation in a third portion of the number of memory cells coupled to the sense line of the memory array.

20 Claims, 27 Drawing Sheets

Related U.S. Application Data

(60) Provisional application No. 62/008,007, filed on Jun. 5, 2014.

(51) Int. Cl.
*G11C 7/10* (2006.01)
*G11C 11/4093* (2006.01)
*G11C 11/408* (2006.01)
*G11C 11/4096* (2006.01)
*G11C 11/4076* (2006.01)

(52) U.S. Cl.
CPC ........ *G11C 7/1012* (2013.01); *G11C 11/4076* (2013.01); *G11C 11/4087* (2013.01); *G11C 11/4093* (2013.01); *G11C 11/4096* (2013.01)

(58) Field of Classification Search
USPC .................................................. 365/189.07
See application file for complete search history.

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffman et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 * | 7/2009 | Noda .................. G11C 7/1006 711/154 |
| 7,574,466 B2 | 8/2009 | Beaumont | |
| 7,602,647 B2 | 10/2009 | Li et al. | |
| 7,663,928 B2 | 2/2010 | Tsai et al. | |
| 7,685,365 B2 | 3/2010 | Rajwar et al. | |
| 7,692,466 B2 | 4/2010 | Ahmadi | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mohklesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 * | 8/2012 | Akerib .................. G11C 29/34 365/189.07 |
| 8,274,841 B2 | 9/2012 | Shimano et al. | |

(56) References Cited

U.S. PATENT DOCUMENTS

| | | |
|---|---|---|
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,934,278 B2 * | 1/2015 | Vattikonda .............. G11C 15/00 365/49.17 |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0053007 A1 * | 5/2002 | Birk ....................... G11C 11/565 711/149 |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2005/0146959 A1 * | 7/2005 | Shiga .................. G06F 11/1068 365/205 |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 * | 8/2007 | Gyoten ............... G06F 13/1652 708/200 |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 * | 10/2009 | Akerib ................ G11C 7/1006 711/105 |
| 2010/0067296 A1 | 3/2010 | Li |
| 2010/0091582 A1 | 4/2010 | Vali et al. |
| 2010/0172190 A1 * | 7/2010 | Lavi ........................ G11C 7/02 365/189.2 |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 * | 3/2011 | Manabe ................ G11C 16/349 365/185.22 |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 * | 5/2012 | Mitsubori ............ G11C 29/025 365/72 |
| 2012/0134216 A1 | 5/2012 | Singh |
| 2012/0134226 A1 * | 5/2012 | Chow ...................... G11C 7/08 365/207 |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0243283 A1 | 9/2012 | Akerib |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 * | 5/2013 | Kavalipurapu .... G11C 16/0483 365/185.03 |
| 2013/0117541 A1 | 5/2013 | Choquette et al. |
| 2013/0124783 A1 * | 5/2013 | Yoon ................... G06F 12/0246 711/103 |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0134713 A1 | 5/2015 | Wheeler |
| 2015/0324290 A1 | 11/2015 | Leidel |
| 2015/0325272 A1 | 11/2015 | Murphy |

FOREIGN PATENT DOCUMENTS

| | | |
|---|---|---|
| EP | 0214718 | 3/1987 |
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |

(56) References Cited

FOREIGN PATENT DOCUMENTS

| WO | 2010079451 | 7/2010 |
|---|---|---|
| WO | 2013062596 | 5/2013 |
| WO | 2013081588 | 6/2013 |
| WO | 2013095592 | 6/2013 |

OTHER PUBLICATIONS

Extended European Search Report and Written Opinion for related EP Application No. 15802782.1, dated Feb. 21, 2018, 14 pages.
ARM: "ARM710T Datasheet Open Access—Final", Jul. 1, 1998, pp. 1-6-1-7, XP055449539, retrieved from: http://infocenter.arm.com/help/topic/com.arm.doc.ddi0086b/DDI0086B_710t?ds.pdf.
Boyd et al., "On the General Applicability of Instruction-Set Randomization", Jul.-Sep. 2010, (14 pgs.), vol. 7, Issue 3, IEEE Transactions on Dependable and Secure Computing.
Stojmenovic, "Multiplicative Circulant Networks Topological Properties and Communication Algorithms", (25 pgs.), Discrete Applied Mathematics 77 (1997) 281-305.
"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.
Debnath, Biplob, Bloomflash: Bloom Filter on Flash-Based Storage, 2011 31st Annual Conference on Distributed Computing Systems, Jun. 20-24, 2011, 10 pgs.
Pagiamtzis, Kostas, "Content-Addressable Memory Introduction", Jun. 25, 2007, (6 pgs.), retrieved from: http://www.pagiamtzis.com/cam/camintro.
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
International Search Report and Written Opinion for PCT Application No. PCT/US2013/043702, dated Sep. 26, 2013, (11 pgs.).
Elliot, et al., "Computational RAM: Implementing Processors in Memory", Jan.-Mar. 1999, (10 pgs.), vol. 16, Issue 1, IEEE Design and Test of Computers Magazine.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory As a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
Office Action for related Taiwan Patent Application No. 104118412, dated Aug. 22, 2016, 9 pages.
Office Action for related China Patent Application No. 201580037262.8, dated Aug. 29, 2018, 50 pages.
Communication Pursuant to Article 94(3) EPC for related EP Application No. 15802782.1, dated Feb. 5, 2019, 10 pages.

\* cited by examiner

START:

```
                330                MEMORY ARRAY
Src A       ROW 0   304-0⌒ 1    0    0    0    0   LEAST-SIGNIFICANT
(VALUE1)
            ROW 1   304-1⌒ 1    0    1    0    1

ROW 2   304-2⌒ 0    0    0    1    0   MOST-SIGNIFICANT
                            320-0  320-1  320-2  320-3  320-4
            VALUE (0-2)       3      0      2      4      2
Src B       ROW 3   304-3⌒ 0    1    0    0    1   LEAST-SIGNIFICANT
(VALUE2)
            ROW 4   304-4⌒ 0    0    1    1    0

ROW 5   304-5⌒ 1    0    0    1    0   MOST-SIGNIFICANT
                            322-0  322-1  322-2  322-3  322-4
            VALUE (3-5)       4      1      2      5      1
                            324-0  324-1  324-2  324-3  324-4
tmp         ROW 6   304-6⌒ 0      0      0      0      0
                            326-0  326-1  326-2  326-3  326-4
tmpset      ROW 7   304-7⌒ 0      0      0      0      0
                            328-0  328-1  328-2  328-3  328-4
Abigger (dest) ROW 8 304-8⌒ 0     0      0      0      0
                            330-0  330-1  330-2  330-3  330-4
Bbigger (dest+1) ROW 9 304-9⌒ 0   0      0      0      0
                             ↑     ↑      ↑      ↑      ↑
                           305-0  305-1  305-2  305-3  305-4
```

*Fig. 3A*

ITERATION 1, STEP 1:

330 → MEMORY ARRAY

| | | | | | | | |
|---|---|---|---|---|---|---|---|
| Src A (VALUE1) | ROW 0 | 304-0 1 | 0 | 0 | 0 | 0 | LEAST-SIGNIFICANT |
| | ROW 1 | 304-1 1 | 0 | 1 | 0 | 1 | |
| | ROW 2 | 304-2 0 | 0 | 0 | 1 | 0 | MOST-SIGNIFICANT |
| | VALUE (0-2) | 320-0 3 | 320-1 0 | 320-2 2 | 320-3 4 | 320-4 2 | |
| Src B (VALUE2) | ROW 3 | 304-3 0 | 1 | 0 | 0 | 1 | LEAST-SIGNIFICANT |
| | ROW 4 | 304-4 0 | 0 | 1 | 1 | 0 | |
| | ROW 5 | 304-5 1 | 0 | 0 | 1 | 0 | MOST-SIGNIFICANT |
| | VALUE (3-5) | 322-0 4 | 322-1 1 | 322-2 2 | 322-3 5 | 322-4 1 | |
| tmp | ROW 6 | 324-0 / 304-6 1 | 324-1 0 | 324-2 0 | 324-3 0 | 324-4 0 | |
| tmpset | ROW 7 | 326-0 / 304-7 0 | 326-1 0 | 326-2 0 | 326-3 0 | 326-4 0 | |
| Abigger (dest) | ROW 8 | 328-0 / 304-8 0 | 328-1 0 | 328-2 0 | 328-3 0 | 328-4 0 | |
| Bbigger (dest+1) | ROW 9 | 330-0 / 304-9 0 | 330-1 0 | 330-2 0 | 330-3 0 | 330-4 0 | |
| | | ↑ 305-0 | ↑ 305-1 | ↑ 305-2 | ↑ 305-3 | ↑ 305-4 | |

*Fig. 3B*

ITERATION 1, STEP 2:

330 → MEMORY ARRAY

| | | | 305-0 | 305-1 | 305-2 | 305-3 | 305-4 | |
|---|---|---|---|---|---|---|---|---|
| Src A (VALUE1) | ROW 0 | 304-0 | 1 | 0 | 0 | 0 | 0 | LEAST-SIGNIFICANT |
| | ROW 1 | 304-1 | 1 | 0 | 1 | 0 | 1 | |
| | ROW 2 | 304-2 | 0 | 0 | 0 | 1 | 0 | MOST-SIGNIFICANT |
| | VALUE (0-2) | | 320-0: 3 | 320-1: 0 | 320-2: 2 | 320-3: 4 | 320-4: 2 | |
| Src B (VALUE2) | ROW 3 | 304-3 | 0 | 1 | 0 | 0 | 1 | LEAST-SIGNIFICANT |
| | ROW 4 | 304-4 | 0 | 0 | 1 | 1 | 0 | |
| | ROW 5 | 304-5 | 1 | 0 | 0 | 1 | 0 | MOST-SIGNIFICANT |
| | VALUE (3-5) | | 322-0: 4 | 322-1: 1 | 322-2: 2 | 322-3: 5 | 322-4: 1 | |
| tmp | ROW 6 | 304-6 | 324-0: 1 | 324-1: 0 | 324-2: 0 | 324-3: 0 | 324-4: 0 | |
| tmpset | ROW 7 | 304-7 | 326-0: 1 | 326-1: 0 | 326-2: 0 | 326-3: 0 | 326-4: 0 | |
| Abigger (dest) | ROW 8 | 304-8 | 328-0: 0 | 328-1: 0 | 328-2: 0 | 328-3: 0 | 328-4: 0 | |
| Bbigger (dest+1) | ROW 9 | 304-9 | 330-0: 0 | 330-1: 0 | 330-2: 0 | 330-3: 0 | 330-4: 0 | |

*Fig. 3C*

ITERATION 1, STEP 3:

|  |  |  | 330↘ |  | MEMORY ARRAY |  |  |  |
|---|---|---|---|---|---|---|---|---|
| Src A (VALUE1) | ROW 0 | 304-0 | 1 | 0 | 0 | 0 | 0 | LEAST-SIGNIFICANT |
|  | ROW 1 | 304-1 | 1 | 0 | 1 | 0 | 1 |  |
|  | ROW 2 | 304-2 | 0 | 0 | 0 | 1 | 0 | MOST-SIGNIFICANT |
|  | VALUE (0-2) | | 320-0: 3 | 320-1: 0 | 320-2: 2 | 320-3: 4 | 320-4: 2 |  |
| Src B (VALUE2) | ROW 3 | 304-3 | 0 | 1 | 0 | 0 | 1 | LEAST-SIGNIFICANT |
|  | ROW 4 | 304-4 | 0 | 0 | 1 | 1 | 0 |  |
|  | ROW 5 | 304-5 | 1 | 0 | 0 | 1 | 0 | MOST-SIGNIFICANT |
|  | VALUE (3-5) | | 322-0: 4 | 322-1: 1 | 322-2: 2 | 322-3: 5 | 322-4: 1 |  |
| tmp | ROW 6 | 304-6 | 324-0: 1 | 324-1: 0 | 324-2: 0 | 324-3: 0 | 324-4: 0 |  |
| tmpset | ROW 7 | 304-7 | 326-0: 1 | 326-1: 0 | 326-2: 0 | 326-3: 0 | 326-4: 0 |  |
| Abigger (dest) | ROW 8 | 304-8 | 328-0: 0 | 328-1: 0 | 328-2: 0 | 328-3: 0 | 328-4: 0 |  |
| Bbigger (dest+1) | ROW 9 | 304-9 | 330-0: 0 | 330-1: 0 | 330-2: 0 | 330-3: 0 | 330-4: 0 |  |
|  |  |  | ↑ 305-0 | ↑ 305-1 | ↑ 305-2 | ↑ 305-3 | ↑ 305-4 |  |

*Fig. 3D*

ITERATION 1, STEP 4:

|  |  |  | 330 → | MEMORY ARRAY |  |  |  |  |
|---|---|---|---|---|---|---|---|---|
| Src A (VALUE1) | ROW 0 | 304-0 | 1 | 0 | 0 | 0 | 0 | LEAST-SIGNIFICANT |
|  | ROW 1 | 304-1 | 1 | 0 | 1 | 0 | 1 |  |
|  | ROW 2 | 304-2 | 0 | 0 | 0 | 1 | 0 | MOST-SIGNIFICANT |
|  | VALUE (0-2) |  | 320-0: 3 | 320-1: 0 | 320-2: 2 | 320-3: 4 | 320-4: 2 |  |
| Src B (VALUE2) | ROW 3 | 304-3 | 0 | 1 | 0 | 0 | 1 | LEAST-SIGNIFICANT |
|  | ROW 4 | 304-4 | 0 | 0 | 1 | 1 | 0 |  |
|  | ROW 5 | 304-5 | 1 | 0 | 0 | 1 | 0 | MOST-SIGNIFICANT |
|  | VALUE (3-5) |  | 322-0: 4 | 322-1: 1 | 322-2: 2 | 322-3: 5 | 322-4: 1 |  |
| tmp | ROW 6 | 304-6 | 324-0: 1 | 324-1: 0 | 324-2: 0 | 324-3: 0 | 324-4: 0 |  |
| tmpset | ROW 7 | 304-7 | 326-0: 1 | 326-1: 0 | 326-2: 0 | 326-3: 0 | 326-4: 0 |  |
| Abigger (dest) | ROW 8 | 304-8 | 328-0: 0 | 328-1: 0 | 328-2: 0 | 328-3: 0 | 328-4: 0 |  |
| Bbigger (dest+1) | ROW 9 | 304-9 | 330-0: 1 | 330-1: 0 | 330-2: 0 | 330-3: 0 | 330-4: 0 |  |
|  |  |  | ↑ 305-0 | ↑ 305-1 | ↑ 305-2 | ↑ 305-3 | ↑ 305-4 |  |

*Fig. 3E*

ITERATION 2, STEP 1:

| | | 330 → | | MEMORY ARRAY | | | | |
|---|---|---|---|---|---|---|---|---|
| Src A (VALUE1) | ROW 0 | 304-0 ↘ 1 | 0 | 0 | 0 | 0 | LEAST-SIGNIFICANT | |
| | ROW 1 | 304-1 ↘ 1 | 0 | 1 | 0 | 1 | | |
| | ROW 2 | 304-2 ↘ 0 | 0 | 0 | 1 | 0 | MOST-SIGNIFICANT | |
| | VALUE (0-2) | 320-0 ↘ 3 | 320-1 ↘ 0 | 320-2 ↘ 2 | 320-3 ↘ 4 | 320-4 ↘ 2 | | |
| Src B (VALUE2) | ROW 3 | 304-3 ↘ 0 | 1 | 0 | 0 | 1 | LEAST-SIGNIFICANT | |
| | ROW 4 | 304-4 ↘ 0 | 0 | 1 | 1 | 0 | | |
| | ROW 5 | 304-5 ↘ 1 | 0 | 0 | 1 | 0 | MOST-SIGNIFICANT | |
| | VALUE (3-5) | 322-0 ↘ 4 | 322-1 ↘ 1 | 322-2 ↘ 2 | 322-3 ↘ 5 | 322-4 ↘ 1 | | |
| tmp | ROW 6 | 304-6 ↗ 0 | 324-1 ↘ 0 | 324-2 ↘ 0 | 324-3 ↘ 1 | 324-4 ↘ 1 | | |
| tmpset | ROW 7 | 304-7 ↗ 1 | 326-1 ↘ 0 | 326-2 ↘ 0 | 326-3 ↘ 0 | 326-4 ↘ 0 | | |
| Abigger (dest) | ROW 8 | 304-8 ↗ 0 | 328-1 ↘ 0 | 328-2 ↘ 0 | 328-3 ↘ 0 | 328-4 ↘ 0 | | |
| Bbigger (dest+1) | ROW 9 | 304-9 ↗ 1 | 330-1 ↘ 0 | 330-2 ↘ 0 | 330-3 ↘ 0 | 330-4 ↘ 0 | | |
| | | ↑ 305-0 | ↑ 305-1 | ↑ 305-2 | ↑ 305-3 | ↑ 305-4 | | |

*Fig. 3F*

ITERATION 2, STEP 2:

| | | 330 ↘ | | MEMORY ARRAY | | | | |
|---|---|---|---|---|---|---|---|---|
| Src A (VALUE1) | ROW 0 | 304-0 ~ 1 | 0 | 0 | 0 | 0 | LEAST-SIGNIFICANT | |
| | ROW 1 | 304-1 ~ 1 | 0 | 1 | 0 | 1 | | |
| | ROW 2 | 304-2 ~ 0 | 0 | 0 | 1 | 0 | MOST-SIGNIFICANT | |
| | VALUE (0-2) | 320-0: 3 | 320-1: 0 | 320-2: 2 | 320-3: 4 | 320-4: 2 | | |
| Src B (VALUE2) | ROW 3 | 304-3 ~ 0 | 1 | 0 | 0 | 1 | LEAST-SIGNIFICANT | |
| | ROW 4 | 304-4 ~ 0 | 0 | 1 | 1 | 0 | | |
| | ROW 5 | 304-5 ~ 1 | 0 | 0 | 1 | 0 | MOST-SIGNIFICANT | |
| | VALUE (3-5) | 322-0: 4 | 322-1: 1 | 322-2: 2 | 322-3: 5 | 322-4: 1 | | |
| tmp | ROW 6 | 324-0 / 304-6: 0 | 324-1: 0 | 324-2: 0 | 324-3: 1 | 324-4: 1 | | |
| tmpset | ROW 7 | 326-0 / 304-7: 1 | 326-1: 0 | 326-2: 0 | 326-3: 1 | 326-4: 1 | | |
| Abigger (dest) | ROW 8 | 328-0 / 304-8: 0 | 328-1: 0 | 328-2: 0 | 328-3: 0 | 328-4: 0 | | |
| Bbigger (dest+1) | ROW 9 | 330-0 / 304-9: 1 | 330-1: 0 | 330-2: 0 | 330-3: 0 | 330-4: 0 | | |
| | | ↑ 305-0 | ↑ 305-1 | ↑ 305-2 | ↑ 305-3 | ↑ 305-4 | | |

*Fig. 3G*

ITERATION 2, STEP 3:

330 ⟶ MEMORY ARRAY

| | | | 305-0 | 305-1 | 305-2 | 305-3 | 305-4 | |
|---|---|---|---|---|---|---|---|---|
| Src A (VALUE1) | ROW 0 | 304-0 | 1 | 0 | 0 | 0 | 0 | LEAST-SIGNIFICANT |
| | ROW 1 | 304-1 | 1 | 0 | 1 | 0 | 1 | |
| | ROW 2 | 304-2 | 0 | 0 | 0 | 1 | 0 | MOST-SIGNIFICANT |
| | VALUE (0-2) | | 320-0: 3 | 320-1: 0 | 320-2: 2 | 320-3: 4 | 320-4: 2 | |
| Src B (VALUE2) | ROW 3 | 304-3 | 0 | 1 | 0 | 0 | 1 | LEAST-SIGNIFICANT |
| | ROW 4 | 304-4 | 0 | 0 | 1 | 1 | 0 | |
| | ROW 5 | 304-5 | 1 | 0 | 0 | 1 | 0 | MOST-SIGNIFICANT |
| | VALUE (3-5) | | 322-0: 4 | 322-1: 1 | 322-2: 2 | 322-3: 5 | 322-4: 1 | |
| tmp | ROW 6 | 304-6 | 324-0: 0 | 324-1: 0 | 324-2: 0 | 324-3: 1 | 324-4: 1 | |
| tmpset | ROW 7 | 304-7 | 326-0: 1 | 326-1: 0 | 326-2: 0 | 326-3: 1 | 326-4: 1 | |
| Abigger (dest) | ROW 8 | 304-8 | 328-0: 0 | 328-1: 0 | 328-2: 0 | 328-3: 0 | 328-4: 1 | |
| Bbigger (dest+1) | ROW 9 | 304-9 | 330-0: 1 | 330-1: 0 | 330-2: 0 | 330-3: 0 | 330-4: 0 | |

*Fig. 3H*

ITERATION 2, STEP 4:

|  |  | 330 ⟶ | MEMORY ARRAY | | | | | |
|---|---|---|---|---|---|---|---|---|
| Src A (VALUE1) | ROW 0 | 304-0 | 1 | 0 | 0 | 0 | 0 | LEAST-SIGNIFICANT |
|  | ROW 1 | 304-1 | 1 | 0 | 1 | 0 | 1 |  |
|  | ROW 2 | 304-2 | 0 | 0 | 0 | 1 | 0 | MOST-SIGNIFICANT |
|  | VALUE (0-2) |  | 320-0: 3 | 320-1: 0 | 320-2: 2 | 320-3: 4 | 320-4: 2 |  |
| Src B (VALUE2) | ROW 3 | 304-3 | 0 | 1 | 0 | 0 | 1 | LEAST-SIGNIFICANT |
|  | ROW 4 | 304-4 | 0 | 0 | 1 | 1 | 0 |  |
|  | ROW 5 | 304-5 | 1 | 0 | 0 | 1 | 0 | MOST-SIGNIFICANT |
|  | VALUE (3-5) |  | 322-0: 4 | 322-1: 1 | 322-2: 2 | 322-3: 5 | 322-4: 1 |  |
| tmp | ROW 6 | 304-6 | 324-0: 0 | 324-1: 0 | 324-2: 0 | 324-3: 1 | 324-4: 1 |  |
| tmpset | ROW 7 | 304-7 | 326-0: 1 | 326-1: 0 | 326-2: 0 | 326-3: 0 | 326-4: 0 |  |
| Abigger (dest) | ROW 8 | 304-8 | 328-0: 0 | 328-1: 0 | 328-2: 0 | 328-3: 0 | 328-4: 1 |  |
| Bbigger (dest+1) | ROW 9 | 304-9 | 330-0: 1 | 330-1: 0 | 330-2: 0 | 330-3: 1 | 330-4: 0 |  |
|  |  |  | ↑ 305-0 | ↑ 305-1 | ↑ 305-2 | ↑ 305-3 | ↑ 305-4 |  |

*Fig. 3I*

ITERATION 3, STEP 1:

| | | 330 → | MEMORY ARRAY | | | | | |
|---|---|---|---|---|---|---|---|---|
| Src A (VALUE1) | ROW 0 | 304-0 → 1 | 0 | 0 | 0 | 0 | LEAST-SIGNIFICANT |
| | ROW 1 | 304-1 → 1 | 0 | 1 | 0 | 1 | |
| | ROW 2 | 304-2 → 0 | 0 | 0 | 1 | 0 | MOST-SIGNIFICANT |
| | VALUE (0-2) | 320-0 → 3 | 320-1 → 0 | 320-2 → 2 | 320-3 → 4 | 320-4 → 2 | |
| Src B (VALUE2) | ROW 3 | 304-3 → 0 | 1 | 0 | 0 | 1 | LEAST-SIGNIFICANT |
| | ROW 4 | 304-4 → 0 | 0 | 1 | 1 | 0 | |
| | ROW 5 | 304-5 → 1 | 0 | 0 | 1 | 0 | MOST-SIGNIFICANT |
| | VALUE (3-5) | 322-0 → 4 | 322-1 → 1 | 322-2 → 2 | 322-3 → 5 | 322-4 → 1 | |
| tmp | ROW 6 | 324-0 → 304-6 → 0 | 324-1 → 1 | 324-2 → 0 | 324-3 → 0 | 324-4 → 1 | |
| tmpset | ROW 7 | 326-0 → 304-7 → 1 | 326-1 → 1 | 326-2 → 0 | 326-3 → 1 | 326-4 → 1 | |
| Abigger (dest) | ROW 8 | 328-0 → 304-8 → 0 | 328-1 → 0 | 328-2 → 0 | 328-3 → 0 | 328-4 → 1 | |
| Bbigger (dest+1) | ROW 9 | 330-0 → 304-9 → 1 | 330-1 → 0 | 330-2 → 0 | 330-3 → 1 | 330-4 → 0 | |
| | | ↑ 305-0 | ↑ 305-1 | ↑ 305-2 | ↑ 305-3 | ↑ 305-4 | |

*Fig. 3J*

ITERATION 3, STEP 2:

| | | 330 → | | MEMORY ARRAY | | | | |
|---|---|---|---|---|---|---|---|---|
| Src A (VALUE1) | ROW 0 | 304-0 ↘ 1 | 0 | 0 | 0 | 0 | LEAST-SIGNIFICANT | |
| | ROW 1 | 304-1 ↘ 1 | 0 | 1 | 0 | 1 | | |
| | ROW 2 | 304-2 ↘ 0 | 0 | 0 | 1 | 0 | MOST-SIGNIFICANT | |
| | VALUE (0-2) | 320-0 ↘ 3 | 320-1 ↘ 0 | 320-2 ↘ 2 | 320-3 ↘ 4 | 320-4 ↘ 2 | | |
| Src B (VALUE2) | ROW 3 | 304-3 ↘ 0 | 1 | 0 | 0 | 1 | LEAST-SIGNIFICANT | |
| | ROW 4 | 304-4 ↘ 0 | 0 | 1 | 1 | 0 | | |
| | ROW 5 | 304-5 ↘ 1 | 0 | 0 | 1 | 0 | MOST-SIGNIFICANT | |
| | VALUE (3-5) | 322-0 ↘ 4 | 322-1 ↘ 1 | 322-2 ↘ 2 | 322-3 ↘ 5 | 322-4 ↘ 1 | | |
| tmp | ROW 6 | 304-6 ↗ 0 | 324-1 ↘ 1 | 324-2 ↘ 0 | 324-3 ↘ 0 | 324-4 ↘ 0 | | |
| tmpset | ROW 7 | 304-7 ↗ 1 | 326-1 ↘ 1 | 326-2 ↘ 0 | 326-3 ↘ 1 | 326-4 ↘ 1 | | |
| Abigger (dest) | ROW 8 | 304-8 ↗ 0 | 328-1 ↘ 0 | 328-2 ↘ 0 | 328-3 ↘ 0 | 328-4 ↘ 1 | | |
| Bbigger (dest+1) | ROW 9 | 304-9 ↗ 1 | 330-1 ↘ 0 | 330-2 ↘ 0 | 330-3 ↘ 1 | 330-4 ↘ 0 | | |

ITERATION 3, STEP 3:

|  |  |  | 330 → | MEMORY ARRAY |  |  |  |  |
|---|---|---|---|---|---|---|---|---|
| Src A (VALUE1) | ROW 0 | 304-0 | 1 | 0 | 0 | 0 | 0 | LEAST-SIGNIFICANT |
|  | ROW 1 | 304-1 | 1 | 0 | 1 | 0 | 1 |  |
|  | ROW 2 | 304-2 | 0 | 0 | 0 | 1 | 0 | MOST-SIGNIFICANT |
|  | VALUE (0-2) | | 320-0: 3 | 320-1: 0 | 320-2: 2 | 320-3: 4 | 320-4: 2 |  |
| Src B (VALUE2) | ROW 3 | 304-3 | 0 | 1 | 0 | 0 | 1 | LEAST-SIGNIFICANT |
|  | ROW 4 | 304-4 | 0 | 0 | 1 | 1 | 0 |  |
|  | ROW 5 | 304-5 | 1 | 0 | 0 | 1 | 0 | MOST-SIGNIFICANT |
|  | VALUE (3-5) | | 322-0: 4 | 322-1: 1 | 322-2: 2 | 322-3: 5 | 322-4: 1 |  |
| tmp | ROW 6 | 304-6 | 324-0: 0 | 324-1: 1 | 324-2: 0 | 324-3: 0 | 324-4: 0 |  |
| tmpset | ROW 7 | 304-7 | 326-0: 1 | 326-1: 1 | 326-2: 0 | 326-3: 1 | 326-4: 1 |  |
| Abigger (dest) | ROW 8 | 304-8 | 328-0: 0 | 328-1: 0 | 328-2: 0 | 328-3: 0 | 328-4: 1 |  |
| Bbigger (dest+1) | ROW 9 | 304-9 | 330-0: 1 | 330-1: 0 | 330-2: 0 | 330-3: 1 | 330-4: 0 |  |
|  |  |  | ↑ 305-0 | ↑ 305-1 | ↑ 305-2 | ↑ 305-3 | ↑ 305-4 |  |

*Fig. 3L*

ITERATION 3, STEP 4:

| | | 330 → | | MEMORY ARRAY | | | | |
|---|---|---|---|---|---|---|---|---|
| Src A (VALUE1) | ROW 0 | 304-0 ~ 1 | 0 | 0 | 0 | 0 | LEAST-SIGNIFICANT | |
| | ROW 1 | 304-1 ~ 1 | 0 | 1 | 0 | 1 | | |
| | ROW 2 | 304-2 ~ 0 | 0 | 0 | 1 | 0 | MOST-SIGNIFICANT | |
| | VALUE (0-2) | 320-0<br>3 | 320-1<br>0 | 320-2<br>2 | 320-3<br>4 | 320-4<br>2 | | |
| Src B (VALUE2) | ROW 3 | 304-3 ~ 0 | 1 | 0 | 0 | 1 | LEAST-SIGNIFICANT | |
| | ROW 4 | 304-4 ~ 0 | 0 | 1 | 1 | 0 | | |
| | ROW 5 | 304-5 ~ 1 | 0 | 0 | 1 | 0 | MOST-SIGNIFICANT | |
| | VALUE (3-5) | 322-0<br>4 | 322-1<br>1 | 322-2<br>2 | 322-3<br>5 | 322-4<br>1 | | |
| tmp | ROW 6 | 324-0<br>304-6 ~ 0 | 324-1<br>1 | 324-2<br>0 | 324-3<br>0 | 324-4<br>0 | | |
| tmpset | ROW 7 | 326-0<br>304-7 ~ 1 | 326-1<br>1 | 326-2<br>0 | 326-3<br>1 | 326-4<br>1 | | |
| Abigger (dest) | ROW 8 | 328-0<br>304-8 ~ 0 | 328-1<br>0 | 328-2<br>0 | 328-3<br>0 | 328-4<br>1 | | |
| Bbigger (dest+1) | ROW 9 | 330-0<br>304-9 ~ 1 | 330-1<br>1 | 330-2<br>0 | 330-3<br>1 | 330-4<br>0 | | |
| | | ↑<br>305-0 | ↑<br>305-1 | ↑<br>305-2 | ↑<br>305-3 | ↑<br>305-4 | | |

*Fig. 3M*

| | | 844 | 845 | 856 | 870 | 871 | | |
|---|---|---|---|---|---|---|---|---|
| | | A | B | NOT OPEN | OPEN TRUE | OPEN INVERT | | |
| | | 0 | 0 | 0 | 0 | 1 | | |
| | | 0 | 1 | 0 | 1 | 0 | | |
| | 875 → | | | ⋈ | | | | |
| | | 1 | 0 | 1 | 0 | 1 | | |
| | | 1 | 1 | 1 | 1 | 0 | | |

| | A | B | A | A*B | A*B̄ | A+B | B | A⊕B | A+B̄ | A⊕B̄ | B̄ | |
|---|---|---|---|---|---|---|---|---|---|---|---|---|
| FF | | | 0 | 0 | 0 | 0 | 0 | 0 | 1 | 1 | 1 | ← 876 |
| FT | | | 0 | 0 | 0 | 1 | 1 | 1 | 0 | 0 | 0 | ← 877 |
| TF | | | 0 | 0 | 1 | 0 | 0 | 1 | 0 | 0 | 1 | ← 878 |
| TT | | | 0 | 1 | 0 | 0 | 1 | 0 | 0 | 1 | 0 | ← 879 |
| | 0 | 0 | 0 | 0 | 0 | 0 | 0 | 0 | 1 | 1 | 1 | ← 847 |
| | 0 | 1 | 0 | 0 | 0 | 1 | 1 | 1 | 0 | 0 | 0 | |
| | 1 | 0 | 1 | 0 | 1 | 1 | 0 | 1 | 1 | 0 | 1 | |
| | 1 | 1 | 1 | 1 | 0 | 1 | 1 | 0 | 1 | 1 | 0 | |

(876–879 grouped as 880)

*Fig. 8*

COMPARISON OPERATIONS IN MEMORY

PRIORITY INFORMATION

This application is a Divisional of U.S. application Ser. No. 14/715,001, filed May 18, 2015, which issues as U.S. Pat. No. 9,496,023 on Nov. 15, 2016, which claims benefit of priority under 35 U.S.C. 119(e) to U.S. Provisional Application Ser. No. 62/008,007, filed Jun. 5, 2014, the contents of which are incorporated herein by reference.

TECHNICAL FIELD

The present disclosure relates generally to semiconductor memory apparatuses and methods, and more particularly, to apparatuses and methods related to performing comparison operations in a memory.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units (e.g., herein referred to as functional unit circuitry (FUC)) such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

A number of components in an electronic system may be involved in providing instructions to the functional unit circuitry for execution. The instructions may be generated, for instance, by a processing resource such as a controller and/or host processor. Data (e.g., the operands on which the instructions will be executed to perform the logical operations) may be stored in a memory array that is accessible by the FUC. The instructions and/or data may be retrieved from the memory array and sequenced and/or buffered before the FUC begins to execute instructions on the data. Furthermore, as different types of operations may be executed in one or multiple clock cycles through the FUC, intermediate results of the operations and/or data may also be sequenced and/or buffered.

In many instances, the processing resources (e.g., processor and/or associated FUC) may be external to the memory array, and data can be accessed (e.g., via a bus between the processing resources and the memory array to execute instructions). Data can be moved from the memory array to registers external to the memory array via a bus.

BRIEF DESCRIPTION OF THE DRAWINGS

FIGS. 2C-1 and 2C-2 illustrate timing diagrams associated with performing a number of logical operations using sensing circuitry in accordance with a number of embodiments of the present disclosure.

FIGS. 2D-1 and 2D-2 illustrate timing diagrams associated with performing a number of logical operations using sensing circuitry in accordance with a number of embodiments of the present disclosure.

FIG. 3A illustrates a logical diagram showing the states of cells of a portion of an array at a particular phase associated with performing a serial comparison operation in accordance with a number of embodiments of the present disclosure.

FIG. 3B illustrates a logical diagram showing the states of the cells of array portion at a particular phase associated with performing a comparison operation.

FIG. 3C illustrates a logical diagram showing the states of the cells of array portion at a particular phase associated with performing a comparison operation.

FIG. 3D illustrates a logical diagram showing the states of the cells of array portion at a particular phase associated with performing a comparison operation.

FIG. 3E illustrates a logical diagram showing the states of the cells of array portion at a particular phase associated with performing a comparison operation.

FIG. 3F illustrates a logical diagram showing the states of the cells of array portion at a particular phase associated with performing a comparison operation.

FIG. 3G illustrates a logical diagram showing the states of the cells of array portion at a particular phase associated with performing a comparison operation.

FIG. 3H illustrates a logical diagram showing the states of the cells of array portion at a particular phase associated with performing a comparison operation.

FIG. 3I illustrates a logical diagram showing the states of the cells of array portion at a particular phase associated with performing a comparison operation.

FIG. 3J illustrates a logical diagram showing the states of the cells of array portion at a particular phase associated with performing a comparison operation.

FIG. 3K illustrates a logical diagram showing the states of the cells of array portion at a particular phase associated with performing a comparison operation.

FIG. 3L illustrates a logical diagram showing the states of the cells of array portion at a particular phase associated with performing a comparison operation.

FIG. 3M illustrates a logical diagram showing the states of the cells of array portion at a particular phase associated with performing a comparison operation.

FIG. 8 is a logic table illustrating selectable logic operation results implemented by a sensing circuitry in accordance with a number of embodiments of the present disclosure.

DETAILED DESCRIPTION

Figure 1:
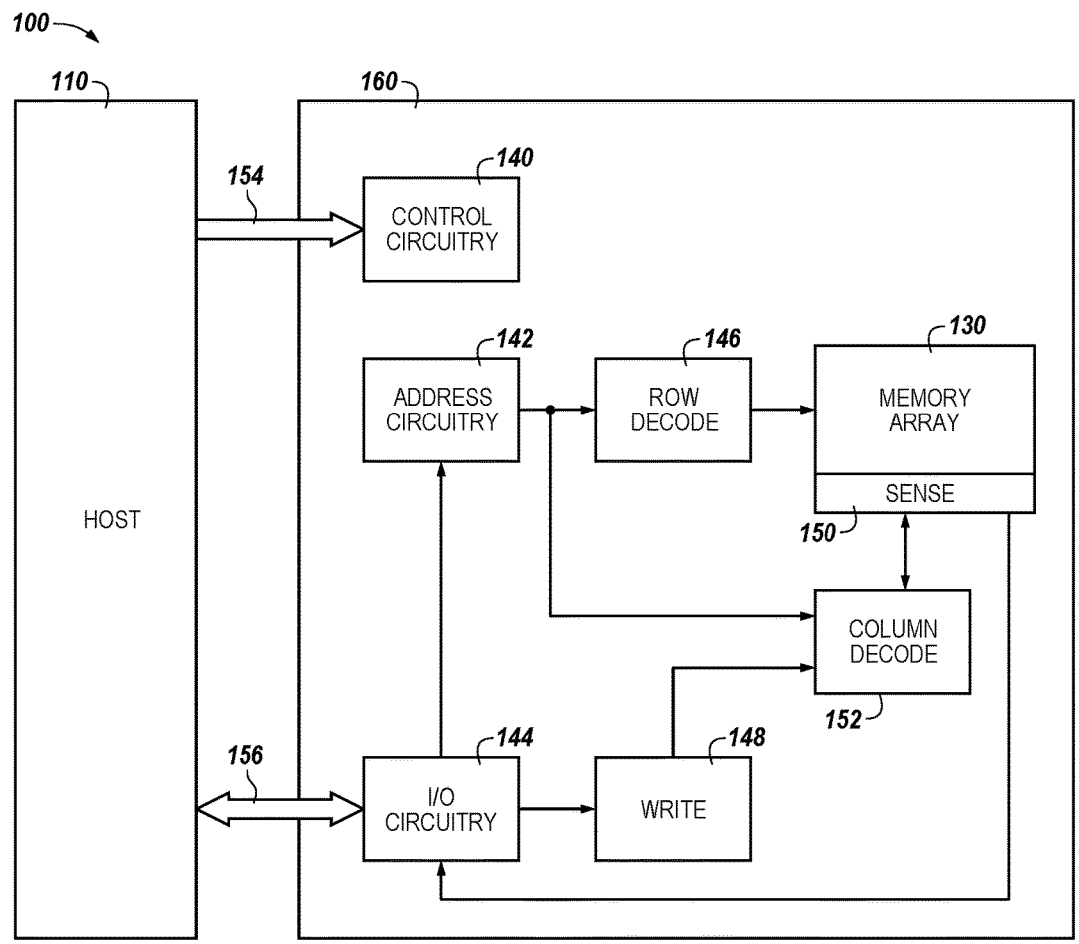
FIG. 1 is a block diagram of an apparatus in the form of a computing system including a memory device in accordance with a number of embodiments of the present disclosure.

The present disclosure includes apparatuses and methods related to comparison operations for memory. An example of logical values storable in a bit-vector (e.g., in a memory array) comprises a first address space comprising memory cells coupled to a sense line and to a first number of select lines. The memory cells of the first address space can store a first value. A second address space comprises memory cells coupled to the sense line and to a second number of select lines. The memory cells of the second address space can store a second value. The results of the comparison operation are stored in a third address space comprising memory cells coupled to the sense line and to a third number of select lines. The memory cells of the third address space can store a logical representation of the result of the comparison operation.

As used herein, the first value and the second value are numerical values that are compared against each other. That is, the first value can be compared to the second value and/or the second value can be compared to the first value. A comparison operation can determine whether the first value is greater than the second value, whether the second value is greater than the first value, and/or whether the first value is equal to the second value.

A number of embodiments of the present disclosure can provide a reduction of the number of computations and a time involved in performing a number of comparison operations (e.g., comparison functions) over previous approaches. The computations and the time can be reduced because the number of comparison operations can be performed in parallel (e.g., simultaneously). Performing the number of comparison operations in parallel can reduce the computations involved in performing the number of comparison operations. Performing a number of comparison operations in parallel can also reduce power consumption in performing a number of computations. For instance, a number of embodiments can provide for performing a comparison operation using data (e.g., a first value and a second value) stored logically (e.g., in binary form in a number of memory cells in a memory array). The embodiment can perform a comparison operation without transferring data out of the memory array and/or sensing circuitry via a bus (e.g., data bus, address bus, control bus, etc.). A comparison operation can involve performing a number of logical operations (e.g., AND, OR, XOR, etc.). However, embodiments are not limited to these examples.

In previous approaches, data (e.g., a first value and a second value) may be transferred from the array and sensing circuitry to a number of registers via a bus comprising input/output (I/O) lines. The number of registers can be used by a processing resource such as a processor, microprocessor, and/or compute engine, which may comprise ALU circuitry and/or other functional unit circuitry configured to perform the appropriate logical operations. However, only a single comparison function can be performed by the ALU circuitry. Transferring data to/from memory from/to registers via a bus can involve significant power consumption and time requirements. Even if the processing resource is located on a same chip as the memory array, significant power can be consumed in moving data out of the array to the compute circuitry, which can involve performing a sense line address access (e.g., firing of a column decode signal) in order to transfer data from sense lines onto I/O lines, moving the data to the array periphery, and providing the data to a register in association with a comparison function, for instance.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N," "M," "F," "R," and "P" particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 204 may reference element "04" in FIG. 2A, and a similar element may be referenced as 304 in FIG. 3A. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense FIG. 1 is a block diagram of an apparatus in the form of a computing system 100 including a memory device 160 in accordance with a number of embodiments of the present disclosure. As used herein, a memory device 160, a memory array 130, and/or sensing circuitry 150 might also be separately considered an "apparatus."

System 100 includes a host 110 coupled to memory device 160, which includes a memory array 130. Host 110 can be a host system such as a personal laptop computer, a desktop computer, a digital camera, a mobile telephone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 160 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures (e.g., a Turing machine), which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by select lines (which may be referred to herein as word lines or access lines) and columns coupled by sense lines (which may be referred to herein as digit lines or data lines). Although a single array 130 is shown in FIG. 1, embodiments are not so limited. For instance, memory device 160 may include a number of arrays 130 (e.g., a number of banks of DRAM cells). An example DRAM array is described in association with FIG. 2A.

The memory device 160 includes address circuitry 142 to latch address signals provided over an I/O bus 156 (e.g., a data bus) through I/O circuitry 144. Address signals are received and decoded by a row decoder 146 and a column decoder 152 to access the memory array 130. In a number of examples, address signals can be decoded by more or fewer row decoders. For example, memory device can include three row decoders. As used herein, a row decoder may be referred to as a select decoder. Data can be read from memory array 130 by sensing voltage and/or current changes on the sense lines using sensing circuitry 150. The sensing circuitry 150 can read and latch a page (e.g., row) of data from the memory array 130. The I/O circuitry 144 can be used for bi-directional data communication with host 110 over the I/O bus 156. The write circuitry 148 is used to write data to the memory array 130.

In a number of examples, the term decoding can include a pre-decoding, final-decoding, and/or any other type of decoding that is carried out in row decoder 146 and/or column decoder 152. In a number of examples, the term pre-decoding includes circuitry implementing pre-decoding process such that addresses are not discretely addressed. The term pre-decoding and decoding can be used herein to differentiate between the terms discretely addressable lines, and/or individually addressable lines.

In a number of examples, a number of select lines and/or sense lines in memory array 130 can be individually addressed and/or decoded independently from the other select lines and/or sense lines of memory array 130. As used herein, a discrete address can be an address that does not require decoding in order to activate a particular select line. For example, address circuitry 142 can receive an address associated with a number of select lines that can be activated without decoding an address associated with the number of select lines. In a number of examples, individually addressed rows and/or discretely addresses rows can be referred to as fully decoded rows. The memory cells associated with memory array 130 can comprise memory cells otherwise used in DRAM arrays, SRAM arrays, STT RAM arrays, PCRAM arrays, TRAM arrays, RRAM arrays, NAND flash arrays, and/or NOR flash arrays, among other memory configurations, for instance.

Control circuitry 140 decodes signals provided by control bus 154 from the host 110. These signals can include chip enable signals, write enable signals, and address latch signals that are used to control operations performed on the memory array 130, including data read, data write, and data erase operations. In various embodiments, the control circuitry 140 is responsible for executing instructions from the host 110. The control circuitry 140 can be a state machine, a sequencer, or some other type of controller.

An example of the sensing circuitry 150 is described further below in association with FIG. 2A and FIGS. 3A-3M. For instance, in a number of embodiments, the sensing circuitry 150 can comprise a number of sense amplifiers and a number of compute components, which may comprise an accumulator and can be used to perform logical operations (e.g., on data associated with complementary sense lines). In a number of embodiments, the sensing circuitry (e.g., 150) can be used to perform comparison operations using data stored in array 130 as inputs and store the results of the comparison operations back to the array 130 without transferring via a sense line address access (e.g., without firing a column decode signal). Memory cells coupled to select lines and sense lines in memory array 130 can serve as temporary storage (e.g., registers) during the performance of the comparison operations and/or computations involved in performing the comparison operations. As such, a comparison function can be performed using sensing circuitry 150 rather than and/or in addition to being performed by processing resources external to the sensing circuitry (e.g., by a processor associated with host 110 and/or other processing circuitry, such as ALU circuitry, located on device 160 (e.g., on control circuitry 140 or elsewhere)).

In various previous approaches, data associated with a comparison operation, for instance, would be read from memory via sensing circuitry and provided to an external ALU. The external ALU circuitry would perform the comparison functions using the operands and the result could be transferred back to the array via the local I/O lines. In contrast, in a number of embodiments of the present disclosure, sensing circuitry (e.g., 150) is configured to perform a comparison operation on data stored in memory cells in memory array 130 and store the result back to the array 130 without enabling a local I/O line coupled to the sensing circuitry.

As such, in a number of embodiments, registers and/or an ALU external to array 130 and sensing circuitry 150 may not be needed to perform the comparison function as the sensing circuitry 150 can perform the appropriate computations involved in performing the comparison function using the address space of memory array 130. Additionally, the comparison function can be performed without the use of an external processing resource.

Figure 2A:
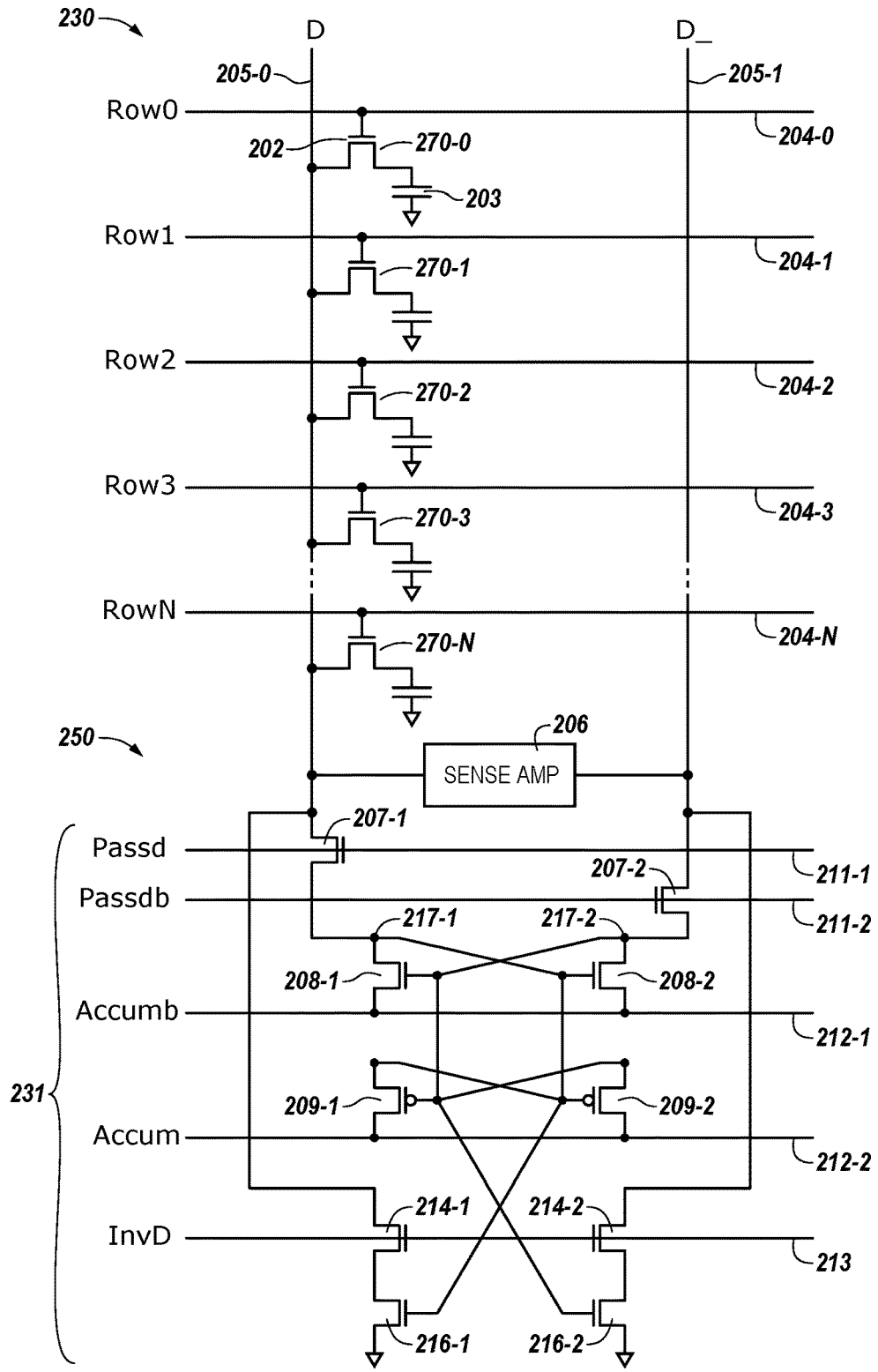
FIG. 2A illustrates a schematic diagram of a portion of a memory array in accordance with a number of embodiments of the present disclosure.

FIG. 2A illustrates a schematic diagram of a portion of a memory array 230 in accordance with a number of embodiments of the present disclosure. In this example, the memory array 230 is a DRAM array of 1T1C (one transistor one capacitor) memory cells 270-0, 270-1, 270-2, ..., 270-N-1, 270-N (e.g., referred to collectively as memory cells 270) each comprised of an access device 202 (e.g., transistor) and a storage element 203 (e.g., a capacitor).

In a number of embodiments, the memory cells 270 are destructive read memory cells (e.g., reading the data stored in the cell destroys the data such that the data originally stored in the cell is refreshed after being read). The memory cells 270 are arranged in rows coupled by select lines 204-0 (Row0), 204-1 (Row1), 204-2 (Row2), . . . , 204-N-1 (RowN-1), 204-N(RowN) (e.g., referred to collectively as select lines 204) and columns coupled by sense lines (e.g., digit lines) 205-0 (D) and 205-1 (D_) (e.g., referred to collectively as sense lines 205). In a number of embodiments, the array 230 can include address spaces that are coupled to separate circuitry.

In this example, each column of cells is associated with a pair of complementary sense lines 205-0 (D) and 205-1 (D_). The structure illustrated in FIG. 2A may be used to provide many complimentary sense lines 205, select lines 204 and/or memory cells 270). Although only a single column of memory cells 270 is illustrated in FIG. 2A, embodiments are not so limited. For instance, a particular array may have a number of columns of cells and/or sense lines (e.g., 4,096, 8,192, 16,384, etc.). In FIG. 2A, memory cells 270 are coupled to sense line 205-0. A gate of a particular cell transistor 202 is coupled to its corresponding select line 204-0 to 204-N (e.g., referred to collectively as select lines 204), a first source/drain region is coupled to its corresponding sense line 205-0, and a second source/drain region of a particular cell transistor is coupled to its corresponding capacitor, e.g., capacitor 203. Although not illustrated in FIG. 2A, the sense line 205-1 may also have memory cells coupled thereto.

In a number of examples, memory cells 270 that are coupled to sense line 205-0 can store bits. The bits can represent a logical representation of a value and/or a number of values (e.g., first value, second value, a temporary value, and/or result value). For example, a first value can be represented by a three bit-vector that can be stored in memory cell 270-0, memory cell 270-1, and memory cell 270-2 along sense line 205-0. In a number of examples, a bit-vector can be represented by more or fewer bits than those discussed in FIG. 2A. Other examples are discussed in connection with FIGS. 3A-3M. For example, the first value can be represented by a 4-bit vector, a 8 bit-vector, a 16 bit-vector, and/or a 32 bit-vector, among other bit-vector dimensions. In a number of examples, each bit-vector representation of a value can be stored horizontally along select lines 204 as opposed to vertically along sense lines 205.

Each bit-vector logical representation of a value can be indexed. For example, a bit stored in memory cell 270-0 can be associated with a first index, a bit stored in memory cell 270-1 can be associated with a second index, and a bit stored in memory cell 270-2 can be associated with a third index. As an example, the third index can indicate a most significant bit (MSB) of a stored bit-vector and the first index can indicate a least significant bit (LSB) of the stored bit-vector. In a number of examples, a comparison operation can be performed by comparing the bits that represent a logical representation of the first value to the bits that represent a logical representation of the second value. The comparison operation can be performed by first comparing a most significant bit from the logical representation of the first value to a most significant bit from the logical representation of the second value. The comparison operation can continue by comparing a next most significant bit from the logical representation of the first value to a next most significant bit from the logical representation of the second value. A next most significant bit can represent a bit that is associated with an index that is decremented every time an iteration of the comparison operation is performed.

The indexing used in association with FIG. 2A is demonstrative and not limiting. Other indexing systems and/or orders can be employed in a number of embodiments. For examples, a bit stored in memory 270-2 can be associated with a first index, a bit stored in memory cell 270-1 can be associated with a second index, and a bit stored in memory cell 270-3 can be associated with a third index. Furthermore, the operations described herein can be performed using a number of different layouts and/or memory cell orientations.

A number of values can be stored in each of the sense lines of memory array 230. For example, memory cells 270-0, 270-1, 270-2 can store a number of bits that represent a first value, memory cells 270-3, 270-4, 270-5 can store a number of bits that represent a second value, memory cell 270-6 can store a number of bits that represent a first temporary value, memory cell 270-7 can store a number of bits that represent a second temporary value, and memory cells 270-8, 270-9 can store a number of bits that represent a result of the comparison operation while memory cell 270-4 to memory cell 270-9 are not illustrated in FIG. 2A they are included in the range of memory cells 270-0 . . . 270-N. Memory cells 270-0 to 270-9 as shown coupled to a first sense line. Memory cells coupled to a different sense line can store a number of bits that represent a different first value, a different second value, a different first temporary value, a different second temporary value, and/or a different result of a different comparison operation.

In a number of examples, the memory cells coupled to a select line 204-0 and to a number of sense lines (e.g., sense line 205-0 and sense line 205-1) can be activated in parallel. Furthermore, memory cell 270-0, memory cell 270-1, memory cell 270-2, memory cell 270-3 can also be activated in parallel by activating select line 204-0, select line 204-1, select line 204-2, and select line 204-3 in parallel. In a number of examples, independently addressed select lines 204 and/or sense lines 205 can be activated in parallel to activate a number of memory cells in parallel.

The sensing circuitry 250 comprises a sense amplifier 206 and a compute component 231. The sensing circuitry 250 can be sensing circuitry 150 shown in FIG. 1. FIG. 2A also shows sensing circuitry 250 coupled to the memory array 230. The sense amplifier 206 is coupled to the complementary sense lines D, D_ corresponding to a particular column of memory cells. The sense amplifier 206 can be operated to determine a state (e.g., logic data value) stored in a selected cell (e.g., memory cells 270). Embodiments are not limited to a given sense amplifier architecture or type. For instance, sensing circuitry in accordance with a number of embodiments described herein can include current-mode sense amplifiers and/or single-ended sense amplifiers (e.g., sense amplifiers coupled to one sense line).

In a number of embodiments, a compute component 231 can comprise a number of transistors formed on pitch with the transistors of the sense amplifier 206 and/or the memory cells 270 of the array (e.g., 230), which may conform to a particular feature size (e.g., $4F^2$, $6F^2$, etc.). As used herein, on pitch is used to describe circuitry that is coupled to a same sense line along a same column. As described further below, the compute component 231 can, in conjunction with the sense amplifier 206, operate to perform a comparison operation using data from the memory cells 270 in the array 230 as input and store the result back to the memory cells 270 in the array 230 without transferring the data via a sense line address access (e.g., without firing a column decode signal such that data is transferred to circuitry external from the array and sensing circuitry via local I/O lines). As such, a number of embodiments of the present disclosure can enable performing a comparison operation and computations associated therewith using less power than various previous approaches. Additionally, since a number of embodiments eliminate the need to transfer data across local I/O lines in order to perform compute functions, a number of embodiments can enable an increased parallel processing capability using compute components 231 and the memory cells 270 as compared to previous approaches.

In the example illustrated in FIG. 2A, the circuitry corresponding to compute component 231 comprises five transistors coupled to each of the sense lines D and D_; however, embodiments are not limited to this example. Transistors 207-1 and 207-2 have a first source/drain region coupled to sense lines D and D_, respectively, and a second source/drain region coupled to a cross coupled latch (e.g., coupled to gates of a pair of cross coupled transistors, such as cross coupled NMOS transistors 208-1 and 208-2 and cross coupled PMOS transistors 209-1 and 209-2). As described further herein, the cross coupled latch comprising transistors 208-1, 208-2, 209-1, and 209-2 can be referred to as a secondary latch (e.g., a cross coupled latch corresponding to sense amplifier 206 can be referred to herein as a primary latch).

The transistors 207-1 and 207-2 can be referred to as pass transistors, which can be enabled via respective signals 211-1 (Passd) and 211-2 (Passdb) in order to pass the voltages or currents on the respective sense lines D and D_ to the inputs of the cross coupled latch comprising transistors 208-1, 208-2, 209-1, and 209-2 (e.g., the input of the secondary latch). In this example, the second source/drain region of transistor 207-1 is coupled to a first source/drain region of transistors 208-1 and 209-1 as well as to the gates of transistors 208-2 and 209-2. Similarly, the second source/drain region of transistor 207-2 is coupled to a first source/drain region of transistors 208-2 and 209-2 as well as to the gates of transistors 208-1 and 209-1.

A second source/drain region of transistor 208-1 and 208-2 is commonly coupled to a negative control signal 212-1 (Accumb). A second source/drain region of transistors 209-1 and 209-2 is commonly coupled to a positive control signal 212-2 (Accum). The Accum signal 212-2 can be a supply voltage (e.g., Vcc) and the Accumb signal can be a reference voltage (e.g., ground). Enabling signals 212-1 and 212-2 activate the cross coupled latch comprising transistors 208-1, 208-2, 209-1, and 209-2 corresponding to the secondary latch. The activated cross coupled latch operates to amplify a differential voltage between common node 217-1 and common node 217-2 such that node 217-1 is driven to one of the Accum signal voltage and the Accumb signal voltage (e.g., to one of Vcc and ground), and node 217-2 is driven to the other of the Accum signal voltage and the Accumb signal voltage. As described further below, the signals 212-1 and 212-2 are labeled "Accum" and "Accumb" because the secondary latch can serve as an accumulator while being used to perform a logical operation (e.g., a comparison operation). In a number of embodiments, an accumulator comprises the cross coupled transistors 208-1, 208-2, 209-1, and 209-2 forming the secondary latch as well as the pass transistors 207-1 and 207-2. As described further herein, in a number of embodiments, a compute component comprising an accumulator coupled to a sense amplifier can be configured to perform a logical operation that comprises performing an accumulate operation on a data value represented by a signal (e.g., voltage or current) on at least one of a pair of complementary sense lines.

The compute component 231 also includes inverting transistors 214-1 and 214-2 having a first source/drain region coupled to the respective digit lines D and D_. A second source/drain region of the transistors 214-1 and 214-2 is coupled to a first source/drain region of transistors 216-1 and 216-2, respectively. The gates of transistors 214-1 and 214-2 are coupled to a signal 213 (InvD). The gate of transistor 216-1 is coupled to the common node 217-1 to which the gate of transistor 208-2, the gate of transistor 209-2, and the first source/drain regions of transistors 208-1 and 209-1 are also coupled. In a complementary fashion, the gate of transistor 216-2 is coupled to the common node 217-2 to which the gate of transistor 208-1, the gate of transistor 209-1, and the first source/drain regions of transistor 208-2 and 209-2 are also coupled. As such, enabling signal InvD serves to invert the data value stored in the secondary latch and drives the inverted value onto sense lines 205-0 and 205-1.

In FIG. 2A, the compute component 231 is configured to perform a comparison operation. The following example will demonstrate how a comparison operation can be performed using data stored in array 230 as the inputs, and how the result of the comparison operation can be stored in the array via operation of the sensing circuitry (e.g., sense amplifier 206 and compute component 231). The example involves using the data values (e.g., bits having logic "1" or logic "0") stored in the memory cells 270 coupled to select lines 204-0 to 204-N and commonly coupled to sense line 205-0 as the respective inputs to the comparison operation. The result of the comparison operation can be stored back in memory cells coupled to sense line 205-0.

As an example, the compute component 231 can use a first value and a second value stored in a first portion and a second portion of a number of memory cells 270 that are coupled to sense line 205-0. The first portion can include a first number of memory cells, (e.g., memory cells 270-0, 270-1, 270-2) in a first address space. The second portion can include a second number of memory cells (e.g., memory cells 270-3, 270-4, 270-5) in a second address space. A result of the comparison operation can be stored in a third portion of memory cells 270 (e.g., memory cells 270-8, 270-9) in a third address space.

Performing a comparison operation can include clearing the first portion of the memory cells 270 before a logical representation of the first value is stored in the first portion of the memory cells 270. Performing a comparison operation can also include clearing the second portion of the memory cells 270 before a logical representation of the second value is stored in the second portion of the memory cells 270. Performing a comparison operation can also include clearing the third portion of the memory cells 270 before the result of the comparison operation are stored in the third portion of the memory cells 270. Performing a comparison operation can further include clearing any other portions of the memory cells 270 before intermediary values (e.g., temporary values) used in performing the comparison operation are stored in the other portion of the memory cells 270. Clearing a portion of memory cells 270 comprises storing a number of pre-defined bits in the selected portions of memory cells 270. The pre-defined bits can include zero data values (e.g., 0 bits), one data values (e.g., 1 bits) and/or any combination of zero, one, and/or other data values.

A comparison operation can include determining whether the first value is greater than the second value. In a number of examples, determining whether the first value is greater than the second value only identifies whether the first value is greater, but does not identify whether the second value is greater than the first value and/or if the first value is equal to the second value. For example, if the first value is not greater than the second value, then the second value can be greater than the first value or the first value can be equal to the second value.

Accordingly, a comparison operation can also include determining whether the second value is greater than the first value. In a number of examples, however, determining whether the second value is greater than the first value only identifies whether the second value is greater, but does not identify whether the first value is greater than the second value and/or if the second value is equal to the first value.

Hence, a comparison operation can also include determining whether the first value and the second value are equal. In a number of examples, determining whether the first value is equal to the second value only identifies whether the first value and the second value are equal, but does not identify whether the first value is greater than the second value or if the second value is greater than the first value.

As such, the comparison operations, described above, can be divided into iterations of computations. As used herein, computations can describe computation operations involved in performing the comparison operation. For example, a disjunction (e.g., OR) operation can be a computation and/or an addition operation can be a computation, among other computations. An iteration of the comparison can be associated with an index. As such, each time an index is incremented or decremented a new iteration of the comparison operation can be initiated.

In a binary example, it can be determined whether the first value is equal to the second value by determining whether bits that are stored in the first portion of memory cells are equal to bits that are stored in the second portion of memory cells. The corresponding bits from the first portion of memory cells can be compared to the corresponding bits from the second portion of memory cells. If a bit from the logical representation of the first value is equal to a corresponding bit from the logical representation of the second value, and if all previous bits from the logical representation of the first value are equal to all corresponding bits from the logical representation of the second value, then a number of bits can be stored in a third portion of memory cells 270 (e.g., third address space) that indicates that the first value is equal to the second value.

The comparison operation can include determining whether more significant bits from the number of bit-pairs that are stored in the first portion of memory cells 270 and the second portion of memory cells 270 are different before determining whether less significant bits from the number of bit-pairs that are stored in the first portion of memory cells 270 and the second portion of memory cells 270 are different. For example, in a three bit value, the comparison operation can include determining whether a bit stored in memory cell 270-2 from a number of bits that are a logical representation of the first value is different than a bit stored in memory cell 270-5 from a number of bits that are a logical representation of the second value before determining whether a bit stored in memory cell 270-0 from the number of bits that are a logical representation of the first value is different than a bit stored in memory cell 270-3 from the number of bits that are a logical representation of the second value. In the above example, the bit stored in memory cell 270-2 can be more significant than a bit stored in memory cell 270-0 and a bit stored in memory 270-5 can be more significant than a bit stored in memory cell 270-3.

Determining whether bits are different can include, determining whether the bit from the logical representation of the first value is greater than the corresponding bit from the logical representation of the second value if the bit from the logical representation of the first value is not equal to the corresponding bit from the logical representation of the second value. If the bit from the logical representation of the first value is greater than the corresponding bit from the logical representation of the second value, then a number of bits can be stored in a third portion of the number of memory cells (e.g., a third address space) that indicates that the first value is greater than the second value. If the corresponding bit from the logical representation of the second value is greater than the bit from the logical representation of the first value, then a number of bits can be stored in a number of memory cells in the third address space that indicates that the second value is greater than the first value.

Embodiments of the present disclosure are not limited to the particular sensing circuitry configuration illustrated in FIG. 2A. For instance, different compute component circuitry can be used to perform logical operations in accordance with a number of embodiments described herein. Although not illustrated in FIG. 2A, in a number of embodiments, control circuitry can be coupled to array 230, sense amplifier 206, and/or compute component 231. Such control circuitry may be implemented on a same chip as the array and sensing circuitry and/or on an external processing resource such as an external processor, for instance, and can control enabling/disabling various signals corresponding to the array and sensing circuitry in order to perform logical operations as described herein. Furthermore, although a single pair of complementary sense lines (205-0/205-1) are shown in FIG. 2A, array 230 can include multiple complementary sense line pairs.

Example pseudocode providing a summary for performing comparison operations in a memory is given as follows:

```
tmp = getTemp(0);
tmpset = getTmp(1);
ClearOpenRow;
WriteRow(tmp set);
    for (i = nbits-1; i >= 0; i--){
    ReadRow(srcA + i);
    XorRow(srcB + i);
    XorRow(tmpset);
    WriteRow(tmp);
    OrRow(tmpset);
    WriteRow(tmpset);
    ReadRow(srcA+i);
    AndRow(tmp);
    OrRow(dest);
    WriteRow(dest);
    ReadRow(srcB + i);
    AndRow(tmp);
    OrRow(dest + 1);
    WriteRow(dest + 1);
    If (! Acc_contains_any_zeros( )){
       break;
    }
}
```

In a number of embodiments, a comparison operation can be performed using a clear operation, a write operation, a read operation, a wired OR operation, an addition operation, a subtraction operation, and/or an invert operation, among other operations that can be used to perform the comparison operation. The above operations can be performed using Boolean operations and non-Boolean operations. In a number of embodiments, Boolean and non-Boolean operations can be performed using logical operations (e.g., NAND, AND, NOR, XOR, OR, etc.). For example, performing a comparison operation can include performing an addition operation, a subtraction operation, an XOR operation, an OR operation, an AND operation, and/or a NOT operation, among other operations that can be used to perform the comparison operation. Performing an addition operation can include performing an OR operation, a NAND operation, and/or a AND operation, among other operations that can be used to perform an addition operation. A subtraction operation can include performing a NAND operation, an OR operation, an AND operation, and/or an XOR operation, among other operation that can be used to perform the subtraction operation. An example of performing NAND, AND, NOR, XOR and OR logical operations in conjunction with the compute component 231 is given in FIGS. 2B, 2C-1, 2C-2, 2D-1, 2D-2, and 2E.

A comparison operation can include creating a tmp value and a tmpset value (e.g., "tmp=getTemp(0)" and "tmpset=getTmp(1)"). The tmp value and the tmpset value can be values that are used as temporary storage.

The tmpset value represents whether it has been determined that the first value is not equal to the second value. That is, the tmpset value represents whether a difference between the first value and the second value has been identified.

The tmp value represents whether the next most significant bit from the first value is not equal to the corresponding next most significant bit from the second value.

A bit that is a logical representation of the tmp value can be set to one (e.g., "1") if there is a difference between any of the associated bits that represent the first value and the second value or can be set to zero (e.g., "0") if a difference between the associated bits that represent the first value and the second value has not been identified, if there is not a difference between the associated bits that represent the first value and the second value, and/or if a difference between the associated bits does not contribute to the comparison operation. The tmpset value can be set to one (e.g., "1") if there is a difference between the first value and the second value or a zero (e.g., "0") if a difference between the first value and the second value has not been identified.

In a number of examples, the tmp value and/or the tmpset value can be stored as a single bit in a single memory cell or the tmp value and/or the tmpset value can be stored using a number of bits in a number of memory cells. In a number of examples, the tmp value and the tmpset value can be represented as a single value and/or as distinct values. As used in the example shown in FIG. 3A to FIG. 3M, the tmp value is logically represented using a single bit that is stored in a memory cell while the tmpset value is logically represented using a different single bit that is stored in a different memory cell.

A comparison operation can include clearing (e.g., ClearOpenRow) a compute component 231 and/or an accumulator that is in the compute component 231 that is coupled to the memory array 230. A comparison operation can also include clearing a number of memory cells before a value is stored in the memory cells. The cleared compute component 231 can be used to clear the memory cells. As used herein, clearing a memory cell can include storing a predefined bit in a memory cell. For example, the comparison operation can include clearing the tmpset value and/or a result value, among other values that can be cleared. A value can be cleared, for example, by storing a zero (e.g., "0") bit in the memory cells that store a logical representation of the value.

As used herein, the result value is also referred to as a destination value. A first value can also be referred to as a srcA value as referred to in the above pseudocode. Moreover, a second value can be referred to as a srcB value as referred to in the above pseudocode. The first value and the second value can be represented using a number of bits (e.g., 1, 2, 4, 8, 16, 32, or 64 bits, among other number of bits). For example, each of the first value and the second value can be logically represented by three bits that can be stored in three memory cells.

A comparison operation can perform a number of calls for each bit index that is stored in a number of memory cells 270 by using a FOR loop. As used herein, the number of calls that are performed for each bit index that is stored in the number of memory cells 270 are references to each iteration of the comparison operation. For example, a number of calls can be implemented three times in three iterations where a bit-vector that is a logical representation of the first value includes three bits. A FOR loop (e.g., for (i=nbits−1; i>=0; i−−)) can comprise setting an index to a most significant index (e.g., i=nbits−1). For example, if the first value and the second value are each represented using a respective three bit-vector, then an index can be set to two (e.g., i=3-1). The index can be decremented by one (e.g., i−−) each time the number of calls are implemented. That is, the index can be decremented by one each time an iteration of the FOR loop is completed. The comparison operation can conclude when the index is less than zero (e.g., i<0). That is, the comparison operation can continue while the index is greater than or equal to zero (e.g., i>=0).

Performing a comparison operation can include comparing associated bits from the first value and the second value to determine whether the first value is greater than the second value, whether the second value is greater than the first value, and/or whether the first value is equal to the second value. For example, a first value can be equal to a second value if bit values that are stored in the first portion of the number of memory cells are equal to bit values that are stored in the second portions in the number of memory cells. That is, the corresponding bits from the first portion of the number of memory cells can be compared to corresponding bits from the second portion of the number of memory cells. For example, a "1" bit can be treated as larger than a "0" bit. A "0" bit can be treated as equal to a "0" bit.

Corresponding bits from the first value and the second value can include bits that are associated with a same index. For example, bits with a higher index can be compared before bits with a lower index are compared. That is, it can be determined whether bits with a first index from the first value and the second value are equal before determining whether bits with a second index are equal. In a number of examples the first index can be more significant index than a second index.

A number of calls that are performed for each bit index can include reading a first value from the memory array. Reading a value from memory can include latching each of the bits stored in a number of memory cells 270 that comprise a logical representation of the value into the sense amplifier 206. The bits that are stored in a number of memory cells 270 can be latched in order from most significant to least significant. In a number of examples, a next most significant bit can be a bit that has not been compared and/or latched for a next iteration from a number of iterations that are associated with the comparison operation. For example, during a first iteration of the comparison operation a read operation (e.g., ReadRow(srcA+i)) can latch a bit with a third index from a bit-vector that is stored in a number of memory cells that store a logical representation of the first value. During a second iteration of the comparison operation a read operation (e.g., "ReadRow (scrA+i)") call can latch a bit with a second index. During a third iteration of the compare operation a read operation (e.g., ReadRow(scrA+i)) can latch a bit with a first index.

A number of calls that are performed for each bit index associated with the first value and the second value can include performing an XOR operation (e.g., XorRow(srcB+i)) using, as input, a next most significant bit from the first value and a next most significant bit from the second value. The above XOR operation (e.g., XorRow(srcB+i)) can be used to compare the first value against the second value to determine if the first value is equal to the second value. For example, during a first iteration of a comparison operation, a next most significant bit with a third index from the number of memory cells that store the first value can be compared against a next most significant bit with a third index from the number of memory cells that store the second value to determine wither the third indexed bits are equal to each other.

The number of calls that are performed for each bit index can include performing an XOR operation (e.g., XorRow (tmpset)) using the results of the previous XOR operation (e.g., XorRow(srcB+i)) and the corresponding tmpset value as input to determine whether a solution to the comparison operation has already been identified. A solution to the comparison operation can be identified when the comparison operation identifies the first value as being greater than the second value, the second value as being greater than the first value, or the first value being equal to the second value.

A number of calls that are performed for each bit index can include performing a write operation (e.g., WriteRow (tmp)) to store the results of the previous XOR operation (e.g., XorRow(tmpset)) in a memory cell 270 that stores a logical representation of a tmp value. The write operation (e.g., WriteRow(tmp)) can store a one (e.g., "1") in an associated memory cell if the next most significant bit from the first value is not equal to the next most significant bit from the second value.

A number of calls that are performed for each bit index can include performing an OR operation (e.g., OrRow (tmpset)) using the tmp value and the tmpset value as input. The number of calls can also include a write operation (e.g., WriteRow(tmpset)) to store the results of the OR operation (e.g., OrRow(tmpset)) to the memory cell 270 that stores a logical representation of the tmpset value. The previous OR operation (e.g., OrRow(tmpset)) and the write operation (e.g., WriteRow(tmpset)) can update the tmpset value to identify whether a solution to the comparison operation will be identified in a current iteration of the comparison operation.

A number of calls that are performed for each bit index can include a read operation (e.g., ReadRow(srcA+i)) to latch a value stored in the memory cell that is associated with the next most significant bit of the first value. The number of calls can also include an AND operation (e.g., AndRow(tmp)) using the next most significant bit from the first value and the tmp value as input to determine whether the first value is greater than the second value. The number of calls that are performed for each bit index can also include an OR operation (e.g., OrRow(dest)) using, as input, the results of the previous AND operation (e.g., AndRow(tmp)) and a bit stored in a memory cell that is associated with the first value and stores a result value. The result of the previous OR operation (e.g., OrRow(dest)) can be stored (e.g., WriteRow (dest)) in the memory cell that stores a result value and that is associated with the first value.

A number of calls that are performed for each bit index can also include a read operation (e.g., ReadRow(srcB+i)) to latch a value stored in the memory cell that is associated with the next most significant bit of the second value. The number of calls that are performed for each bit index can also include an AND operation (e.g., AndRow(tmp)) using, as input, the next most significant bit from the second value and the tmp value to determine whether the second value is greater than the first value. The number of calls that are performed for each bit index can also include an OR operation (e.g., OrRow(dest+1)) using, as input, the result of the previous AND operation (e.g., AndRow(tmp)) and a bit stored in a memory cell that is associated with the second value and that stores a result value. The result of the previous OR operation (e.g., OrRow(dest+1)) can be stored (e.g., WriteRow(dest+1)) in the memory cell that is associated with the second value and that stores a result value.

A number of calls that are performed for each bit index can include a break operation (e.g., break) to exit the FOR loop. The break operation can exit the FOR loop based on the result of a WIRED OR operation (e.g., !ACC_contains_any_zeroes( )) to conclude the compare operation. As used herein, a NOT operation is represented by the "!" symbol in the pseudocode above. As used herein a WIRED OR operation can include determining whether a number of compare operations for a number of first values and a number of second values has concluded. A WIRED OR operation is further described in FIG. 2E. Determining whether the compare operations for the number of first values and the second values has concluded can be based on the tmpset value associated with each of the compare operations. For example, if all of the tmpset values are equal to one (e.g., "1"), then all of the comparison operations have concluded. A tmpset value that is associated with the comparison operation can be equal to one (e.g., "1") when it has been determined that a first value is greater than a second value or a second value is greater than a first value.

Figure 2B:
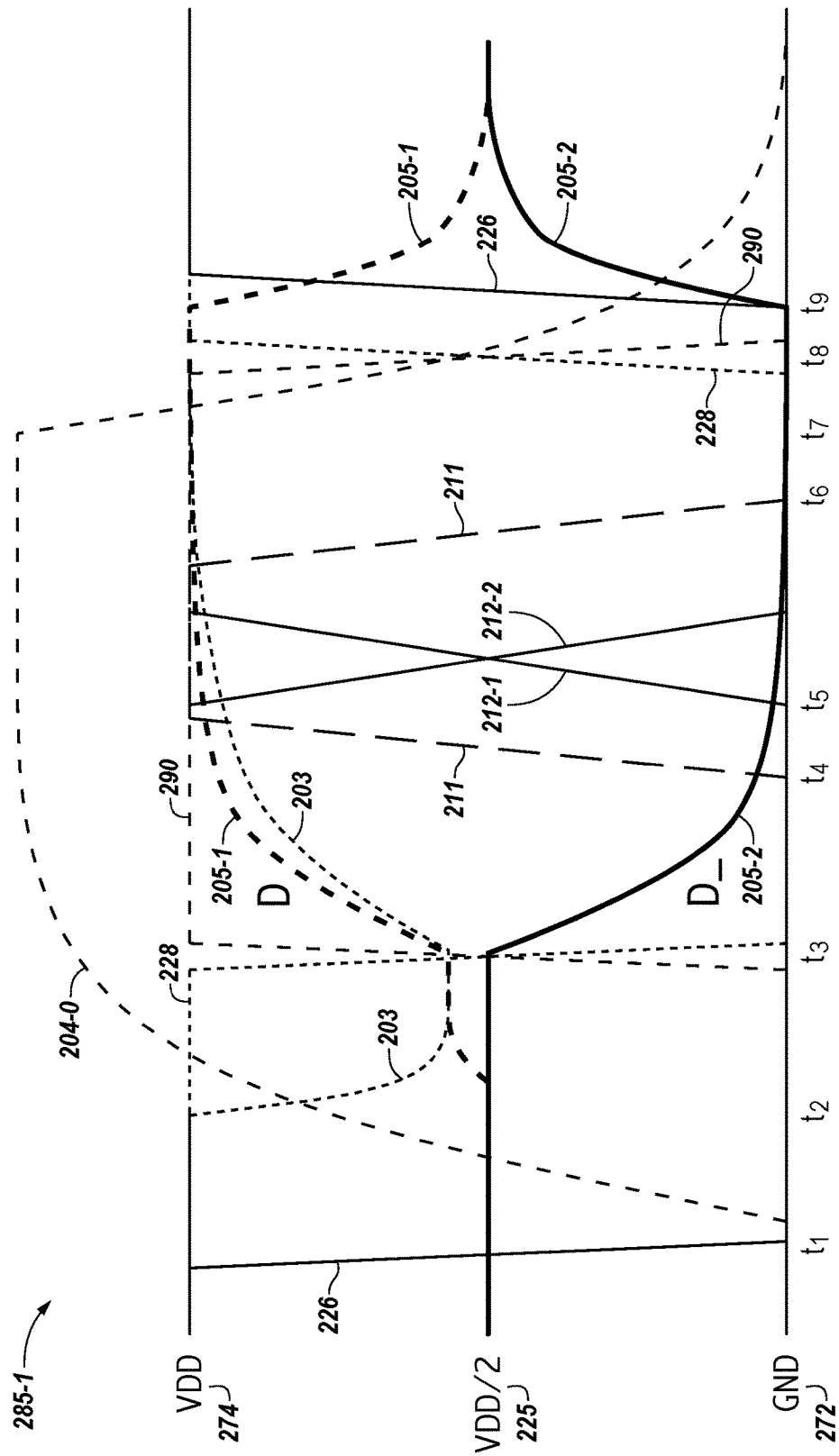
FIG. 2B illustrates a timing diagram associated with performing a number of logical operations using sensing circuitry in accordance with a number of embodiments of the present disclosure.

FIG. 2B illustrates a timing diagram 285-1 associated with performing a number of logical operations using sensing circuitry in accordance with a number of embodiments of the present disclosure. Timing diagram 285-1 illustrates signals (e.g., voltage signals) associated with performing a first operation phase of a logical operation (e.g., an R-input logical operation). The first operation phase described in FIG. 2B can be a first operation phase of an AND, NAND, OR, or NOR operation, for instance. As described further below, performing the operation phase illustrated in FIG. 2B can involve consuming significantly less energy (e.g., about half) than previous processing approaches, which may involve providing a full swing between voltage rails (e.g., between a supply and ground) to perform a compute function.

In the example illustrated in FIG. 2B, the voltage rails corresponding to complementary logic values (e.g., "1" and "0") are a supply voltage 274 (VDD) and a ground voltage 272 (Gnd). Prior to performing a logical operation, equilibration can occur such that the complementary sense lines D and D are shorted together at an equilibration voltage 225 (VDD/2). Equilibration is described further below in association with FIG. 3.

At time $t_1$, the equilibration signal 226 is deactivated, and then a selected row is activated (e.g., the row corresponding to a memory cell whose data value is to be sensed and used as a first input). Signal 204-0 represents the voltage signal applied to the selected row (e.g., row 204-0). When row signal 204-0 reaches the threshold voltage (Vt) of the access transistor (e.g., 202) corresponding to the selected cell, the access transistor turns on and couples the sense line D to the selected memory cell (e.g., to the capacitor 203 if the cell is a 1T1C DRAM cell), which creates a differential voltage signal between the sense lines D and D_ (e.g., as indicated by signals 205-0 and 205-1, respectively) between times $t_2$ and $t_3$. The voltage of the selected cell is represented by signal 203. Due to conservation of energy, creating the differential signal between D and D_ (e.g., by coupling the cell to sense line D) may not significantly consume energy, since the energy associated with activating/deactivating the row signal 204 can be amortized over the plurality of memory cells coupled to the row.

At time $t_3$, the sense amplifier (e.g., 206) activates (e.g., a positive control signal 290 (e.g., corresponding to ACT 590 shown in FIG. 5) goes high, and the negative control signal 228 (e.g., corresponding to RnIF 528 shown in FIG. 5) goes low), which amplifies the differential signal between D and D_, resulting in a voltage (e.g., VDD) corresponding to a logic 1 or a voltage (e.g., ground) corresponding to a logic 0 being on sense line D (and the other voltage being on complementary sense line D_), such that the sensed data value is stored in the primary latch of sense amplifier 206. The primary energy consumption in this operation occurs in charging the sense line D (205-0) from the equilibration voltage VDD/2 to the rail voltage VDD.

Figures 1, 2C:
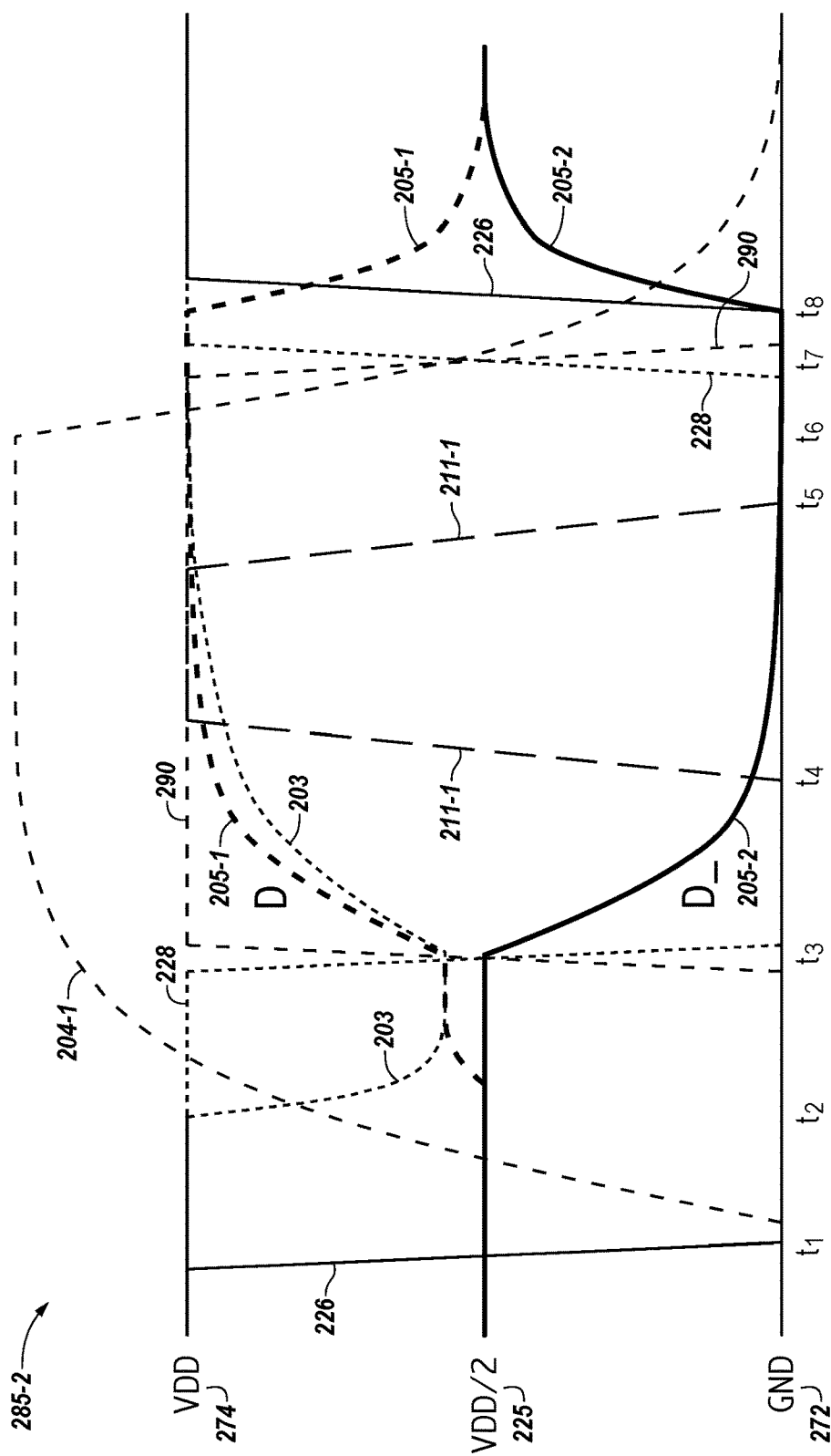
Figures 2, 2C:
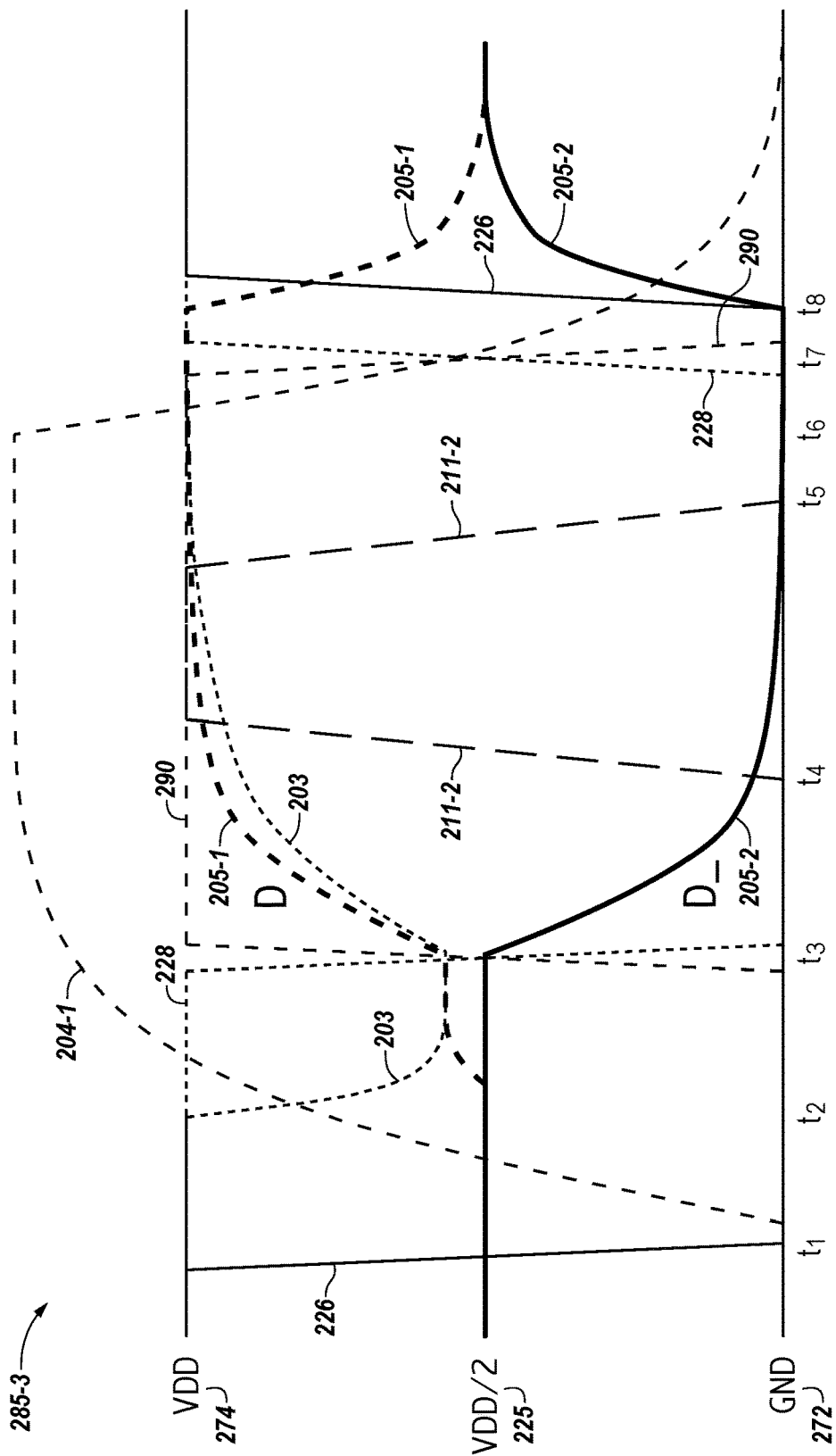

At time $t_4$, the pass transistors 207-1 and 207-2 are enabled (e.g., via respective Passd and Passdb control signals applied to control lines 211-1 and 211-2, respectively) as shown in FIGS. 2C-1 and 2C-2. The control signals 211-1 and 211-2 are referred to collectively as control signals 211 as shown in FIG. 2B. As used herein, various control signals, such as Passd and Passdb, may be referenced by referring to the control lines to which the signals are applied. For instance, a Passd signal can be referred to as control signal 211-1 in FIG. 2C-1. At time $t_5$, the accumulator control signals Accumb and Accum are activated via respective control lines 212-1 and 212-2. As described below, the accumulator control signals 212-1 and 212-2 may remain activated for subsequent operation phases. As such, in this example, activating the control signals 212-1 and 212-2 activates the secondary latch (e.g., accumulator) of compute component 231. The sensed data value stored in sense amplifier 206 is transferred (e.g., copied) to the secondary latch.

At time $t_6$, the pass transistors 207-1 and 207-2 are disabled (e.g., turned off); however, since the accumulator control signals 212-1 and 212-2 remain activated, an accumulated result is stored (e.g., latched) in the secondary latch (e.g., accumulator). At time $t_7$, the row signal 204-0 is deactivated, and the array sense amps are disabled at time $t_8$ (e.g., sense amplifier control signals 228 and 290 are deactivated).

At time $t_9$, the sense lines D and D_ are equilibrated (e.g., equilibration signal 226 is activated), as illustrated by sense line voltage signals 205-0 and 205-1 moving from their respective rail values to the equilibration voltage 225 (VDD/2). The equilibration consumes little energy due to the law of conservation of energy. Equilibration can involve shorting the complementary sense lines D and D_ together at an equilibration voltage, which is VDD/2, in this example. Equilibration can occur, for instance, prior to a memory cell sensing operation.

FIGS. 2C-1 and 2C-2 illustrate timing diagrams 285-2 and 285-3, respectively, associated with performing a number of logical operations using sensing circuitry in accordance with a number of embodiments of the present disclosure. Timing diagrams 285-2 and 285-3 illustrate signals (e.g., voltage signals) associated with performing a number of intermediate operation phases of a logical operation (e.g., an R-input logical operation wherein R is a variable number of inputs). For instance, timing diagram 285-2 corresponds to a number of intermediate operation phases of an R-input NAND operation or an R-input AND operation, and timing diagram 285-3 corresponds to a number of intermediate operation phases of an R-input NOR operation or an R-input OR operation. For example, performing an AND or NAND operation can include performing the operation phase shown in FIG. 2C-1 one or more times subsequent to an initial operation phase such as that described in FIG. 2B. Similarly, performing an OR or NOR operation can include performing the operation phase shown in FIG. 2C-2 one or more times subsequent to an initial operation phase such as that described in FIG. 2B.

As shown in timing diagrams 285-2 and 285-3, at time $t_1$, equilibration is disabled (e.g., the equilibration signal 226 is deactivated), and then a selected row is activated (e.g., the row corresponding to a memory cell whose data value is to be sensed and used as an input such as a second input, third input, etc.). Signal 204-1 represents the voltage signal applied to the selected row (e.g., row 204-1). When row signal 204-1 reaches the threshold voltage (Vt) of the access transistor (e.g., 202) corresponding to the selected cell, the access transistor turns on and couples the sense line D to the selected memory cell (e.g., to the capacitor 203 if the cell is a 1T1C DRAM cell), which creates a differential voltage signal between the sense lines D and D_ (e.g., as indicated by signals 205-0 and 205-1, respectively) between times $t_2$ and $t_3$. The voltage of the selected cell is represented by signal 203. Due to conservation of energy, creating the differential signal between D and D_ (e.g., by coupling the cell to sense line D) may not consume energy, since the energy associated with activating/deactivating the row signal 204 can be amortized over the plurality of memory cells coupled to the row.

At time $t_3$, the sense amplifier (e.g., 206) activates (e.g., the positive control signal 290 goes high, and the negative control signal 228 goes low), which amplifies the differential signal between D and D_, resulting in a voltage (e.g., VDD) corresponding to a logic 1 or a voltage (e.g., ground) corresponding to a logic 0 being on sense line D (and the other voltage being on complementary sense line D_), such that the sensed data value is stored in the primary latch of sense amplifier 206. The primary energy consumption in this operation occurs in charging the sense line D (205-0) from the equilibration voltage VDD/2 to the rail voltage VDD.

As shown in timing diagrams 285-2 and 285-3, at time $t_4$ (e.g., after the selected cell is sensed), only one of control signals 211-1 (Passd) and 211-2 (Passdb) is activated (e.g., only one of pass transistors 207-1 and 207-2 in FIG. 2A is enabled), depending on the particular logic operation. For example, since timing diagram 285-2 in FIG. 2C-1 corresponds to an intermediate phase of a NAND or AND operation, control signal 211-1 is activated at time t4 and control signal 211-2 remains deactivated. Conversely, since timing diagram 285-3 in FIG. 2C-2 corresponds to an intermediate phase of a NOR or OR operation, control signal 211-2 is activated at time t4 and control signal 211-1 remains deactivated. Recall from above in FIG. 2A that the accumulator control signals 212-1 (Accumb) and 212-2 (Accum) were activated during the initial operation phase described in FIG. 2B, and they remain activated during the intermediate operation phase(s).

Since the accumulator was previously enabled, activating only Passd (e.g., 211-1 in FIG. 2C-1) results in accumulating the data value corresponding to the voltage signal 205-1. Similarly, activating only Passdb (e.g., 211-2 in FIG. 2C-2) results in accumulating the data value corresponding to the voltage signal 205-2. For instance, in an example AND/NAND operation (e.g., timing diagram 285-2 in FIG. 2C-1) in which only Passd (211-1) is activated, if the data value stored in the selected memory cell (e.g., a Row1 memory cell in this example) is a logic 0, then the accumulated value associated with the secondary latch (e.g., 290 in FIG. 2A), is asserted low such that the secondary latch stores logic 0. If the data value stored in the Row1 memory cell is not a logic 0, then the secondary latch retains its stored Row0 data value (e.g., a logic 1 or a logic 0). As such, in this AND/NAND operation example, the secondary latch is serving as a zeroes (0s) accumulator.

Similarly, in an example OR/NOR operation (e.g., timing diagram 285-3 in FIG. 2C-2) in which only Passdb is activated, if the data value stored in the selected memory cell (e.g., a Row1 memory cell in this example) is a logic 1, then the accumulated value associated with the secondary latch is asserted high such that the secondary latch stores logic 1. If the data value stored in the Row1 memory cell is not a logic 1, then the secondary latch retains its stored Row0 data value (e.g., a logic 1 or a logic 0). As such, in this OR/NOR operation example, the secondary latch is effectively serving as a ones (1s) accumulator since voltage signal 205-1 on D_ is setting the true data value of the accumulator.

At the conclusion of an intermediate operation phase such as that shown in FIGS. 2C-1 and 2C-2, the Passd signal (e.g., for AND/NAND) or the Passdb signal (e.g., for OR/NOR) is deactivated (e.g., at time t5), the selected row is deactivated (e.g., at time t6), the sense amplifier (e.g., 206 in FIG. 2A) is deactivated (e.g., at time t7), and equilibration occurs (e.g., at time t8). An intermediate operation phase such as that illustrated in FIG. 2C-1 or 2C-2 can be repeated in order to accumulate results from a number of additional rows. As an example, the sequence of timing diagram 285-2 or 285-3 can be performed a subsequent (e.g., second) time for a Row2 memory cell, a subsequent (e.g., third) time for a Row3 memory cell, etc. For instance, for a 10-input NOR operation, the intermediate phase shown in FIG. 2C-2 can occur 9 times to provide 9 inputs of the 10-input logical operation, with the tenth input being determined during the initial operation phase (e.g., as described in FIG. 2B).

Figures 1, 2D:
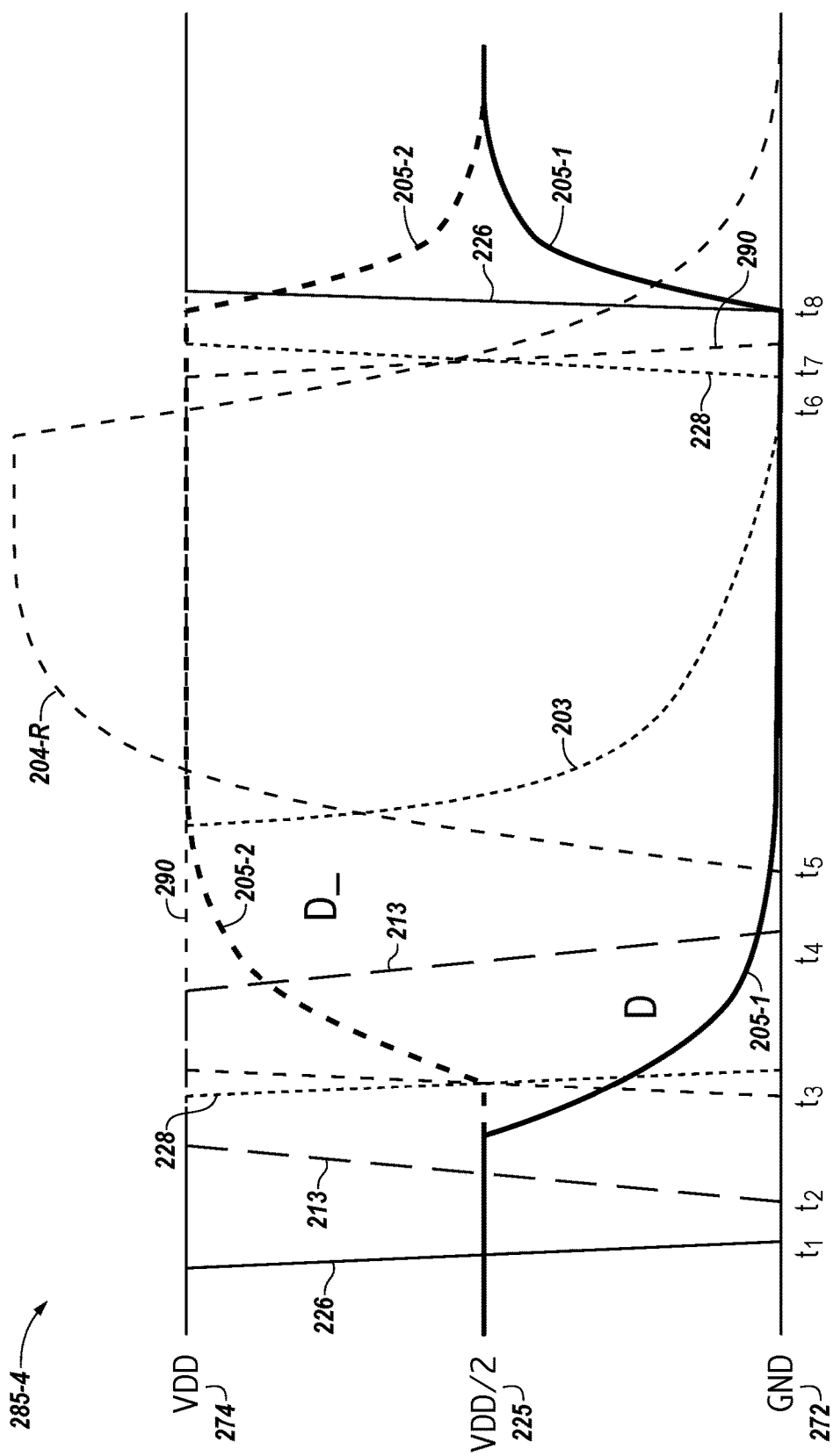
Figures 2, 2D:
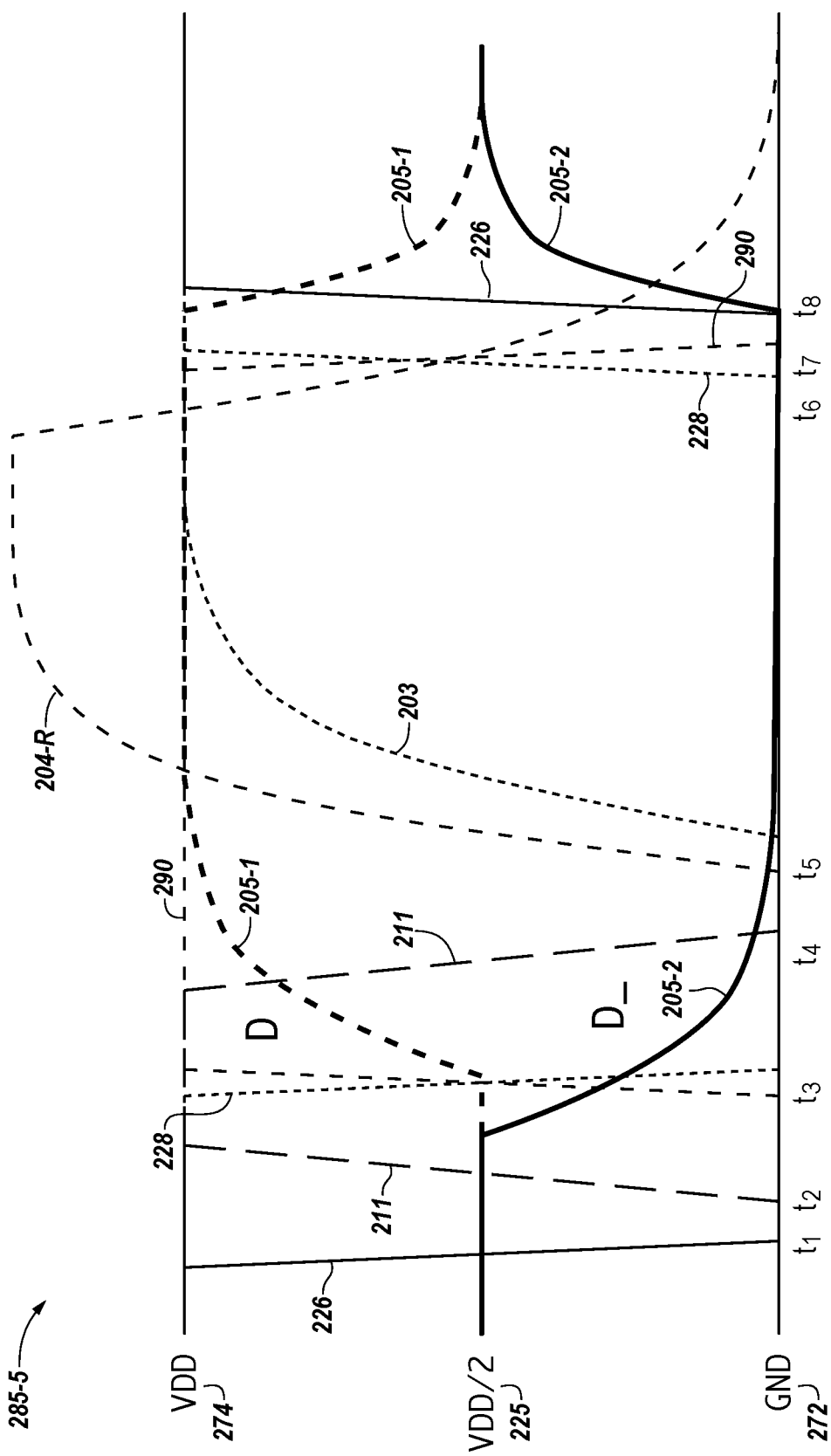

FIGS. 2D-1 and 2D-2 illustrate timing diagrams 285-4 and 285-5, respectively, associated with performing a number of logical operations using sensing circuitry in accordance with a number of embodiments of the present disclosure. Timing diagrams 285-4 and 285-5 illustrate signals (e.g., voltage signals) associated with performing a last operation phase of a logical operation (e.g., an R-input logical operation). For instance, timing diagram 285-4 in FIG. 2D-2 corresponds to a last operation phase of an R-input NAND operation or an R-input NOR operation, and timing diagram 285-5 in FIG. 2D-2 corresponds to a last operation phase of an R-input AND operation or an R-input OR operation. For example, performing a NAND operation can include performing the operation phase shown in FIG. 2D-1 subsequent to a number of iterations of the intermediate operation phase described in association with FIG. 2C-1, performing a NOR operation can include performing the operation phase shown in FIG. 2D-1 subsequent to a number of iterations of the intermediate operation phase described in association with FIG. 2C-2, performing an AND operation can include performing the operation phase shown in FIG. 2D-2 subsequent to a number of iterations of the intermediate operation phase described in association with FIG. 2C-1, and performing an OR operation can include performing the operation phase shown in FIG. 2D-2 subsequent to a number of iterations of the intermediate operation phase described in association with FIG. 2C-2. Table 1 shown below indicates the Figures corresponding to the sequence of operation phases associated with performing a number of R-input logical operations in accordance with a number of embodiments described herein.

TABLE 1

| Operation | FIG. 2B | FIG. 2C-1 | FIG. 2C-2 | FIG. 2D-1 | FIG. 2D-2 |
|---|---|---|---|---|---|
| AND | First phase | R-1 iterations | | | Last phase |
| NAND | First phase | R-1 iterations | | Last phase | |
| OR | First phase | | R-1 iterations | | Last phase |
| NOR | First phase | | R-1 iterations | Last phase | |

A NAND operation can be implemented, for example, by storing the result of the R-1 iterations for an AND operation in the sense amplifier, then inverting the sense amplifier before conducting the last operation phase to store the result (described below). A NOR operation can be implemented, for example, by storing the result of the R-1 iterations for an OR operation in the sense amplifier, then inverting the sense amplifier before conducting the last operation phase to store the result (described below).

The last operation phases of FIGS. 2D-1 and 2D-2 are described in association with storing a result of an R-input logical operation to a row of the array (e.g., array 230 in FIG. 2A). However, as described above, in a number of embodiments, the result can be stored to a suitable location other than back to the array (e.g., to an external register associated with a controller and/or host processor, to a memory array of a different memory device, etc., via I/O lines).

As shown in timing diagrams 285-4 and 285-5, at time equilibration is disabled (e.g., the equilibration signal 226 is deactivated) such that sense lines D and D_ are floating. At time t2, either the InvD signal 213 or the Passd and Passdb signals 211 are activated, depending on which logical operation is being performed. In this example, the InvD signal 213 is activated for a NAND or NOR operation (see FIG. 2D-1), and the Passd and Passdb signals 211 are activated for an AND or OR operation (see FIG. 2D-2).

Activating the InvD signal 213 at time t2 (e.g., in association with a NAND or NOR operation) enables transistors 214-1/214-2 in FIG. 2A and results in an inverting of the data value stored in the secondary latch 290 in FIG. 2A as either sense line D or sense line D_ is pulled low. As such, activating signal 213 inverts the accumulated output. Therefore, for a NAND operation, if any of the memory cells sensed in the prior operation phases (e.g., the initial operation phase and one or more intermediate operation phases) stored a logic 0 (e.g., if any of the R-inputs of the NAND operation were a logic 0), then the sense line D_ will carry a voltage corresponding to logic 0 (e.g., a ground voltage) and sense line D will carry a voltage corresponding to logic 1 (e.g., a supply voltage such as VDD). For this NAND example, if all of the memory cells sensed in the prior operation phases stored a logic 1 (e.g., all of the R-inputs of the NAND operation were logic 1), then the sense line D_ will carry a voltage corresponding to logic 1 and sense line D will carry a voltage corresponding to logic 0. At time t3, the primary latch of sense amplifier 206 is then activated (e.g., the sense amplifier is fired), driving D and D_ to the appropriate rails, and the sense line D now carries the NANDed result of the respective input data values as determined from the memory cells sensed during the prior operation phases. As such, sense line D will be at VDD if any of the input data values are a logic 0 and sense line D will be at ground if all of the input data values are a logic 1.

For a NOR operation, if any of the memory cells sensed in the prior operation phases (e.g., the initial operation phase and one or more intermediate operation phases) stored a logic 1 (e.g., if any of the R-inputs of the NOR operation were a logic 1), then the sense line D_ will carry a voltage corresponding to logic 1 (e.g., VDD) and sense line D will carry a voltage corresponding to logic 0 (e.g., ground). For this NOR example, if all of the memory cells sensed in the prior operation phases stored a logic 0 (e.g., all of the R-inputs of the NOR operation were logic 0), then the sense line D_ will carry a voltage corresponding to logic 0 and sense line D will carry a voltage corresponding to logic 1. At time t3, the primary latch of sense amplifier 206 is then activated and the sense line D now contains the NORed result of the respective input data values as determined from the memory cells sensed during the prior operation phases. As such, sense line D will be at ground if any of the input data values are a logic 1 and sense line D will be at VDD if all of the input data values are a logic 0.

Referring to FIG. 2D-2, activating the Passd and Passdb signals 211 (e.g., in association with an AND or OR operation) transfers the accumulated output stored in the secondary latch of compute component 231 to the primary latch of sense amplifier 206. For instance, for an AND operation, if any of the memory cells sensed in the prior operation phases (e.g., the first operation phase of FIG. 2B and one or more iterations of the intermediate operation phase of FIG. 2C-1) stored a logic 0 (e.g., if any of the R-inputs of the AND operation were a logic 0), then the sense line D_ will carry a voltage corresponding to logic 1 (e.g., VDD) and sense line D will carry a voltage corresponding to logic 0 (e.g., ground). For this AND example, if all of the memory cells sensed in the prior operation phases stored a logic 1 (e.g., all of the R-inputs of the AND operation were logic 1), then the sense line D_ will carry a voltage corresponding to logic 0 and sense line D will carry a voltage corresponding to logic 1. At time t3, the primary latch of sense amplifier 206 is then activated and the sense line D now carries the ANDed result of the respective input data values as determined from the memory cells sensed during the prior operation phases. As such, sense line D will be at ground if any of the input data values are a logic 0 and sense line D will be at VDD if all of the input data values are a logic 1.

For an OR operation, if any of the memory cells sensed in the prior operation phases (e.g., the first operation phase of FIG. 2B and one or more iterations of the intermediate operation phase shown in FIG. 2C-2) stored a logic 1 (e.g., if any of the R-inputs of the OR operation were a logic 1), then the sense line D_ will carry a voltage corresponding to logic 0 (e.g., ground) and sense line D will carry a voltage corresponding to logic 1 (e.g., VDD). For this OR example, if all of the memory cells sensed in the prior operation phases stored a logic 0 (e.g., all of the R-inputs of the OR operation were logic 0), then the sense line D will carry a voltage corresponding to logic 0 and sense line D_ will carry a voltage corresponding to logic 1. At time t3, the primary latch of sense amplifier 206 is then activated and the sense line D now carries the ORed result of the respective input data values as determined from the memory cells sensed during the prior operation phases. As such, sense line D will be at VDD if any of the input data values are a logic 1 and sense line D will be at ground if all of the input data values are a logic 0.

The result of the R-input AND, OR, NAND, and NOR operations can then be stored back to a memory cell of array 230. In the examples shown in FIGS. 2D-1 and 2D-2, the result of the R-input logical operation is stored to a memory cell coupled to RowR (e.g., 204-R). Storing the result of the logical operation to the RowR memory cell simply involves enabling the RowR access transistor 202 by activating RowR. The capacitor 203 of the RowR memory cell will be driven to a voltage corresponding to the data value on the sense line D (e.g., logic 1 or logic 0), which essentially overwrites whatever data value was previously stored in the RowR memory cell. It is noted that the RowR memory cell can be a same memory cell that stored a data value used as an input for the logical operation. For instance, the result of the logical operation can be stored back to the Row0 memory cell or Row1 memory cell.

Timing diagrams 285-4 and 285-5 illustrate, at time t3, the positive control signal 290 and the negative control signal 228 being deactivated (e.g., signal 231 goes high and signal 228 goes low) to activate the sense amplifier 206. At time t4 the respective signal (e.g., 213 or 211) that was activated at time t2 is deactivated. Embodiments are not limited to this example. For instance, in a number of embodiments, the sense amplifier 206 may be activated subsequent to time t4 (e.g., after signal 213 or signals 211 are deactivated).

As shown in FIGS. 2D-1 and 2D-2, at time t5, RowR (204-R) is activated, which drives the stored element (e.g., capacitor 203 in FIG. 2A) of a selected cell to the voltage corresponding to the logic value stored in the accumulator. At time t6, Row R is deactivated, at time t7, the sense amplifier 206 is deactivated (e.g., signals 228 and 290 are deactivated) and at time t8 equilibration occurs (e.g., signal 226 is activated and the voltages on the complementary sense lines 205-0 and 205-1 are brought to the equilibration voltage).

In a number of embodiments, sensing circuitry such as that described in FIG. 2A (e.g., circuitry formed on pitch with the memory cells) can enable performance of numerous logical operations in parallel. For instance, in an array having 16K columns, 16K logical operations can be performed in parallel, without transferring data from the array and sensing circuitry via a bus and/or without transferring data from the array and sensing circuitry via I/O lines.

Also, one of ordinary skill in the art will appreciate that the ability to perform R-input logical operations (e.g., NAND, AND, NOR, OR, etc.) can enable performance of more complex computing functions such as addition, subtraction, multiplication, and division among other primary math functions and/or pattern compare functions. For example, a series of NAND operations can be combined to perform a full adder function. As an example, if a full adder requires 12 NAND gates to add two data values along with a carry in and carry out, a total of 384 NAND operations (12×32) could be performed to add two 32 bit numbers. Embodiments of the present disclosure can also be used to perform logical operations that may be non-Boolean (e.g., copy, compare, etc.).

Additionally, in a number of embodiments, the inputs to a logical operation performed may not be data values stored in the memory array 130 to which the sensing circuitry (e.g., 150 in FIG. 1) is coupled. For instance, a number of inputs to a logical operation can be sensed by a sense amplifier (e.g., 206 in FIG. 2A) without activating a row of the array (e.g., 230 in FIG. 2A). As an example, the number of inputs can be received by the sense amplifier 206 via I/O lines coupled thereto. Such inputs may be provided to the sense amplifier 206 (e.g., via the appropriate I/O lines) from a source external to the array 230 such as from a host processor (e.g., host 110) and/or external controller, for instance. As another example, in association with performing a logical operation, the inputs to a particular sense amplifier (e.g., 206) and its corresponding compute component (e.g., 231) may be received from a different sense amplifier/compute component pair. For instance, a data value (e.g., logical result) stored in a first accumulator coupled to a first column of cells may be transferred to a different (e.g., neighboring) sense amplifier/compute component pair associated with a different column of cells, which may or may not be located in the same array as the first column.

Embodiments of the present disclosure are not limited to the particular sensing circuitry configuration illustrated in FIG. 2A. For instance, different compute component circuitry can be used to perform logical operations in accordance with a number of embodiments described herein. Although not illustrated in FIG. 2A, in a number of embodiments, control circuitry can be coupled to array 230, sense amplifier 206, and/or compute component 231. Such control circuitry may be implemented on a same chip as the array and sensing circuitry 250 and/or on an external processing resource such as an external processor, for instance, and can control enabling/disabling various signals corresponding to the array and sensing circuitry in order to perform logical operations as described herein.

The example logic operation phases described in association with FIGS. 2A, 2B, 2C-1, 2C-2, 2D-1, and 2D-2 involve accumulating a data value (e.g., a data value sensed from a memory cell and/or a data value corresponding to a voltage or current of a sense line). Due to conservation of energy, the energy consumed in performing the logic operation phase is approximately equal to the energy consumed during charging of the capacitance of the sense line D or D from VDD/2 to VDD, which begins when the sense amplifier is activated (e.g., at time t3 as shown in FIGS. 2B, 2C-1, 2C-2, 2D-1, and 2D-2). As such, performing a logical operation consumes approximately the energy used to charge a sense line (e.g., digit line) from VDD/2 to VDD. In contrast, various previous processing approaches often consume at least an amount of energy used to charge a sense line from rail to rail (e.g., from ground to VDD), which may be twice as much energy or more as compared to embodiments described herein.

Figure 2E:
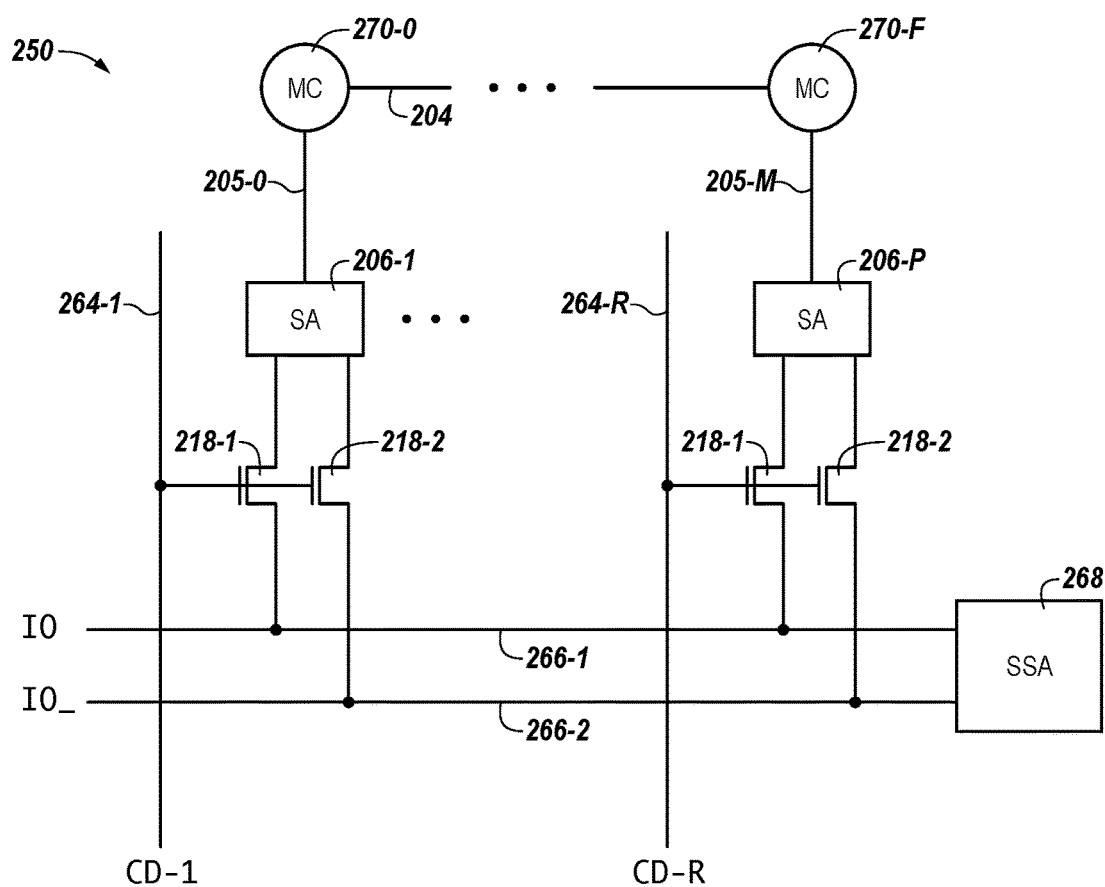
FIG. 2E illustrates a schematic diagram of a portion of a memory array coupled to sensing circuitry in accordance with a number of embodiments of the present disclosure.

FIG. 2E illustrates a schematic diagram of a portion of a memory array coupled to sensing circuitry in accordance with a number of embodiments of the present disclosure. In this example, a memory array includes memory cells (MCs) 270-0, . . . , 270-F. In a number of embodiments, the memory cells are destructive read memory cells (e.g., reading the data stored in the cell destroys the data such that the data originally stored in the cell is refreshed after being read). The memory cells 270-0, . . . , 270-F can be arranged in a number of rows coupled by select lines 204 (e.g., word lines) and columns coupled by sense lines (e.g., digit lines) 205-0, . . . , 205-M. For ease of reference, the sense lines 205-0, . . . , 205-M represent respective pairs of complementary sense lines (e.g., 205-1 and 205-2 in FIG. 2A). Although only one row and two columns of memory cells are illustrated in FIG. 2E, embodiments are not so limited. For instance, a particular array may have a number of columns of memory cells and/or sense lines (e.g., 4,096, 8,192, 16,384, etc.). As an example, a gate of a particular memory cell transistor (e.g., 202 in FIG. 2A) can be coupled to its corresponding word line (204), a source/drain region can be coupled to its corresponding sense line (e.g., 205-0), and a second source/drain region of a particular memory cell transistor can be coupled to its corresponding capacitor (e.g., 203 in FIG. 2A).

The array in FIG. 2E can be coupled to sensing circuitry in accordance with a number of embodiments of the present disclosure. In this example, the sensing circuitry 250 comprises sense amplifiers 206-1, . . . , 206-P and secondary sense amplifier (SSA) 268. The sensing circuitry 250 can be sensing circuitry 150 shown in FIG. 1. The sense amplifiers 206-1 to 206-P are coupled to the respective sense lines 205-0 to 205-M. The sense amplifiers 206-1 to 206-P can be sense amplifiers such as sense amplifier 206 in FIG. 2A. The sense amplifiers 206-1 to 206-P are coupled to input/output lines 266-1 (IO) and 266-2 (IO_) via transistors 218-1 and 218-2, respectively. Column decode lines 264-1 (CD-1) to 264-R (CD-R) are coupled to the gates of transistors 218-1 and 218-2 and can be selectively activated to transfer data sensed by respective sense amps 206-1 to 206-P to the SSA 268 via IO lines 266-1 and 266-2

In operation, sense amps (e.g., 206-1 to 206-P) can sense a data value (e.g., a logic "1" or "0") stored in a memory cell (e.g., 270-0 to 270-F) by amplifying a differential signal (e.g., voltage or current) on the complementary sense lines (e.g., 205-0 to 205-M) responsive to activation of a select line (e.g., word line 204). As an example, the sense amps 206-1 to 206-P can drive one of the sense lines (e.g., D from FIG. 2A) of the pair of complementary sense lines 205-0 to a first value (e.g., to a supply voltage such as Vcc), and the other sense line (D from FIG. 2A) of the pair of complementary sense lines 205-0 to a second value (e.g., to a reference voltage such as a ground voltage). In this manner, the data value stored by the memory cell (e.g., 270-0) can be determined based on which of the sense lines of the complementary sense line pair is driven to Vcc, for instance. The voltages of the complementary sense line pairs 205-0 to 205-M can then be selectively transferred to the I/O lines 266-1 and 266-2 via activation of selected column decode lines 264-1 to 264-R. In this manner, the data sensed by the sense amps 206-1 to 206-P can be transferred to the SSA 268 via I/O lines 266-1 and 266-2. The SSA 268 may only be capable of storing a data value from a single cell (e.g., one of cells 270-0 to 270-F) at a particular time. As such, if it is desired to transfer the data stored in cell 270-0 to the SSA 268, then column decode line 264-1 would be activated, and if it is desired to transfer the data stored in cell 270-F to the SSA 268, then column decode 264-R would be activated. If both lines 264-1 and 264-R were activated, the SSA 268 may not be able to determine the actual stored data values stored in either of the cells.

However, in various instances, it can be useful to selectively activate more than one of the column decode lines (e.g., 264-1 to 264-R). For example, selectively activating a number of column decode lines can be done in association with performing a WIRED OR operation in accordance with a number of embodiments described herein. For instance, in a number of embodiments of the present disclosure, the data path portion shown in FIG. 2E can be operated to determine whether data stored in a memory array (e.g., array 130 in FIG. 1) matches a compare value, which may be provided by an on-die control circuit (e.g., control circuitry 140 in FIG. 1) and/or by external control circuitry (e.g., host 110 in FIG. 1) as part of an "if-then-else" programmatic flow.

In an example operation, control circuitry (e.g., 140 in FIG. 1) can be configured to charge (.e.g., precharge) an I/O line (e.g., 266-1) to a voltage (e.g., a precharge voltage). For example, the I/O line 266-1 can be precharged to a voltage (e.g., a supply voltage such as Vcc) corresponding to a logic "1." The control circuitry can be configured to selectively activate row lines (e.g., a row line including memory cells 270-0, . . . , 270-F) and column decode lines 264-1 to 264-R (e.g., CD-1, . . . CD-R). Sensing circuitry (e.g., 150 in FIG. 1) can be configured to sense a number of selected memory cells (e.g., 270-0, . . . , 270-F) coupled to an activated row line. The sensing circuitry can be configured to determine whether the precharge voltage of the IO line 266-1 changes in response to selective activation of column decode lines CD-1 to CD-R 264-1 to 264-R.

In a number of embodiments, the control circuitry (e.g., 140 in FIG. 1) can, in conjunction with the sensing circuitry, be used to perform a WIRED OR operation (e.g., to determine if data stored in the memory array matches a compare value). As an example, the IO line 266-1 can be precharged to a particular voltage. The particular voltage can be a voltage corresponding to a data value. For instance the precharge voltage can be a supply voltage such as Vcc, which may correspond to a logic "1," or a ground voltage, which may correspond to a logic "0."

Activation of column decode line CD-1 turns on transistors 218-1 and 218-2, which provides voltages corresponding to the data stored in sense amplifier 206-1 to IO lines 266-1 and 266-2. As such, the precharge voltage of IO line 266-1 can change based on the particular data value stored in sense amplifier 206-1 (which represents the data stored in a particular memory cell such as cell 270-0). For example, if the sense amplifier 206-1 senses a logic 0 (e.g., a ground voltage) stored in cell 270-0, then the precharge voltage (e.g., Vcc) on the IO line 266-1 will be pulled down (e.g., lowered) when CD-1 is activated, and the change in the precharge voltage can be detected by the SSA 268. As such, the detected change in the precharge voltage indicates that the sensed memory cell (e.g., 270-0) stores a data value (e.g., 0) different from the data value (e.g., 1) corresponding to the precharge voltage. Similarly, if the sense amplifier 206-1 senses a logic 1 (e.g., Vcc) stored in cell 270-0, then the precharge voltage (e.g., Vcc) on the IO line 266-1 will not be pulled down when CD-1 is activated, and no change in the precharge voltage will be detected by the SSA 268. As such, no detected change in the precharge voltage indicates that the sensed memory cell (e.g., 270-0) stores the same data value (e.g., 1) as the data value (e.g., 1) corresponding to the precharge voltage.

The above described ability of the SSA 268 to determine whether the precharge voltage changes can be used to perform WIRED OR operations to determine whether a particular compare value matches data stored in a memory array, for instance. As an example, if an operation is to determine whether a number of cells coupled to a particular row line stores a particular compare value (e.g., "0"), the particular row line can be activated along with the sense lines corresponding the number of memory cells. If any of the cells store a logical "0", then the precharge voltage of the IO line (e.g., local IO line) will be changed (e.g., pulled down). The result of the operation can be reported, for instance, to the requesting control circuitry (e.g., on-die controller, host, etc.). The result of the operation can be reported into the memory array for further calculations. The determined result may be used as part of continued execution of a particular compare operation or other logical operation. For instance, execution may include not only determining if any of the memory cells of the row store a data value (e.g., 0), but which cell(s) store the data value. As such, subsets of the column decode lines may be selectively activated to compare the data values stored by their corresponding cells to the compare value, which can be used in association with a comparison operation, for instance.

The compare values used in association with WIRED OR operations can be requested by control circuitry (e.g., coupled to the sense circuitry 150 in FIG. 1 (e.g., on-die controller 140 in FIG. 1)) and/or by a number of other sources such as an external host, for instance. Similarly, results of WIRED OR operations can be reported to various control circuitry and/or used to perform further operations (e.g., logic operations) as part of if-then-else programmatic flow prior to being reported to control circuitry.

FIG. 3A illustrates a logical diagram showing the states of cells of a portion of an array 330 at a particular phase associated with performing a serial comparison operation in accordance with a number of embodiments of the present disclosure. FIG. 3A includes memory array 330 that is analogous to memory array 230 of FIG. 2A and memory array 130 of FIG. 1. Memory array 330 includes sense lines 305-0, 305-1, 305-2, 305-3, 305-4 (e.g., referred to generally as sense lines 305). More or fewer sense lines can be included in memory array 330. Each of the sense lines 305 represents a different comparison operation. For example, five different comparison operations can be performed (e.g., in parallel) based on the values stored in a number of memory cells that are coupled to the five different sense lines.

Memory array 330 also includes select lines 304-0, 304-1, 304-2, 304-3, 304-4, 304-5, 304-6, 304-7, 304-8, 304-9 (e.g., referred to generally as select lines 304). In FIG. 3A, a first comparison operation can consist of comparing a first value (e.g., srcA value) 320-0 with a second value (e.g., srcB value) 322-0. The results of the first comparison operation can be stored as a first bit 328-0 and a second bit 330-0 of a reset value (e.g., a destination value). A second comparison operation can consist of comparing a first value 320-1 with a second value 322-1. The results of the second comparison operation can be stored as a first bit 328-1 and a second bit 330-1 of a destination value. A third comparison operation can consist of comparing a first value 320-2 with a second value 322-2. The results of the third comparison operation can be stored as a first bit 328-2 and a second bit 330-2 of a destination value. A fourth comparison operation can consist of comparing a first value 320-3 with a second value 322-3. The results of the fourth comparison operation can be stored as a first bit 328-3 and a second bit 330-3 of a destination value. A fifth comparison operation can consist of comparing a first value 320-4 with a second value 322-4. The results of the fifth comparison operation can be stored as a first bit 328-4 and a second bit 330-4 of a destination value.

In a number of examples, a destination value can consist of the first bit and the second bit that are a logical representation of the result of the comparison operation. For example, if a first value is greater than a second value, then the first bit of the destination value can be set to one (e.g., "1") and the second bit of the destination value can be set to zero (e.g., "0"). If a second value is greater than the first value, then the first bit of the destination value can be set to zero (e.g., "0") and the second bit of the destination value can be set to one (e.g., "1"). If the first value is equal to the second value then the first bit and the second bit of the destination value can be set to zero (e.g., "0"). However, the examples given of a destination value are exemplary. Other logical representations of the results of a comparison operation can be used in conjunction with the examples given herein.

The first values 320-0, 320-1, 320-2, 320-3, 320-4, (e.g., referred to generally as first values 320), the second values 322-0, 322-1, 322-2, 322-3, 322-4 (e.g., referred to generally as second values 322) can be stored as part of bit-vectors in the memory cells that are coupled to the select lines 304 and the sense lines 305. Tmp values and tmpset values as described above in connection with FIG. 2A are also shown in FIG. 3A. The tmp values 324-0, 324-1, 324-2, 324-3, 324-4 (e.g., referred to generally as tmp values 324), the tmpset values 326-0, 326-1, 326-2, 326-3, 326-4 (e.g., referred to generally as tmpset values 326), and the destination values comprising the first bits 328-0, 328-1, 328-2, 328-3, 328-4 (e.g., referred to generally as first bits 328) and the second bits 330-0, 330-1, 330-2, 330-3, 330-4 (e.g., referred to generally as second bits 330) can be stored as part of bit-vectors in the memory cells that are coupled to the select lines 304 and the sense lines 305. For example, a first value 320-0 that is stored in a number of memory cells can have a value equal to three. The first value 320-0 can be represented by the bit-vector [011] that can be stored in the memory cells that are coupled to the sense line 305-0 and the select lines 304-0, 304-1, 304-2. In FIG. 3A to 3M each of the first values 320 and the second values 322 are represented using three bits, more or fewer bits can be used to represent the first values 320 and the second values 322.

FIG. 3A, shows the initial states of the memory cells in the memory array 330. For example, the memory cells that store the tmp values 324, the tmpset values 326, and the destination values can be initialized to zero. The memory cells that store first value 320-0 are initialized to store bit-vector [011]. The first value 320-0 is equal to a decimal value of three. The memory cells that store the first value 320-1 are initialized to store bit-vector [000]. The first value 320-1 is equal to a decimal value of zero. The memory cells that store first value 320-2 are initialized to store bit-vector [010]. The first value 320-2 is equal to a decimal value of two. The memory cells that store first value 320-3 are initialized to store bit-vector [100]. The first value 320-3 is equal to a decimal value of four. The memory cells that store first value 320-4 are initialized to store bit-vector [010]. The first value 320-4 is equal to a decimal value of two.

The memory cells that store second value 322-0 are initialized to store bit-vector [100]. The stored second value 322-0 is equal to a decimal value of four. The memory cells that store second value 322-1 are initialized to store bit-vector [001]. The second value 322-1 is equal to one. The memory cells that store second value 322-2 are initialized to store bit-vector [010]. The second value 322-2 is equal to a decimal value of two. The memory cells that store second value 322-3 are initialized to store bit-vector [110]. The second value 322-3 is equal to a decimal value of five. The memory cells that store second value 322-4 are initialized to store bit-vector [001]. The second value 322-4 is equal to a decimal value of one.

FIGS. 3B through 3M illustrate logical diagrams showing the states of memory cells of array portion 330 during different phases (e.g., after computations) associated with performing a comparison operation in accordance with a number of embodiments of the present disclosure. FIG. 3A illustrates the original (e.g., initialized) states of the memory cells of array portion 330 such as the initialization operation described in connection with FIG. 2B.

FIG. 3B illustrates a logical diagram showing the states of the cells of array portion 330 at a particular phase associated with performing a comparison operation (e.g., at a phase subsequent to that shown in FIG. 3A). FIG. 3B illustrates the cells of array portion 330 after a first step in a first iteration of a number of comparison operations such as described with the intermediate operation phases of FIGS. 2C-1 to 2D-2.

The first step in the first iteration can be performed to determine whether the most significant bits from the first values 320 (e.g., srcA values) and the second values 322 (e.g., srcB values) are different. The most significant bits from the first values 320 and the second values 322 can be different if they are not equal to each other.

In a number of examples, the first set of the first iteration can include performing a "ReadRow(srcA+i)" call, a "XorRow(srcB+i)" call, a "XorRow(tmpset)" call, and/or a "WriteRow(tmp)" call as discussed above. In a three (e.g., 3) bit example, during a first iteration an "i" index is set to two (e.g., 2) signifying that a next most significant bit associated with the first values 320 and the second values 322 has an index of two (e.g., 2).

The first step of the first iteration of the comparison operation can include, for example, reading (e.g., ReadRow (srcA+i) a bit (e.g., "0" bit) from a first value 320-0 that is stored in a memory cell coupled to sense line 305-0 and select line 304-2 and performing a first XOR operation (e.g., XorRow(srcB+i)) using as input the read "0" bit and a next most significant bit (e.g., "1" bit) from a second value 322-0 stored in a memory cell that is coupled to sense line 305-0 and select line 304-5. The result (e.g., "1") of the first XOR operation (e.g., XorRow(srcB+i)) and the "0" bit (e.g., tmpset value) stored in a memory cell coupled to sense line 305-0 and select line 304-7 can be used as input to a second XOR operation (e.g., XorRow(tmpset)). The results of the second XOR operation can be stored (e.g., WriteRow(tmp)) in a memory cell coupled to sense line 305-0 and select line 304-6 (e.g., a memory cell associated with the tmp value).

The first step of the first iteration can also be performed for each of the comparison operations associated with sense lines 305-1, 305-2, 305-3, 305-4. That is, the "ReadRow (srcA+i)" call, the "XorRow(srcB+i)" call, the "XorRow (tmpset)" call, and the "WriteRow(tmp)" call can be performed simultaneously for each of the comparison operations associated with the sense lines 305-1, 305-2, 305-3, 305-4.

FIG. 3C illustrates a logical diagram showing the states of the cells of array portion 330 at a particular phase associated with performing a comparison operation (e.g., at a phase subsequent to that shown in FIG. 3B). FIG. 3C illustrates the cells of array portion 330 after a second step in the first iteration of a number of comparison operations. The second step in the first iteration can be performed to store a determination of whether the first values 320 and the second values 322 are different.

In a number of examples, the second step in the first iteration can include performing an "OrRow(tmpset)" call and a "WriteRow(tmpset)" call. The second step of the first iteration of the comparison operation can include, for example, performing a first OR operation (e.g., OrRow (tmpset)) using the result (e.g., "0") of the second XOR operation (e.g., XorRow(tmpset)) and a "0" bit stored in a memory cell coupled to sense line 305-0 and select line 304-7. The second step of the first iteration of the comparison operation can also include performing a write operation (e.g., WriteRow(tmpset)) to store the results of the first OR operation (e.g. OrRow(tmpset)) in the memory cell coupled to sense line 305-0 and select line 304-7. The second step in the first iteration can also be performed simultaneously for each of the other comparison operations associated with the sense lines 305-1, 305-2, 305-3, 305-4.

FIG. 3D illustrates a logical diagram showing the states of the cells of array portion 330 at a particular phase associated with performing a comparison operation (e.g., at a phase subsequent to that shown in FIG. 3C). FIG. 3D illustrates the cells of array portion 330 after a third step in the first iteration of a number of comparison operations. The third step in the first iteration can be executed to determine whether the first values 320 (e.g., srcA values) are larger than the second values 322 (e.g., srcB values).

In a number of examples, the third step in the first iteration can include performing a "ReadRow(srcA+i)" call, a "AndRow(tmp)" call, a "OrRow(dest)" call, and a "WriteRow (dest)". The read operation (e.g., ReadRow(srcA+i)) can read a most significant bit (e.g., "0"), from a first value 320-0, that is stored in a memory cell that is coupled to sense line 305-0 and select line 304-2. A first AND operation (e.g., AndRow(tmp)) can use, as input, the read bit (e.g., "0") and a bit stored in the memory cell coupled to sense line 305-0 and select line 304-6. The result (e.g., 0) of the first AND operation and a bit (e.g., 0) stored in a memory cell coupled to the sense line 305-0 and select line 304-8 can be used as input to a second OR operation (e.g., OrRow(dest)). The result (e.g., 0) of the second OR operation can be stored (e.g., WriteRow(dest)) in a memory cell coupled to sense line 305-0 and select line 304-8. The third step in the first iteration can also be performed simultaneously for each of the other comparison operations associated with the sense lines 305-1, 305-2, 305-3, 305-4.

FIG. 3E illustrates a logical diagram showing the states of the cells of array portion 330 at a particular phase associated with performing a comparison operation (e.g., at a phase subsequent to that shown in FIG. 3D). FIG. 3E illustrates the cells of array portion 330 after a fourth step in the first iteration of a number of comparison operations. The fourth step in the first iteration can be executed to determine whether the second values 322 (e.g., srcB values) are larger than the first values 320 (e.g., srcA values).

In a number of examples, the fourth step in the first iteration can include performing a "ReadRow(srcB+i)" call, a "AndRow(tmp)" call, a "OrRow(dest+1)" call, and a "WriteRow(dest+1)". The read operation (e.g., ReadRow (srcB+i)) can, for example, read a most significant bit (e.g., "1"), from a second value 322-0, that is stored in a memory cell that is coupled to sense line 305-0 and select line 304-5. A second AND operation (e.g., AndRow(tmp)) can use as input the read (e.g., ReadRow(srcB+i) bit (e.g., "1") and a bit (e.g., "1") stored in the memory cell coupled to sense line 305-0 and select line 304-6. The result (e.g., "1") of the second AND operation and a bit (e.g., 0) stored in a memory cell coupled to the sense line 305-0 and select line 304-9 can be used as input to a third OR operation (e.g., OrRow(dest+ 1)). The result (e.g., 1) of the third OR operation can be stored (e.g., WriteRow(dest+1)) in a memory cell coupled to sense line 305-0 and select line 304-9. The fourth step in the first iteration can also be performed for each of the other comparison operations associated with the sense lines 305-1, 305-2, 305-3, 305-4.

FIG. 3F illustrates a logical diagram showing the states of the cells of array portion 330 at a particular phase associated with performing a comparison operation (e.g., at a phase subsequent to that shown in FIG. 3E). FIG. 3F illustrates the cells of array portion 330 after a first step of a second iteration of a number of comparison operations. The first step in the second iteration can be performed to determine whether the next most significant bits from the first values 322 (e.g., srcA values) and the second values 322 (e.g., srcB values) are different.

In a number of examples, the first step of the second iteration can include performing a "ReadRow(srcA+i)" call, a "XorRow(srcB+i)" call, a "XorRow(tmpset)" call, and a "WriteRow(tmp)" call. During the second iteration an "i" index is set to one (e.g., 1) signifying that a next most significant bit associated with the first values 320 and the second values 322 has an index of one (e.g., 1).

The first step of the second iteration of the comparison operation can, for example, include reading (e.g., ReadRow (srcA+i) a bit (e.g., "1" bit) from a first value 320-4 stored in a memory cell coupled to sense line 305-4 and select line 304-1 and performing a first XOR operation (e.g., XorRow (srcB+i)) using, as input, the read bit (e.g., "1" bit) and a next most significant bit (e.g., "0" bit) from a second value 322-4 stored in a memory cell that is coupled to sense line 305-4 and select line 304-4. The result (e.g., "1") of the first XOR operation (e.g., XorRow(srcB+i)) and "0" bit (e.g., tmpset value) stored in a memory cell coupled to sense line 305-4 and select line 304-7 can be used as input to a second XOR operation (e.g., XorRow(tmpset)). The results (e.g., 1) of the second XOR operation can be stored (e.g., WriteRow (tmp)) in a memory cell coupled to sense line 305-4 and select line 304-6 (e.g., a memory cell associated with the tmp value).

The first step of the second iteration of the comparison operation can also, for example, include reading (e.g., ReadRow(srcA+i) a bit (e.g., "1" bit) from a first value 320-2 stored in a memory cell coupled to sense line 305-2 and select line 304-1 and performing a first XOR operation (e.g., XorRow(srcB+i)) using as input the read "1" bit and a next most significant bit (e.g., "1" bit) from a second value 322-2 stored in a memory cell that is coupled to sense line 305-2 and select line 304-4. The result (e.g., "0") of the first XOR operation (e.g., XorRow(srcB+i)) and "0" bit (e.g., tmpset value) stored in a memory cell coupled to sense line 305-2 and select line 304-7 can be used as input to a second XOR operation (e.g., XorRow(tmpset)). The results (e.g., 0) of the second XOR operation can be stored (e.g., WriteRow(tmp)) in a memory cell coupled to sense line 305-2 and select line 304-6 (e.g., a memory cell associated with the tmp value).

The first step of the second iteration can also be performed for each of the comparison operations associated with sense lines 305-0, 305-1, 305-3. That is, the "ReadRow(srcA+i)" call, the "XorRow(srcB+i)" call, the "XorRow(tmpset)" call, and the "WriteRow(tmp)" call can be performed simultaneously for each of the comparison operations associated with the sense lines 305-0, 305-1, 305-3. For example, performing the first step in the second iteration can result in storing a "1" bit in a memory cell coupled to sense line 305-3 and select line 304-6.

FIG. 3G illustrates a logical diagram showing the states of the cells of array portion 330 at a particular phase associated with performing a comparison operation (e.g., at a phase subsequent to that shown in FIG. 3F). FIG. 3G illustrates the cells of array portion 330 after a second step in the second iteration. The second step in the second iteration can be performed to store a determination whether the first values 320 (e.g., srcA values) and the second values 322 (e.g., srcB values) are different.

In a number of examples, the second step in the second iteration can include performing an "OrRow(tmpset)" call and a "WriteRow(tmpset)" call. The second step of the second iteration of the comparison operation can include, for example, performing a first OR operation (e.g., OrRow (tmpset)) using the result (e.g., "1") of the second XOR operation (e.g., XorRow(tmpset)) and a "0" bit stored in a memory cell coupled to sense line 305-4 and select line 304-7. The second step of the second iteration of the comparison operation can also include performing a write operation (e.g., WriteRow(tmpset)) to store the results (e.g., "1") of the first OR operation (e.g., OrRow(tmpset)) in the memory cell coupled to sense line 305-4 and select line 304-7.

In a number of examples, the second step in the second iteration can also include performing an "OrRow(tmpset)" call and a "WriteRow(tmpset)" call for the comparison operation associated with the sense line 305-2. For example, the second step of the second iteration of the comparison operation can include performing a first OR operation (e.g., OrRow(tmpset)) using the result (e.g., "0") of the second XOR operation (e.g., XorRow(tmpset)) and a "0" bit stored in a memory cell coupled to sense line 305-2 and select line 304-7. The second step of the second iteration of the comparison operation can also include performing a write operation (e.g., WriteRow(tmpset)) to store the results (e.g., "0") of the first OR operation (e.g., OrRow(tmpset)) in the memory cell coupled to sense line 305-2 and select line 304-7.

The second step in the second iteration can also be performed simultaneously for each of the other comparison operations associated with the sense lines 305-0, 305-1, 305-3. For example, performing the second step in the second iteration can result in storing a "1" in the memory cell coupled to sense line 305-3 and select line 304-7.

FIG. 3H illustrates a logical diagram showing the states of the cells of array portion 330 at a particular phase associated with performing a comparison operation (e.g., at a phase subsequent to that shown in FIG. 3G). FIG. 3H illustrates the cells of array portion 330 after a third step in the second iteration. The third step in the second iteration can be executed to determine whether the first values 320 (e.g., srcA values) are larger than the second values 322 (e.g., srcB values).

In a number of examples, the third step in the second iteration can include performing a "ReadRow(srcA+i)" call, a "AndRow(tmp)" call, a "OrRow(dest)" call, and a "WriteRow(dest)". The read operation (e.g., ReadRow(srcA+i)) can read a next most significant bit (e.g., "1"), from a first value 320-4, that is stored in a memory cell that is coupled to sense line 305-4 and select line 304-1. A first AND operation (e.g., AndRow(tmp)) can use as input the read bit (e.g., "1") and a bit (e.g., "1") stored in the memory cell coupled to sense line 305-4 and select line 304-6. The result (e.g., "1") of the first AND operation and a bit (e.g., "0") stored in a memory cell coupled to the sense line 305-4 and select line 304-8 can be used as input to a second OR operation (e.g., OrRow(dest)). The result (e.g., "1") of the second OR operation can be stored (e.g., WriteRow(dest)) in a memory cell coupled to sense line 305-4 and select line 304-8.

The third step in the second iteration can also include, for example, performing the read operation (e.g., ReadRow(srcA+i)) to read a next most significant bit (e.g., "1"), from a first value 320-2, that is stored in a memory cell that is coupled to sense line 305-2 and select line 304-1. A first AND operation (e.g., AndRow(tmp)) can use as input the read bit (e.g., "1") and a bit (e.g., "0") stored in the memory cell coupled to sense line 305-2 and select line 304-6. The result (e.g., "0") of the first AND operation and a bit (e.g., "0") stored in a memory cell coupled to the sense line 305-2 and select line 304-8 can be used as input to a second OR operation (e.g., OrRow(dest)). The result (e.g., "0") of the second OR operation can be stored (e.g., WriteRow(dest)) in a memory cell coupled to sense line 305-2 and select line 304-8. The third step in the second iteration can also be performed simultaneously for each of the other comparison operations associated with the sense lines 305-0, 305-1, 305-3.

FIG. 3I illustrates a logical diagram showing the states of the cells of array portion 330 at a particular phase associated with performing a comparison operation (e.g., at a phase subsequent to that shown in FIG. 3H). FIG. 3I illustrates the cells of array portion 330 after a fourth step in the second iteration. The fourth step in the first iteration can be executed to determine whether the second values 322 (e.g., srcB values) are larger than the first values 320 (e.g., srcA values).

In a number of examples, the fourth step in the second iteration can include performing a "ReadRow(srcB+i)" call, an "AndRow(tmp)" call, a "OrRow(dest+1)" call, and a "WriteRow(dest+1)". The read operation (e.g., ReadRow(srcB+i)) can read a next most significant bit (e.g., "0"), from a second value 322-4, that is stored in a memory cell that is coupled to sense line 305-4 and select line 304-4. A second AND operation (e.g., AndRow(tmp)) can use as input the read bit (e.g., "0") and a bit (e.g., "1") stored in the memory cell coupled to sense line 305-4 and select line 304-6. The result (e.g., "0") of the second AND operation and a bit (e.g., "0") stored in a memory cell coupled to the sense line 305-4 and select line 304-9 can be used as input to a third OR operation (e.g., OrRow(dest+1)). The result (e.g., 0) of the third OR operation can be stored (e.g., WriteRow(dest+1)) in a memory cell coupled to sense line 305-4 and select line 304-9.

In a number of examples, the fourth step in the second iteration can also, for example, perform a read operation (e.g., ReadRow(srcB+i)) to read a next most significant bit (e.g., "1"), from a second value 322-2, that is stored in a memory cell that is coupled to sense line 305-2 and select line 304-4. A second AND operation (e.g., AndRow(tmp)) can use as input the read bit (e.g., "1") and a bit (e.g., "0") stored in the memory cell coupled to sense line 305-2 and select line 304-6. The result (e.g., "0") of the second AND operation and a bit (e.g., "0") stored in a memory cell coupled to the sense line 305-0 and select line 304-9 can be used as input to a third OR operation (e.g., OrRow(dest+1)). The result (e.g., 0) of the third OR operation can be stored (e.g., WriteRow(dest+1)) in a memory cell coupled to sense line 305-2 and select line 304-9.

The fourth step in the second iteration can also be performed for each of the other comparison operations associated with the sense lines 305-0, 305-1, 305-3. For example, performing the fourth step in the second iteration can result in storing a "1" in the memory cell coupled to sense line 305-3 and select line 304-9.

FIG. 3J illustrates a logical diagram showing the states of the cells of array portion 330 at a particular phase associated with performing a comparison operation (e.g., at a phase subsequent to that shown in FIG. 3I). FIG. 3J illustrates the cells of array portion 330 after a first step of a third iteration of a number of comparison operations. The first step in the third iteration can be performed to determine whether the next most significant bits from the first values 322 (e.g., srcA values) and the second values 322 (e.g., srcB values) are different.

In a number of examples, the first step of the third iteration can include performing a "ReadRow(srcA+i)" call, a "XorRow(srcB+i)" call, a "XorRow(tmpset)" call, and a "WriteRow(tmp)" call. During the third iteration an "i" index is set to zero (e.g., "0") signifying that a next most significant bit associated with the first values 320 and the second values 322 has an index of zero (e.g., "0").

The first step of the third iteration of the comparison operation can, for example, include reading (e.g., ReadRow (srcA+i) a bit (e.g., "0" bit) from a first value 320-1 stored in a memory cell coupled to sense line 305-1 and select line 304-0 and performing a first XOR operation (e.g., XorRow (srcB+i)) using as input the read "0" bit and a next most significant bit (e.g., "1" bit) from a second value 322-1 stored in a memory cell that is coupled to sense line 305-1 and select line 304-0. The result (e.g., "1") of the first XOR operation (e.g., XorRow(srcB+i)) and "0" bit (e.g., tmpset value) stored in a memory cell coupled to sense line 305-1 and select line 304-7 can be used as input to a second XOR operation (e.g., XorRow(tmpset)). The results (e.g., "1") of the second XOR operation can be stored (e.g., WriteRow (tmp)) in a memory cell coupled to sense line 305-1 and select line 304-6 (e.g., a memory cell associated with the tmp value).

The first step of the third iteration can also be performed for each of the comparison operations associated with sense lines 305-0, 305-2, 305-3, 305-4. That is, the "ReadRow (srcA+i)" call, the "XorRow(srcB+i)" call, the "XorRow (tmpset)" call, and the "WriteRow(tmp)" call can be performed simultaneously for each of the comparison operations associated with the sense lines 305-0, 305-2, 305-3, 305-4.

FIG. 3K illustrates a logical diagram showing the states of the cells of array portion 330 at a particular phase associated with performing a comparison operation (e.g., at a phase subsequent to that shown in FIG. 3J). FIG. 3K illustrates the cells of array portion 330 after a second step in the third iteration. The second step in the third iteration can be performed to store a determination whether the first values 320 (e.g., srcA values) and the second values 322 (e.g., srcB values) are different.

In a number of examples, the second step in the third iteration can include performing an "OrRow(tmpset)" call and a "WriteRow(tmpset)" call. The second step of the third iteration of the comparison operation can include, for example, performing a first OR operation (e.g., OrRow (tmpset)) using the result (e.g., "1") of the second XOR operation (e.g., XorRow(tmpset)) and a "1" bit stored in a memory cell coupled to sense line 305-1 and select line 304-7. The second step of the third iteration of the comparison operation can also include performing a write operation (e.g., WriteRow(tmpset)) to store the results (e.g., "1") of the first OR operation (e.g., OrRow(tmpset)) in the memory cell coupled to sense line 305-1 and select line 304-7. The second step in the third iteration can also be performed simultaneously for each of the other comparison operations associated with the sense lines 305-0, 305-2, 305-3, 305-4.

FIG. 3L illustrates a logical diagram showing the states of the cells of array portion 330 at a particular phase associated with performing a comparison operation (e.g., at a phase subsequent to that shown in FIG. 3K). FIG. 3L illustrates the cells of array portion 330 after a third step in the third iteration. The third step in the third iteration can be executed to determine whether the first values 320 (e.g., srcA values) are larger than the second values 322 (e.g., srcB values).

In a number of examples, the third step in the third iteration can include performing a "ReadRow(srcA+i)" call, a "AndRow(tmp)" call, a "OrRow(dest)" call, and a "WriteRow(dest)". The read operation (e.g., ReadRow(srcA+i)) can read a next most significant bit (e.g., "0"), from a first value 320-1, that is stored in a memory cell that is coupled to sense line 305-1 and select line 304-0. A first AND operation (e.g., AndRow(tmp)) can use as input the read bit (e.g., "0") and a bit (e.g., "1") stored in the memory cell coupled to sense line 305-1 and select line 304-6. The result (e.g., "0") of the first AND operation and a bit (e.g., "0") stored in a memory cell coupled to the sense line 305-1 and select line 304-8 can be used as input to a second OR operation (e.g., OrRow(dest)). The result (e.g., "0") of the second OR operation can be stored (e.g., WriteRow(dest)) in a memory cell coupled to sense line 305-1 and select line 304-8. The third step in the third iteration can also be performed simultaneously for each of the other comparison operations associated with the sense lines 305-0, 3305-2, 305-3, 305-4.

FIG. 3M illustrates a logical diagram showing the states of the cells of array portion 330 at a particular phase associated with performing a comparison operation (e.g., at a phase subsequent to that shown in FIG. 3L). FIG. 3M illustrates the cells of array portion 330 after a fourth step in the third iteration. The fourth step in the third iteration can be executed to determine whether the second values 322 (e.g., srcB value) are larger than the first values 320 (e.g., srcA value).

In a number of examples, the fourth step in the third iteration can include performing a "ReadRow(srcB+i)" call, an "AndRow(tmp)" call, a "OrRow(dest+1)" call, and a "WriteRow(dest+1)". The read operation (e.g., ReadRow (srcB+i)) can read a next most significant bit (e.g., "1"), from a second value 322-1, that is stored in a memory cell that is coupled to sense line 305-1 and select line 304-3. A second AND operation (e.g., AndRow(tmp)) can use as input the read bit (e.g., "1") and a bit (e.g., "1") stored in the memory cell coupled to sense line 305-1 and select line 304-6. The result (e.g., "1") of the second AND operation and a bit (e.g., "0") stored in a memory cell coupled to the sense line 305-1 and select line 304-9 can be used as input to a third OR operation (e.g., OrRow(dest+1)). The result (e.g., "1") of the third OR operation can be stored (e.g., WriteRow(dest+1)) in a memory cell coupled to sense line 305-1 and select line 304-9. The fourth step in the third iteration can also be performed for each of the other comparison operations associated with the sense lines 305-0, 305-2, 305-3, 305-4.

In a number of examples, after each of the fourth steps in each of the iterations, it can be determined whether the comparison operation has concluded regardless of the current iteration. For example, if after a first iteration all of the comparison operations have determined that all of the first values 320 are either greater or less than the second values 322, then the comparison operations can conclude. Determining whether all of the comparison operations have determined that the first values 320 are greater than the second values 322 and/or whether the second values 322 are greater than the first values 320 can be performed using a WIRED OR operation described above. The comparison operation can conclude by breaking out of a FOR loop associated with the number of iterations of the comparison operations.

Embodiments however, are not limited to the order of the sequence of steps shown in this example. For example, a second step in a first iteration can be performed after a fourth step in the first iteration.

Figure 4:
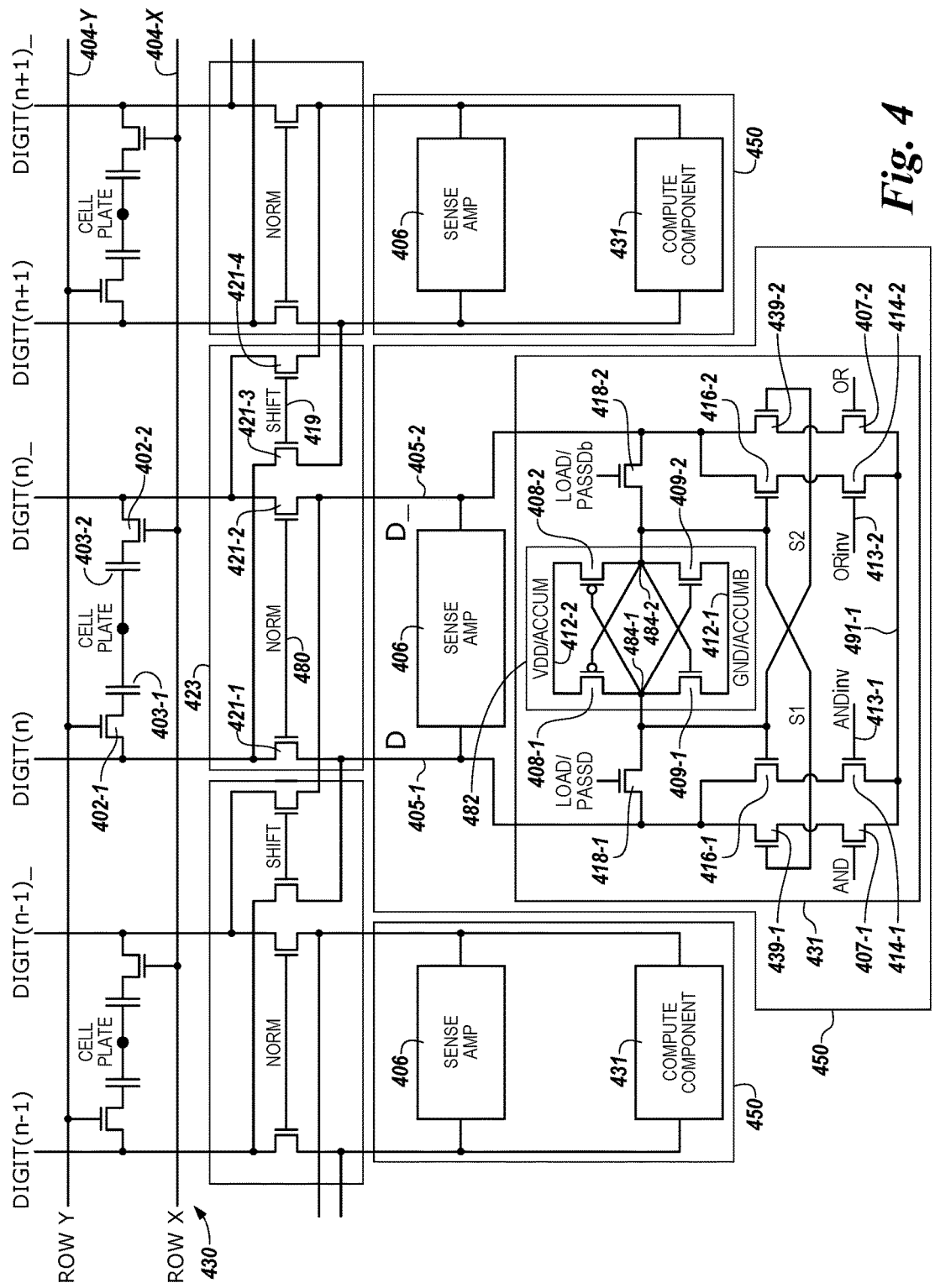
FIG. 4 illustrates a schematic diagram of sensing circuitry in accordance with a number of embodiments of the present disclosure.

FIG. 4 illustrates a schematic diagram of sensing circuitry in accordance with a number of embodiments of the present disclosure. The sensing circuitry shown in FIG. 4 can also be used to perform a comparison operation as described above. A memory cell comprises a storage element (e.g., capacitor) and an access device (e.g., transistor). For instance, transistor 402-1 and capacitor 403-1 comprises a memory cell, and transistor 402-2 and capacitor 403-2 comprises a memory cell, etc. In this example, the memory array 430 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read). The cells of the memory array 430 are arranged in rows coupled by word lines 404-X (Row X), 404-Y (Row Y), etc., and columns coupled by pairs of complementary data lines DIGIT(n−1)/ DIGIT(n−1)_, DIGIT(n)/DIGIT(n)_, DIGIT(n+1)/DIGIT (n+1)_. The individual data lines corresponding to each pair of complementary data lines can also be referred to as data lines 405-1 (D) and 405-2 (D_) respectively. Although only three pair of complementary data lines are shown in FIG. 4, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 402-1 can be coupled to data line 405-1 (D), a second source/drain region of transistor 402-1 can be coupled to capacitor 403-1, and a gate of a transistor 402-1 can be coupled to word line 404-X. A first source/drain region of a transistor 402-2 can be coupled to data line 405-2 (D_), a second source/drain region of transistor 402-2 can be coupled to capacitor 403-2, and a gate of a transistor 402-2 can be coupled to word line 404-Y. The cell plate, as shown in FIG. 4, can be coupled to each of capacitors 403-1 and 403-2. The cell plate can be a common node to which a reference voltage (e.g., ground) can be applied in various memory array configurations.

The memory array 430 is coupled to sensing circuitry 450 in accordance with a number of embodiments of the present disclosure. In this example, the sensing circuitry 450 comprises a sense amplifier 406 and a compute component 431 corresponding to respective columns of memory cells (e.g., coupled to respective pairs of complementary data lines). The sense amplifier 406 can comprise a cross coupled latch, which can be referred to herein as a primary latch. The sense amplifier 406 can be configured, for example, as described with respect to FIG. 5.

In the example illustrated in FIG. 4, the circuitry corresponding to compute component 431 comprises a static latch 482 and an additional ten transistors that implement, among other things, a dynamic latch. The dynamic latch and/or static latch of the compute component 431 can be collectively referred to herein as a secondary latch, which can serve as an accumulator. As such, the compute component 431 can operate as and/or be referred to herein as an accumulator. The compute component 431 can be coupled to each of the data lines D 405-1 and D 405-2 as shown in FIG. 4. However, embodiments are not limited to this example. The transistors of compute component 431 can all be n-channel transistors (e.g., NMOS transistors), for example.

In this example, data line D 405-1 can be coupled to a first source/drain region of transistors 416-1 and 439-1, as well as to a first source/drain region of load/pass transistor 418-1. Data line D_ 405-2 can be coupled to a first source/drain region of transistors 416-2 and 439-2, as well as to a first source/drain region of load/pass transistor 418-2.

The gates of load/pass transistor 418-1 and 418-2 can be commonly coupled to a LOAD control signal, or respectively coupled to a PASSD/PASSDB control signal, as discussed further below. A second source/drain region of load/pass transistor 418-1 can be directly coupled to the gates of transistors 416-1 and 439-2. A second source/drain region of load/pass transistor 418-2 can be directly coupled to the gates of transistors 416-2 and 439-1.

A second source/drain region of transistor 416-1 can be directly coupled to a first source/drain region of pull-down transistor 414-1. A second source/drain region of transistor 439-1 can be directly coupled to a first source/drain region of pull-down transistor 407-1. A second source/drain region of transistor 416-2 can be directly coupled to a first source/drain region of pull-down transistor 414-2. A second source/drain region of transistor 439-2 can be directly coupled to a first source/drain region of pull-down transistor 407-2. A second source/drain region of each of pull-down transistors 407-1, 407-2, 414-1, and 414-2 can be commonly coupled together to a reference voltage 491 (e.g., ground (GND)). A gate of pull-down transistor 407-1 can be coupled to an AND control signal line, a gate of pull-down transistor 414-1 can be coupled to an ANDinv control signal line 413-1, a gate of pull-down transistor 414-2 can be coupled to an ORinv control signal line 413-2, and a gate of pull-down transistor 407-2 can be coupled to an OR control signal line.

The gate of transistor 439-1 can be referred to as node S1 and the gate of transistor 439-2 can be referred to as node S2. The circuit shown in FIG. 4 stores accumulator data dynamically on nodes S1 and S2. Activating the LOAD control signal causes load/pass transistors 418-1 and 418-2 to conduct, and thereby load complementary data onto nodes S1 and S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 4 is not contingent on the LOAD control signal being elevated to a voltage greater than $V_{DD}$.

The configuration of compute component 431 shown in FIG. 4 has the benefit of balancing the sense amplifier for functionality when the pull-down transistors 407-1, 407-2, 414-1, and 414-2 are conducting before the sense amplifier 406 is fired (e.g., during pre-seeding of the sense amplifier 406). As used herein, firing the sense amplifier 406 refers to enabling the sense amplifier 406 to set the primary latch and subsequently disabling the sense amplifier 406 to retain the set primary latch. Performing logical operations after equilibration is disabled (in the sense amp), but before the sense amplifier fires, can save power usage because the latch of the sense amplifier does not have to be "flipped" using full rail voltages (e.g., $V_{DD}$, GND).

Inverting transistors can pull-down a respective data line in performing certain logical operations. For example, transistor 416-1 (having a gate coupled to S2 of the dynamic latch) in series with transistor 414-1 (having a gate coupled to an ANDinv control signal line 413-1) can be operated to pull-down data line 405-1 (D), and transistor 416-2 (having a gate coupled to S1 of the dynamic latch) in series with transistor 414-2 (having a gate coupled to an ANDinv control signal line 413-2) can be operated to pull-down data line 405-2 (D_).

The latch 482 can be controllably enabled by coupling to an active negative control signal line 412-1 (ACCUMB) and an active positive control signal line 412-2 (ACCUM) rather than be configured to be continuously enabled by coupling to ground and $V_{DD}$. In various embodiments, load/pass transistors 408-1 and 408-2 can each having a gate coupled to one of a LOAD control signal or a PASSD/PASSDB control signal.

According to some embodiments, the gates of load/pass transistors 418-1 and 418-2 can be commonly coupled to a LOAD control signal. In the configuration where the gates of load/pass transistors 418-1 and 418-2 are commonly coupled to the LOAD control signal, load/pass transistors 418-1 and 418-2 can be load transistors. Activating the LOAD control signal causes the load transistors to conduct, and thereby load complementary data onto nodes S1 and S2. The LOAD control signal can be elevated to a voltage greater than $V_{DD}$ to pass a full $V_{DD}$ level to S1/S2. However, the LOAD control signal need not be elevated to a voltage greater than $V_{DD}$ is optional, and functionality of the circuit shown in FIG. 4 is not contingent on the LOAD control signal being elevated to a voltage greater than $V_{DD}$.

According to some embodiments, the gate of load/pass transistor 418-1 can be coupled to a PASSD control signal, and the gate of load/pass transistor 418-2 can be coupled to a PASSDb control signal. In the configuration where the gates of load/pass transistors 418-1 and 418-2 are respectively coupled to one of the PASSD and PASSDb control signals, load/pass transistors 418-1 and 418-2 can be pass transistors. Pass transistors can be operated differently (e.g., at different times and/or under different voltage/current conditions) than load transistors. As such, the configuration of pass transistors can be different than the configuration of load transistors.

Load transistors are constructed to handle loading associated with coupling data lines to the local dynamic nodes S1 and S2, for example. Pass transistors are constructed to handle heavier loading associated with coupling data lines to an adjacent accumulator (e.g., through the shift circuitry 423, as shown in FIG. 4). According to some embodiments, load/pass transistors 418-1 and 418-2 can be configured to accommodate the heavier loading corresponding to a pass transistor but be coupled and operated as a load transistor. Load/pass transistors 418-1 and 418-2 configured as pass transistors can also be utilized as load transistors. However, load/pass transistors 418-1 and 418-2 configured as load transistors may not be capable of being utilized as pass transistors.

In a number of embodiments, the compute component 431, including the latch 482, can comprise a number of transistors formed on pitch with the transistors of the corresponding memory cells of an array (e.g., array 430 shown in FIG. 4) to which they are coupled, which may conform to a particular feature size (e.g., $4F^2$, $6F^2$, etc.). According to various embodiments, latch 482 includes four transistors 408-1, 408-2, 409-1, and 409-2 coupled to a pair of complementary data lines D 405-1 and D_ 405-2 through load/pass transistors 418-1 and 418-2. However, embodiments are not limited to this configuration. The latch 482 can be a cross coupled latch (e.g., gates of a pair of transistors, such as n-channel transistors (e.g., NMOS transistors) 409-1 and 409-2 are cross coupled with the gates of another pair of transistors, such as p-channel transistors (e.g., PMOS transistors) 408-1 and 408-2). As described further herein, the cross coupled latch 482 can be referred to as a static latch.

The voltages or currents on the respective data lines D and D_ can be provided to the respective latch inputs 484-1 and 484-2 of the cross coupled latch 482 (e.g., the input of the secondary latch). In this example, the latch input 484-1 is coupled to a first source/drain region of transistors 408-1 and 409-1 as well as to the gates of transistors 408-2 and 409-2. Similarly, the latch input 484-2 can be coupled to a first source/drain region of transistors 408-2 and 409-2 as well as to the gates of transistors 408-1 and 409-1.

Figure 5:
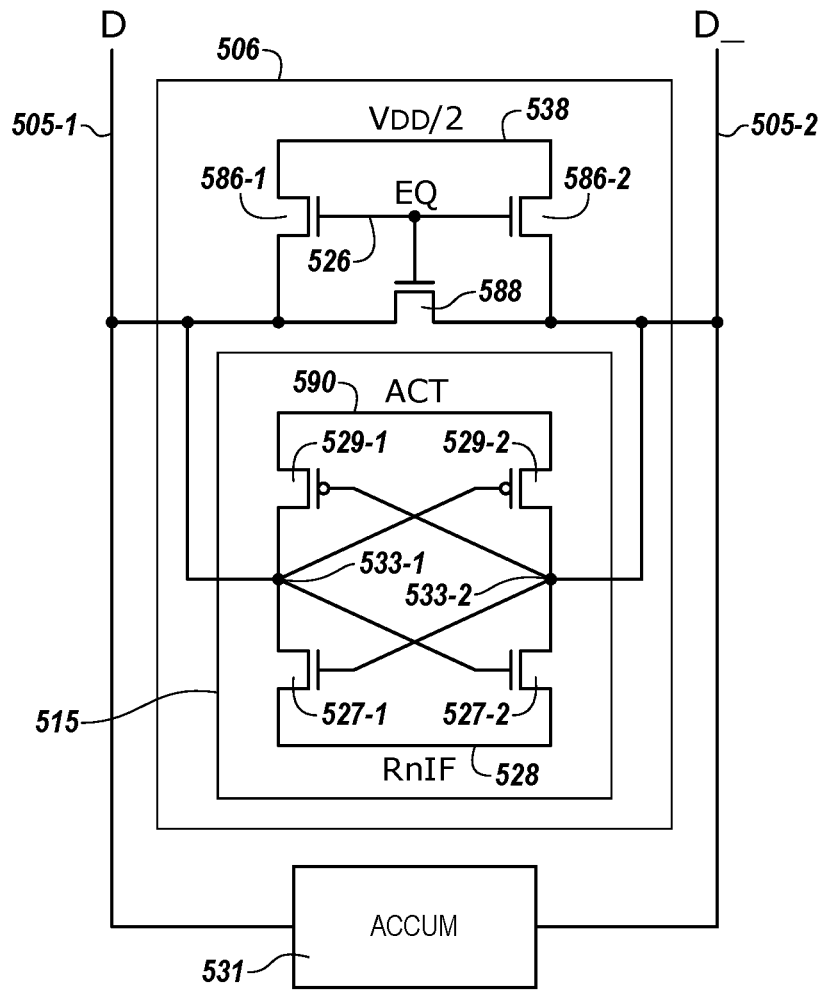
FIG. 5 illustrates a schematic diagram of a portion of sensing circuitry in accordance with a number of embodiments of the present disclosure.

In this example, a second source/drain region of transistor 409-1 and 409-2 is commonly coupled to a negative control signal line 412-1 (e.g., ground (GND) or ACCUMB control signal similar to control signal RnIF shown in FIG. 5 with respect to the primary latch). A second source/drain region of transistors 408-1 and 408-2 is commonly coupled to a positive control signal line 412-2 (e.g., $V_{DD}$ or ACCUM control signal similar to control signal ACT shown in FIG. 5 with respect to the primary latch). The positive control signal 412-2 can provide a supply voltage (e.g., $V_{DD}$) and the negative control signal 412-1 can be a reference voltage (e.g., ground) to enable the cross coupled latch 482. According to some embodiments, the second source/drain region of transistors 408-1 and 408-2 are commonly coupled directly to the supply voltage (e.g., $V_{DD}$), and the second source/drain region of transistor 409-1 and 409-2 are commonly coupled directly to the reference voltage (e.g., ground) so as to continuously enable latch 482.

The enabled cross coupled latch 482 operates to amplify a differential voltage between latch input 484-1 (e.g., first common node) and latch input 484-2 (e.g., second common node) such that latch input 484-1 is driven to either the activated positive control signal voltage (e.g., $V_{DD}$) or the activated negative control signal voltage (e.g., ground), and latch input 484-2 is driven to the other of the activated positive control signal voltage (e.g., $V_{DD}$) or the activated negative control signal voltage (e.g., ground).

FIG. 5 illustrates a schematic diagram of a portion of sensing circuitry in accordance with a number of embodiments of the present disclosure. According to various embodiments, sense amplifier 406 can comprise a cross coupled latch. However, embodiments of the sense amplifier 506 are not limited to the a cross coupled latch. As an example, the sense amplifier 506 can be current-mode sense amplifier and/or single-ended sense amplifier (e.g., sense amplifier coupled to one data line). Also, embodiments of the present disclosure are not limited to a folded data line architecture.

In a number of embodiments, a sense amplifier (e.g., 506) can comprise a number of transistors formed on pitch with the transistors of the corresponding compute component 531 and/or the memory cells of an array (e.g., array 430 shown in FIG. 4) to which they are coupled, which may conform to a particular feature size (e.g., $4F^2$, $6F^2$, etc.). The sense amplifier 506 comprises a latch 515 including four transistors coupled to a pair of complementary data lines D 505-1 and D_ 505-2. The latch 515 can be a cross coupled latch (e.g., gates of a pair of transistors, such as n-channel transistors (e.g., NMOS transistors) 527-1 and 527-2 are cross coupled with the gates of another pair of transistors, such as p-channel transistors (e.g., PMOS transistors) 529-1 and 529-2). As described further herein, the latch 515 comprising transistors 527-1, 527-2, 529-1, and 529-2 can be referred to as a primary latch. However, embodiments are not limited to this example.

The voltages or currents on the respective data lines D and D_ can be provided to the respective latch inputs 533-1 and 533-2 of the cross coupled latch 515 (e.g., the input of the secondary latch). In this example, the latch input 533-1 is coupled to a first source/drain region of transistors 527-1 and 529-1 as well as to the gates of transistors 527-2 and 529-2. Similarly, the latch input 533-2 can be coupled to a first source/drain region of transistors 527-2 and 529-2 as well as to the gates of transistors 527-1 and 529-1. The compute component 533 (e.g., accumulator) can be coupled to latch inputs 533-1 and 533-2 of the cross coupled latch 515 as shown; however, embodiments are not limited to the example shown in FIG. 5.

In this example, a second source/drain region of transistor 527-1 and 527-2 is commonly coupled to an active negative control signal 528 (RnIF). A second source/drain region of transistors 529-1 and 529-2 is commonly coupled to an active positive control signal 590 (ACT). The ACT signal 590 can be a supply voltage (e.g., $V_{DD}$) and the RnIF signal can be a reference voltage (e.g., ground). Activating signals 528 and 590 enables the cross coupled latch 515.

The enabled cross coupled latch 515 operates to amplify a differential voltage between latch input 533-1 (e.g., first common node) and latch input 533-2 (e.g., second common node) such that latch input 533-1 is driven to one of the ACT signal voltage and the RnIF signal voltage (e.g., to one of $V_{DD}$ and ground), and latch input 533-2 is driven to the other of the ACT signal voltage and the RnIF signal voltage.

The sense amplifier 506 can also include circuitry configured to equilibrate the data lines D and D_ (e.g., in association with preparing the sense amplifier for a sensing operation). In this example, the equilibration circuitry comprises a transistor 588 having a first source/drain region coupled to a first source/drain region of transistor 586-1 and data line D 505-1. A second source/drain region of transistor 588 can be coupled to a first source/drain region of transistor 586-2 and data line D_ 505-2. A gate of transistor 588 can be coupled to gates of transistors 586-1 and 586-2.

The second source drain regions of transistors 586-1 and 586-2 are coupled to an equilibration voltage 538 (e.g., $V_{DD}/2$), which can be equal to $V_{DD}/2$, where $V_{DD}$ is a supply voltage associated with the array. The gates of transistors 588, 586-1, and 586-2 can be coupled to control signal 586 (EQ). As such, activating EQ enables the transistors 588, 586-1, and 586-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., accumulator).

As shown in FIG. 4, the sense amplifier 406 and the compute component 431 can be coupled to the array 430 via shift circuitry 423. In this example, the shift circuitry 423 comprises a pair of isolation devices (e.g., isolation transistors 421-1 and 421-2) coupled to data lines 405-1 (D) and 405-2 (D_), respectively). The isolation transistors 421-1 and 421-2 are coupled to a control signal 480 (NORM) that, when activated, enables (e.g., turns on) the isolation transistors 421-1 and 421-2 to couple the corresponding sense amplifier 406 and compute component 431 to a corresponding column of memory cells (e.g., to a corresponding pair of complementary data lines 405-1 (D) and 405-2 (D_). According to various embodiments, conduction of isolation transistors 421-1 and 421-2 can be referred to as a "normal" configuration of the shift circuitry 423.

In the example illustrated in FIG. 4, the shift circuitry 423 includes another (e.g., a second) pair of isolation devices (e.g., isolation transistors 421-3 and 421-4) coupled to a complementary control signal 419 (SHIFT), which can be activated, for example, when NORM is deactivated. The isolation transistors 421-3 and 421-4 can be operated (e.g., via control signal 419) such that a particular sense amplifier 406 and compute component 431 are coupled to a different pair of complementary data lines (e.g., a pair of complementary data lines different than the pair of complementary data lines to which isolation transistors 421-1 and 421-2 couple the particular sense amplifier 406 and compute component 431), or can couple a particular sense amplifier 406 and compute component 431 to another memory array (and isolate the particular sense amplifier 406 and compute component 431 from a first memory array). According to various embodiments, the shift circuitry 423 can be arranged as a portion of (e.g., within) the sense amplifier 406, for instance.

Although the shift circuitry 423 shown in FIG. 4 includes isolation transistors 421-1 and 421-2 used to couple particular sensing circuitry 450 (e.g., a particular sense amplifier 406 and corresponding compute component 431) to a particular pair of complementary data lines 405-1 (D) and 405-2 (D_) (e.g., DIGIT(n) and DIGIT(n)_) and isolation transistors 421-3 and 421-4 are arranged to couple the particular sensing circuitry 450 to an adjacent pair of complementary data lines in one particular direction (e.g., adjacent data lines DIGIT(n+1) and DIGIT(n+1)_ shown to the right in FIG. 4), embodiments of the present disclosure are not so limited. For instance, shift circuitry can include isolation transistors 421-1 and 421-2 used to couple particular sensing circuitry to a particular pair of complementary data lines (e.g., DIGIT(n) and DIGIT(n)_ and isolation transistors 421-3 and 421-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 4).

Embodiments of the present disclosure are not limited to the configuration of shift circuitry 423 shown in FIG. 4. In a number of embodiments, shift circuitry 423 such as that shown in FIG. 4 can be operated (e.g., in conjunction with sense amplifiers 406 and compute components 431) in association with performing compute functions such as adding and subtracting functions without transferring data out of the sensing circuitry 450 via an I/O line (e.g., local I/O line (IO/IO_)), for instance.

Although not shown in FIG. 4, each column of memory cells can be coupled to a column decode line that can be activated to transfer, via local I/O line, a data value from a corresponding sense amplifier 406 and/or compute component 431 to a control component external to the array such as an external processing resource (e.g., host processor and/or other functional unit circuitry). The column decode line can be coupled to a column decoder (e.g., column decoder). However, as described herein, in a number of embodiments, data need not be transferred via such I/O lines to perform logical operations in accordance with embodiments of the present disclosure. In a number of embodiments, shift circuitry 423 can be operated in conjunction with sense amplifiers 406 and compute components 431 to perform compute functions such as adding and subtracting functions without transferring data to a control component external to the array, for instance.

The sensing circuitry 450 can be operated in several modes to perform logical operations, including a first mode in which a result of the logical operation is initially stored in the sense amplifier 406, and a second mode in which a result of the logical operation is initially stored in the compute component 431. Operation of the sensing circuitry 450 in the first mode is described below with respect to FIGS. 3 and 4, and operation of the sensing circuitry 450 in the second mode is described with respect to FIGS. 2B to 3E. Additionally with respect to the first operating mode, sensing circuitry 450 can be operated in both pre-sensing (e.g., sense amps fired before logical operation control signal active) and post-sensing (e.g., sense amps fired after logical operation control signal active) modes with a result of a logical operation being initially stored in the sense amplifier 406.

As described further below, the sense amplifier 406 can, in conjunction with the compute component 431, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The functionality of the sensing circuitry 450 of FIG. 4 is described below and summarized in Table 2 below with respect to performing logical operations and initially storing a result in the sense amplifier 406. Initially storing the result of a particular logical operation in the primary latch of sense amplifier 406 can provide improved versatility as compared to previous approaches in which the result may initially reside in a secondary latch (e.g., accumulator) of a compute component 431, and then be subsequently transferred to the sense amplifier 406, for instance.

TABLE 2

| Operation | Accumulator | Sense Amp |
|---|---|---|
| AND | Unchanged | Result |
| OR | Unchanged | Result |
| NOT | Unchanged | Result |
| SHIFT | Unchanged | Shifted Data |

Initially storing the result of a particular operation in the sense amplifier 406 (e.g., without having to perform an additional operation to move the result from the compute component 431 (e.g., accumulator) to the sense amplifier 406) is advantageous because, for instance, the result can be written to a row (of the array of memory cells) or back into the accumulator without performing a precharge cycle (e.g., on the complementary data lines 405-1 (D) and/or 405-2 (D_)).

Figure 6A:
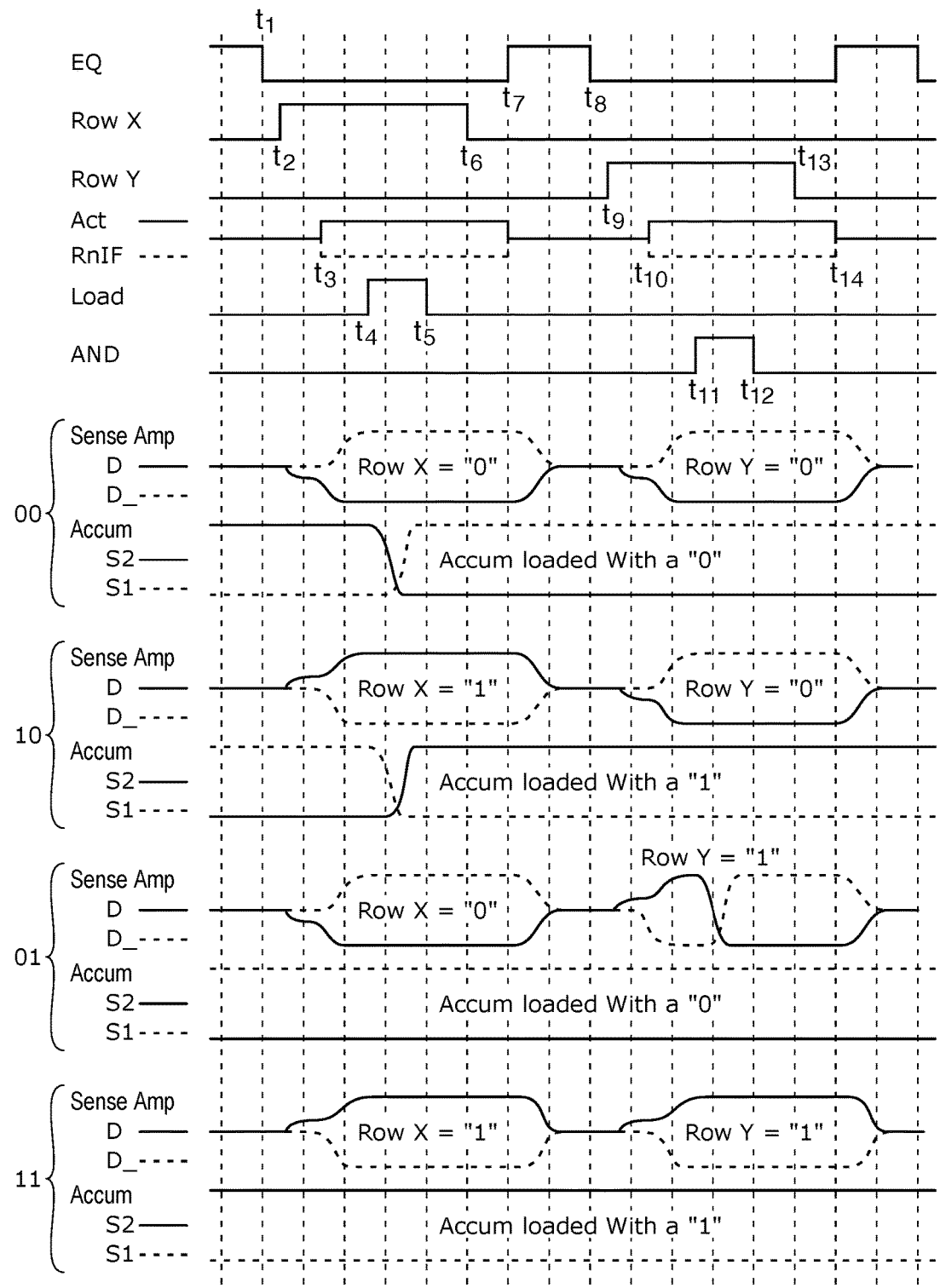
FIG. 6A illustrates a timing diagram associated with performing a number of logical operations using sensing circuitry in accordance with a number of embodiments of the present disclosure.

FIG. 6A illustrates a timing diagram associated with performing a number of logical operations using sensing circuitry in accordance with a number of embodiments of the present disclosure. FIG. 6A illustrates a timing diagram associated with initiating an AND logical operation after starting to load the second operand (e.g., Row Y data value) into the sense amplifier. FIG. 6A illustrates the sense amplifier and accumulator signals for various combinations of first and second operand data values. FIG. 6A shows the respective sense amplifier and accumulator signals corresponding to each combination of Row X data value and Row Y data value in each set. The particular timing diagram signals are discussed below with respect to the pseudo code associated with an AND operation of the circuit shown in FIG. 4.

An example of pseudo code associated with loading (e.g., copying) a first data value stored in a cell coupled to row 404-X into the accumulator can be summarized as follows:
  Copy Row X into the Accumulator:
  Deactivate EQ
  Activate Row X
  Fire Sense Amps (after which Row X data resides in the sense amps)
  Activate LOAD (sense amplifier data (Row X) is transferred to nodes S1 and S2 of the Accumulator and resides there dynamically)
  Close LOAD
  Close Row X
  Precharge In the pseudo code above, "Deactivate EQ" indicates that an equilibration signal (EQ signal shown in FIG. 6A) corresponding to the sense amplifier 406 is disabled at $t_1$ as shown in FIG. 6A (e.g., such that the complementary data lines (e.g., 405-1 (D) and 405-2 (D_) are no longer shorted to $V_{DD}/2$). After equilibration is disabled, a selected row (e.g., ROW X) is activated as indicated by "Activate Row X" in the pseudo code and shown at $t_2$ for signal Row X in FIG. 6A. When the voltage signal applied to ROW X reaches the threshold voltage (Vt) of the access transistor (e.g., 402-2) corresponding to the selected cell, the access transistor turns on and couples the data line (e.g., 405-2 (D_)) to the selected cell (e.g., to capacitor 403-2) which creates a differential voltage signal between the data lines.

After Row X is activated (e.g., selected), in the pseudo code above, "Fire Sense Amps" indicates that the sense amplifier 406 is enabled to set the primary latch and subsequently disabled. For example, as shown at $t_3$ in FIG. 6A, the ACT positive control signal (e.g., 590 shown in FIG. 5) goes high and the RnIF negative control signal (e.g., 528 shown in FIG. 5) goes low, which amplifies the differential signal between 405-1 (D) and D_ 405-2, resulting in a voltage (e.g., $V_{DD}$) corresponding to a logic 1 or a voltage (e.g., GND) corresponding to a logic 0 being on data line 405-1 (D) (and the voltage corresponding to the other logic state being on complementary data line 405-2 (D_)). The sensed data value is stored in the primary latch of sense amplifier 406. The primary energy consumption occurs in charging the data lines (e.g., 405-1 (D) or 405-2 (D_) from the equilibration voltage $V_{DD}/2$ to the rail voltage $V_{DD}$.

The four sets of possible sense amplifier and accumulator signals illustrated in FIG. 6A (e.g., one for each combination of Row X and Row Y data values) shows the behavior of signals on data lines D and D_. The Row X data value is stored in the primary latch of the sense amplifier. It should be noted that FIG. 4 shows that the memory cell including storage element 402-2, corresponding to Row X, is coupled to the complementary data line D_, while the memory cell including storage element 402-1, corresponding to Row Y, is coupled to data line D. However, as can be seen in FIG. 4, the charge stored in memory cell 402-2 (corresponding to Row X) corresponding to a "0" data value causes the voltage on data line D_ (to which memory cell 402-2 is coupled) to go high and the charge stored in memory cell 402-2 corresponding to a "1" data value causes the voltage on data line D to go low, which is opposite correspondence between data states and charge stored in memory cell 402-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 6A, causing load/pass transistors 418-1 and 418-2 to conduct. In this manner, activating the LOAD control signal enables the secondary latch in the accumulator of the compute component 431. The sensed data value stored in the sense amplifier 406 is transferred (e.g., copied) to the secondary latch. As shown for each of the four sets of possible sense amplifier and accumulator signals illustrated in FIG. 6A, the behavior at inputs of the secondary latch of the accumulator indicates the secondary latch is loaded with the Row X data value. As shown in FIG. 6A, the secondary latch of the accumulator may flip (e.g., see accumulator signals for Row X="0" and Row Y="0" and for Row X="1" and Row Y="0"), or not flip (e.g., see accumulator signals for Row X="0" and Row Y="1" and for Row X="1" and Row Y="1"), depending on the data value previously stored in the dynamic latch.

After setting the secondary latch from the data values stored in the sense amplifier (and present on the data lines 405-1 (D) and 405-2 (D_), in the pseudo code above, "Close LOAD" indicates that the LOAD control signal goes back low as shown at $t_5$ in FIG. 6A to cause the load/pass transistors 418-1 and 418-2 to stop conducting and thereby isolate the dynamic latch from the complementary data lines. However, the data value remains dynamically stored in secondary latch of the accumulator.

After storing the data value on the secondary latch, the selected row (e.g., ROW X) is deactivated as indicated by "Close Row X" and indicated at $t_6$ in FIG. 6A, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as indicated in FIG. 6A by the EQ signal going high at $t_7$. As shown in each of the four sets of possible sense amplifier and accumulator signals illustrated in FIG. 6A at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 406 and the secondary latch of the compute component 431) and the second data value (stored in a memory cell 402-1 coupled to Row Y 404-Y) includes performing particular steps which depend on the whether an AND or an OR is to be performed. Examples of pseudo code associated with "ANDing" and "ORing" the data value residing in the accumulator (e.g., the first data value stored in the memory cell 402-2 coupled to Row X 404-X) and the second data value (e.g., the data value stored in the memory cell 402-1 coupled to Row Y 404-Y) are summarized below. Example pseudo code associated with "ANDing" the data values can include:

Deactivate EQ
Activate Row Y
Fire Sense Amps (after which Row Y data resides in the sense amps)
Close Row Y
The result of the logic operation, in the next operation, will be placed on the sense amp, which will overwrite any row that is Activate.
Even when Row Y is closed, the sense amplifier still contains the Row Y data value.
Activate AND
This results in the sense amplifier being written to the value of the function (e.g., Row X AND Row Y)
If the accumulator contains a "0" (i.e., a voltage corresponding to a "0" on node S2 and a voltage corresponding to a "1" on node S1), the sense amplifier data is written to a "0"
If the accumulator contains a "1" (i.e., a voltage corresponding to a "1" on node S2 and a voltage corresponding to a "0" on node S1), the sense amplifier data remains unchanged (Row Y data)
This operation leaves the data in the accumulator unchanged.
Close AND
Precharge In the pseudo code above, "Deactivate EQ" indicates that an equilibration signal corresponding to the sense amplifier 406 is disabled (e.g., such that the complementary data lines 405-1 (D) and 405-2 (D_) are no longer shorted to $V_{DD}/2$), which is illustrated in FIG. 6A at $t_8$. After equilibration is disabled, a selected row (e.g., ROW Y) is activated as indicated in the pseudo code above by "Activate Row Y" and shown in FIG. 6A at $t_9$. When the voltage signal applied to ROW Y reaches the threshold voltage (Vt) of the access transistor (e.g., 402-1) corresponding to the selected cell, the access transistor turns on and couples the data line (e.g., D_ 405-1) to the selected cell (e.g., to capacitor 403-1) which creates a differential voltage signal between the data lines.

After Row Y is activated, in the pseudo code above, "Fire Sense Amps" indicates that the sense activated 406 is enabled to amplify the differential signal between 405-1 (D) and 405-2 (D_), resulting in a voltage (e.g., $V_{DD}$) corresponding to a logic 1 or a voltage (e.g., GND) corresponding to a logic 0 being on data line 405-1 (D) (and the voltage corresponding to the other logic state being on complementary data line 405-2 (D_)). As shown at $t_{10}$ in FIG. 6A, the ACT positive control signal (e.g., 590 shown in FIG. 5) goes high and the RnIF negative control signal (e.g., 528 shown in FIG. 5) goes low to fire the sense amplifiers. The sensed data value from memory cell 402-1 is stored in the primary latch of sense amplifiers 406, as previously described. The secondary latch still corresponds to the data value from memory cell 402-2 since the dynamic latch is unchanged.

After the second data value sensed from the memory cell 402-1 coupled to Row Y is stored in the primary latch of sense amplifier 406, in the pseudo code above, "Close Row Y" indicates that the selected row (e.g., ROW Y) can be deactivated if it is not desired to store the result of the AND logical operation back in the memory cell corresponding to Row Y. However, FIG. 6A shows that Row Y is left active such that the result of the logical operation can be stored back in the memory cell corresponding to Row Y. Isolating the memory cell corresponding to Row Y can be accomplished by the access transistor turning off to decouple the selected cell 402-1 from the data line 405-1 (D). After the selected Row Y is configured (e.g., to isolate the memory cell or not isolate the memory cell), "Activate AND" in the pseudo code above indicates that the AND control signal goes high as shown in FIG. 6A at $t_{11}$, causing pass transistor 407-1 to conduct. In this manner, activating the AND control signal causes the value of the function (e.g., Row X AND Row Y) to be written to the sense amplifier.

With the first data value (e.g., Row X) stored in the dynamic latch of the accumulator 431 and the second data value (e.g., Row Y) stored in the sense amplifier 406, if the dynamic latch of the compute component 431 contains a "0" (i.e., a voltage corresponding to a "0" on node S2 and a voltage corresponding to a "1" on node S1), the sense amplifier data is written to a "0" (regardless of the data value previously stored in the sense amplifier) since the voltage corresponding to a "1" on node S1 causes transistor 409-1 to conduct thereby coupling the sense amplifier 406 to ground through transistor 409-1, pass transistor 407-1 and data line 405-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 406. This operation leaves the data value in the accumulator unchanged (e.g., from Row X).

If the secondary latch of the accumulator contains a "1" (e.g., from Row X), then the result of the AND operation depends on the data value stored in the sense amplifier 406 (e.g., from Row Y). The result of the AND operation should be a "1" if the data value stored in the sense amplifier 406 (e.g., from Row Y) is also a "1," but the result of the AND operation should be a "0" if the data value stored in the sense amplifier 406 (e.g., from Row Y) is also a "0." The sensing circuitry 450 is configured such that if the dynamic latch of the accumulator contains a "1" (i.e., a voltage corresponding to a "1" on node S2 and a voltage corresponding to a "0" on node S1), transistor 409-1 does not conduct, the sense amplifier is not coupled to ground (as described above), and the data value previously stored in the sense amplifier 406 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 406, "Close AND" in the pseudo code above indicates that the AND control signal goes low as shown at $t_{12}$ in FIG. 6A, causing pass transistor 407-1 to stop conducting to isolate the sense amplifier 406 (and data line 405-1 (D)) from ground. If not previously done, Row Y can be closed (as shown at $t_{13}$ in FIG. 6A) and the sense amplifier can be disabled (as shown at $t_{14}$ in FIG. 6A by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 6A).

FIG. 6A shows, in the alternative, the behavior of voltage signals on the data lines (e.g., 405-1 (D) and 405-2 (D_) shown in FIG. 4) coupled to the sense amplifier (e.g., 406 shown in FIG. 4) and the behavior of voltage signals on nodes S1 and S1 of the secondary latch of the compute component (e.g., 431 shown in FIG. 4) for an AND logical operation involving each of the possible combination of operands (e.g., Row X/Row Y data values 00, 10, 01, and 11).

Although the timing diagrams illustrated in FIG. 6A and the pseudo code described above indicate initiating the AND logical operation after starting to load the second operand (e.g., Row Y data value) into the sense amplifier, the circuit shown in FIG. 4 can be successfully operated by initiating the AND logical operation before starting to load the second operand (e.g., Row Y data value) into the sense amplifier.

Figure 6B:
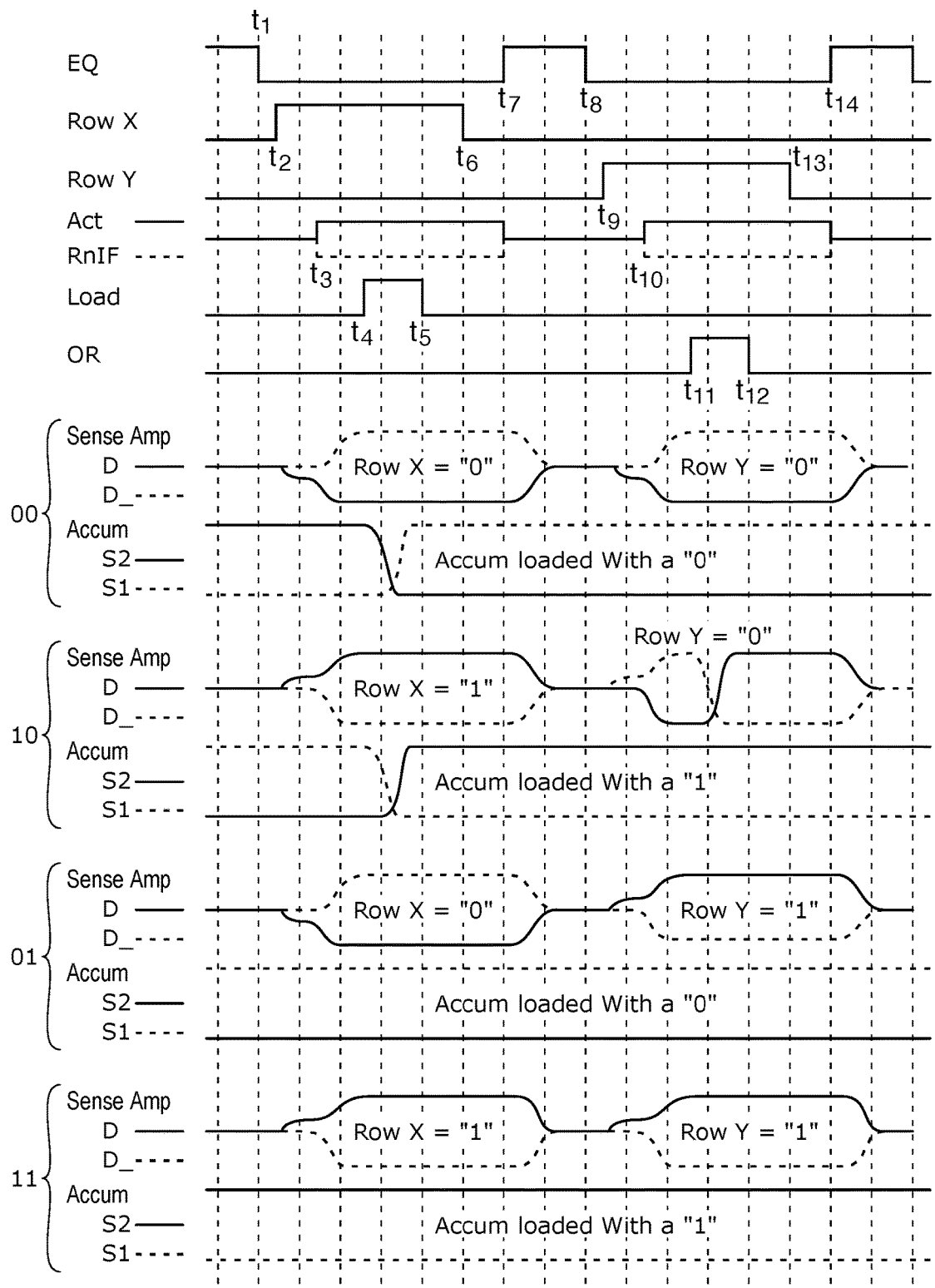
FIG. 6B illustrates a timing diagram associated with performing a number of logical operations using sensing circuitry in accordance with a number of embodiments of the present disclosure.

FIG. 6B illustrates a timing diagram associated with performing a number of logical operations using sensing circuitry in accordance with a number of embodiments of the present disclosure. FIG. 6B illustrates a timing diagram associated with initiating an OR logical operation after starting to load the second operand (e.g., Row Y data value) into the sense amplifier. FIG. 6B illustrates the sense amplifier and accumulator signals for various combinations of first and second operand data values. The particular timing diagram signals are discussed below with respect to the pseudo code associated with an AND logical operation of the circuit shown in FIG. 4.

A subsequent operation phase can alternately be associated with performing the OR operation on the first data value (now stored in the sense amplifier 406 and the secondary latch of the compute component 431) and the second data value (stored in a memory cell 402-1 coupled to Row Y 404-Y). The operations to load the Row X data into the sense amplifier and accumulator that were previously described with respect to times $t_1$-$t_7$ shown in FIG. 6A are not repeated with respect to FIG. 6B. Example pseudo code associated with "ORing" the data values can include:

Deactivate EQ
Activate Row Y
Fire Sense Amps (after which Row Y data resides in the sense amps)
Close Row Y
When Row Y is closed, the sense amplifier still contains the Row Y data value.
Activate OR
This results in the sense amplifier being written to the value of the function (e.g., Row X OR Row Y), which may overwrite the data value from Row Y previously stored in the sense amplifier as follows:
If the accumulator contains a "0" (i.e., a voltage corresponding to a "0" on node S2 and a voltage corresponding to a "1" on node S1), the sense amplifier data remains unchanged (Row Y data)
If the accumulator contains a "1" (i.e., a voltage corresponding to a "1" on node S2 and a voltage corresponding to a "0" on node S1), the sense amplifier data is written to a "1"
This operation leaves the data in the accumulator unchanged.
Close OR
Precharge The "Deactivate EQ" (shown at $t_8$ in FIG. 6B), "Activate Row Y" (shown at $t_9$ in FIG. 6B), "Fire Sense Amps" (shown at $t_{10}$ in FIG. 6B), and "Close Row Y" (shown at $t_{13}$ in FIG. 6B, and which may occur prior to initiating the particular logical function control signal), shown in the pseudo code above indicate the same functionality as previously described with respect to the AND operation pseudo code. Once the configuration of selected Row Y is appropriately configured (e.g., activated if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6B, which causes pass transistor 407-2 to conduct. In this manner, activating the OR control signal causes the value of the function (e.g., Row X OR Row Y) to be written to the sense amplifier.

With the first data value (e.g., Row X) stored in the secondary latch of the compute component 431 and the second data value (e.g., Row Y) stored in the sense amplifier 406, if the dynamic latch of the accumulator contains a "0" (i.e., a voltage corresponding to a "0" on node S2 and a voltage corresponding to a "1" on node S1), then the result of the OR operation depends on the data value stored in the sense amplifier 406 (e.g., from Row Y). The result of the OR operation should be a "1" if the data value stored in the sense amplifier 406 (e.g., from Row Y) is a "1," but the result of the OR operation should be a "0" if the data value stored in the sense amplifier 406 (e.g., from Row Y) is also a "0." The sensing circuitry 450 is configured such that if the dynamic latch of the accumulator contains a "0," with the voltage corresponding to a "0" on node S2, transistor 409-2 is off and does not conduct (and pass transistor 407-1 is also off since the AND control signal is not asserted) so the sense amplifier 406 is not coupled to ground (either side), and the data value previously stored in the sense amplifier 406 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 409-2 does conduct (as does pass transistor 407-2 since the OR control signal is asserted), and the sense amplifier 406 input coupled to data line 405-2 (D_) is coupled to ground since the voltage corresponding to a "1" on node S2 causes transistor 409-2 to conduct along with pass transistor 407-2 (which also conducts since the OR control signal is asserted). In this manner, a "1" is initially stored in the sense amplifier 406 as a result of the OR operation when the secondary latch of the accumulator contains a "1" regardless of the data value previously stored in the sense amplifier. This operation leaves the data in the accumulator unchanged. FIG. 6B shows, in the alternative, the behavior of voltage signals on the data lines (e.g., 405-1 (D) and 405-2 (D_) shown in FIG. 4) coupled to the sense amplifier (e.g., 406 shown in FIG. 4) and the behavior of voltage signals on nodes S1 and S2 of the secondary latch of the compute component 431 for an OR logical operation involving each of the possible combination of operands (e.g., Row X/Row Y data values 00, 10, 01, and 11).

After the result of the OR operation is initially stored in the sense amplifier 406, "Close OR" in the pseudo code above indicates that the OR control signal goes low as shown at $t_{12}$ in FIG. 6B, causing pass transistor 407-2 to stop conducting to isolate the sense amplifier 406 (and data line D 405-2) from ground. If not previously done, Row Y can be closed (as shown at $t_{13}$ in FIG. 6B) and the sense amplifier can be disabled (as shown at $t_{14}$ in FIG. 6B by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6B.

The sensing circuitry 450 illustrated in FIG. 4 can provide additional logical operations flexibility as follows. By substituting operation of the ANDinv control signal for operation of the AND control signal, and/or substituting operation of the ORinv control signal for operation of the OR control signal in the AND and OR operations described above, the logical operations can be changed from {Row X AND Row Y} to {~Row X AND Row Y} (where "~Row X" indicates an opposite of the Row X data value, e.g., NOT Row X) and can be changed from {Row X OR Row Y} to {~Row X OR Row Y}. For example, during an AND operation involving the inverted data values, the ANDinv control signal can be asserted instead of the AND control signal, and during an OR operation involving the inverted data values, the ORInv control signal can be asserted instead of the OR control signal. Activating the ORinv control signal causes transistor 414-1 to conduct and activating the ANDinv control signal causes transistor 414-2 to conduct. In each case, asserting the appropriate inverted control signal can flip the sense amplifier and cause the result initially stored in the sense amplifier 406 to be that of the AND operation using inverted Row X and true Row Y data values or that of the OR operation using the inverted Row X and true Row Y data values. A true or compliment version of one data value can be used in the accumulator to perform the logical operation (e.g., AND, OR), for example, by loading a data value to be inverted first and a data value that is not to be inverted second.

In a similar approach to that described above with respect to inverting the data values for the AND and OR operations described above, the sensing circuitry shown in FIG. 4 can perform a NOT (e.g., invert) operation by putting the non-inverted data value into the dynamic latch of the accumulator and using that data to invert the data value in the sense amplifier 406. As previously mentioned, activating the ORinv control signal causes transistor 414-1 to conduct and activating the ANDinv control signal causes transistor 414-2 to conduct. The ORinv and/or ANDinv control signals are used in implementing the NOT function, as described further below:

Copy Row X into the Accumulator
Deactivate EQ
Activate Row X
Fire Sense Amps (after which Row X data resides in the sense amps)
Activate LOAD (sense amplifier data (Row X) is transferred to nodes S1 and S2 of the Accumulator and resides there dynamically
Close LOAD
Activate ANDinv and ORinv (which puts the compliment data value on the data lines)

This results in the data value in the sense amplifier being inverted (e.g., the sense amplifier latch is flipped)

This operation leaves the data in the accumulator unchanged
Close ANDinv and ORinv
Close Row X
Precharge The "Deactivate EQ," "Activate Row X," "Fire Sense Amps," "Activate LOAD," and "Close LOAD" shown in the pseudo code above indicate the same functionality as the same operations in the pseudo code for the "Copy Row X into the Accumulator" initial operation phase described above prior to pseudo code for the AND operation and OR operation. However, rather than closing the Row X and Precharging after the Row X data is loaded into the sense amplifier 406 and copied into the dynamic latch, a compliment version of the data value in the dynamic latch of the accumulator can be placed on the data line and thus transferred to the sense amplifier 406 by enabling (e.g., causing transistor to conduct) and disabling the invert transistors (e.g., ANDinv and ORinv). This results in the sense amplifier 406 being flipped from the true data value that was previously stored in the sense amplifier to a compliment data value (e.g., inverted data value) stored in the sense amplifier. That is, a true or compliment version of the data value in the accumulator can be transferred to the sense amplifier by activating and deactivating ANDinv and ORinv. This operation leaves the data in the accumulator unchanged.

Because the sensing circuitry 450 shown in FIG. 4 initially stores the result of the AND, OR, and NOT logical operations in the sense amplifier 406 (e.g., on the sense amplifier nodes), these logical operation results can be communicated easily and quickly to any active row, any row activated after the logical operation is complete, and/or into the secondary latch of the compute component 431. The sense amplifier 406 and sequencing for the AND, OR, and/or NOT logical operations can also be interchanged by appropriate firing of the AND, OR, ANDinv, and/or ORinv control signals (and operation of corresponding transistors having a gate coupled to the particular control signal) before the sense amplifier 406 fires.

When performing logical operations in this manner, the sense amplifier 406 can be pre-seeded with a data value from the dynamic latch of the accumulator to reduce overall current utilized because the sense amps 406 are not at full rail voltages (e.g., supply voltage or ground/reference voltage) when accumulator function is copied to the sense amplifier 406. An operation sequence with a pre-seeded sense amplifier 406 either forces one of the data lines to the reference voltage (leaving the complementary data line at $V_{DD}/2$, or leaves the complementary data lines unchanged. The sense amplifier 406 pulls the respective data lines to full rails when the sense amplifier 406 fires. Using this sequence of operations will overwrite data in an Activate Row.

A SHIFT operation can be accomplished by multiplexing ("muxing") two neighboring data line complementary pairs using a traditional DRAM isolation (ISO) scheme. According to embodiments of the present disclosure, the shift circuitry 423 can be used for shifting data values stored in memory cells coupled to a particular pair of complementary data lines to the sensing circuitry 450 (e.g., sense amplifier 406) corresponding to a different pair of complementary data lines (e.g., such as a sense amplifier 406 corresponding to a left or right adjacent pair of complementary data lines. As used herein, a sense amplifier 406 corresponds to the pair of complementary data lines to which the sense amplifier is coupled when isolation transistors 421-1 and 421-2 are conducting. The SHIFT operations (right or left) do not pre-copy the Row X data value into the accumulator. Operations to shift right Row X can be summarized as follows:

Deactivate Norm and Activate Shift
Deactivate EQ
Activate Row X
Fire Sense Amps (after which shifted Row X data resides in the sense amps)
Activate Norm and Deactivate Shift
Close Row X
Precharge In the pseudo code above, "Deactivate Norm and Activate Shift" indicates that a NORM control signal goes low causing isolation transistors 421-1 and 421-2 of the shift circuitry 423 to not conduct (e.g., isolate the sense amplifier from the corresponding pair of complementary data lines). The SHIFT control signal goes high causing isolation transistors 421-3 and 421-4 to conduct, thereby coupling the sense amplifier 406 to the left adjacent pair of complementary data lines (e.g., on the memory array side of non-conducting isolation transistors 421-1 and 421-2 for the left adjacent pair of complementary data lines).

After the shift circuitry 423 is configured, the "Deactivate EQ," "Activate Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 406.

In the pseudo code above, "Activate Norm and Deactivate Shift" indicates that a NORM control signal goes high causing isolation transistors 421-1 and 421-2 of the shift circuitry 423 to conduct (e.g., coupling the sense amplifier to the corresponding pair of complementary data lines), and the SHIFT control signal goes low causing isolation transistors 421-3 and 421-4 to not conduct and isolating the sense amplifier 406 from the left adjacent pair of complementary data lines (e.g., on the memory array side of non-conducting isolation transistors 421-1 and 421-2 for the left adjacent pair of complementary data lines). Since Row X is still active, the Row X data value that has been shifted right is transferred to Row X of the corresponding pair of complementary data lines through isolation transistors 421-1 and 421-2.

After the Row X data values are shifted right to the corresponding pair of complementary data lines, the selected row (e.g., ROW X) is deactivated as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

Activate Norm and Deactivate Shift
Deactivate EQ
Activate Row X
Fire Sense Amps (after which Row X data resides in the sense amps)
Deactivate Norm and Activate Shift
Sense amplifier data (shifted left Row X) is transferred to Row X
Close Row X
Precharge In the pseudo code above, "Activate Norm and Deactivate Shift" indicates that a NORM control signal goes high causing isolation transistors 421-1 and 421-2 of the shift circuitry 423 to conduct, and the SHIFT control signal goes low causing isolation transistors 421-3 and 421-4 to not conduct. This configuration couples the sense amplifier 406 to a corresponding pair of complementary data lines and isolates the sense amplifier from the right adjacent pair of complementary data lines.

After the shift circuitry is configured, the "Deactivate EQ," "Activate Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 450 is stored in the sense amplifier 406.

In the pseudo code above, "Deactivate Norm and Activate Shift" indicates that a NORM control signal goes low causing isolation transistors 421-1 and 421-2 of the shift circuitry 423 to not conduct (e.g., isolate the sense amplifier from the corresponding pair of complementary data lines), and the SHIFT control signal goes high causing isolation transistors 421-3 and 421-4 to conduct coupling the sense amplifier to the left adjacent pair of complementary data lines (e.g., on the memory array side of non-conducting isolation transistors 421-1 and 421-2 for the left adjacent pair of complementary data lines. Since Row X is still active, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at 6F^2 or 4F^2 memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Figure 7:
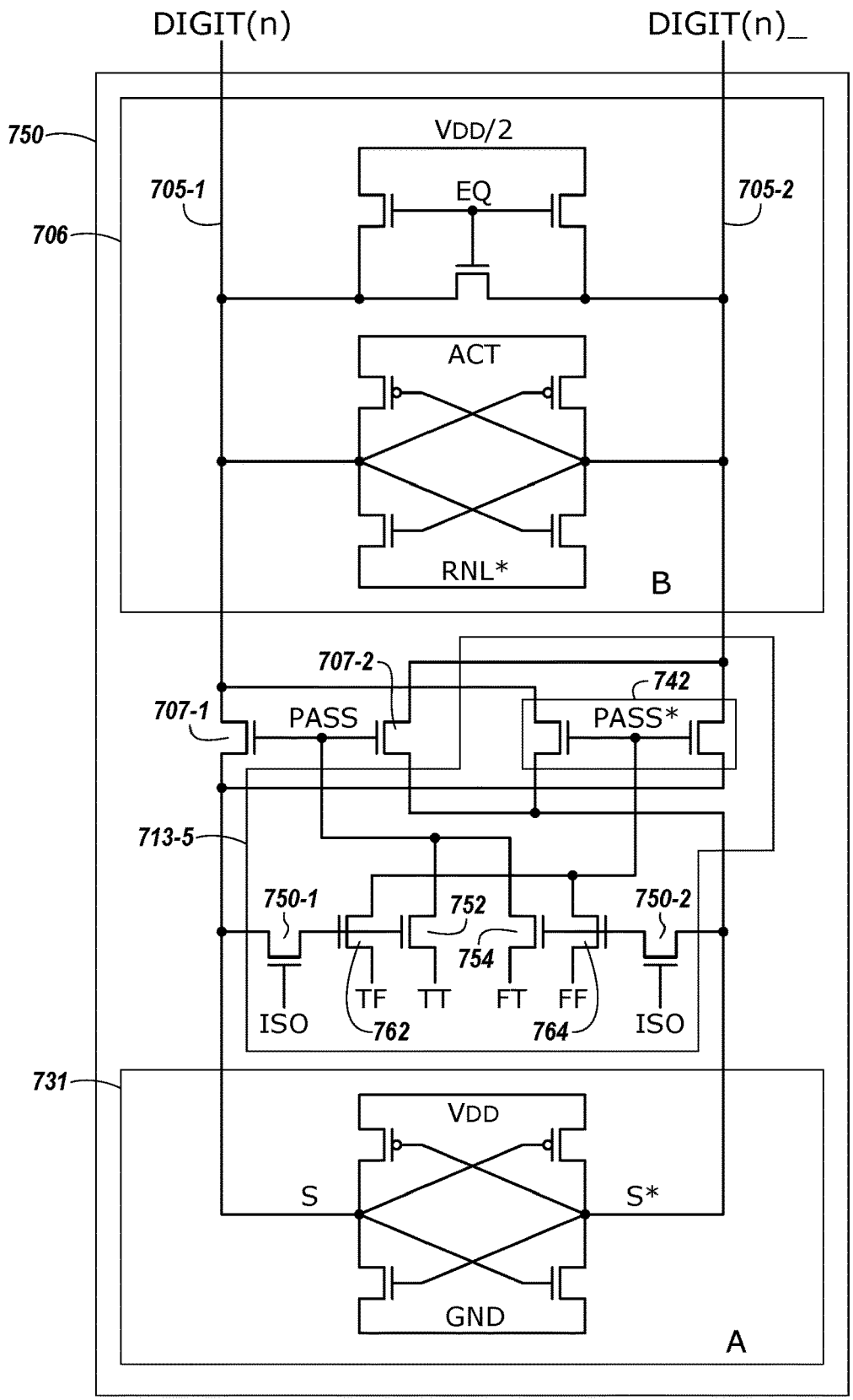
FIG. 7 is a schematic diagram illustrating sensing circuitry having selectable logical operation selection logic in accordance with a number of embodiments of the present disclosure.

FIG. 7 is a schematic diagram illustrating sensing circuitry having selectable logical operation selection logic in accordance with a number of embodiments of the present disclosure. FIG. 7 shows a sense amplifier 706 coupled to a pair of complementary sense lines 705-1 and 705-2, and a compute component 731 coupled to the sense amplifier 706 via pass gates 707-1 and 707-2. The gates of the pass gates 707-1 and 707-2 can be controlled by a logical operation selection logic signal, PASS, which can be output from logical operation selection logic 713-5. FIG. 7 shows the compute component 731 labeled "A" and the sense amplifier 706 labeled "B" to indicate that the data value stored in the compute component 731 is the "A" data value and the data value stored in the sense amplifier 706 is the "B" data value shown in the logic tables illustrated with respect to FIG. 8.

The sensing circuitry 750 illustrated in FIG. 7 includes logical operation selection logic 713-5. In this example, the logic 713-5 comprises swap gates 742 controlled by a logical operation selection logic signal PASS*. The logical operation selection logic 713-5 also comprises four logic selection transistors: logic selection transistor 762 coupled between the gates of the swap transistors 742 and a TF signal control line, logic selection transistor 752 coupled between the gates of the pass gates 707-1 and 707-2 and a TT signal control line, logic selection transistor 754 coupled between the gates of the pass gates 707-1 and 707-2 and a FT signal control line, and logic selection transistor 764 coupled between the gates of the swap transistors 742 and a FF signal control line. Gates of logic selection transistors 762 and 752 are coupled to the true sense line (e.g., 705-1) through isolation transistor 781-1 (having a gate coupled to an ISO signal control line), and gates of logic selection transistors 764 and 754 are coupled to the complementary sense line (e.g., 705-2) through isolation transistor 781-2 (also having a gate coupled to an ISO signal control line).

Logic selection transistors 752 and 754 are arranged similarly to transistor 407-1 (coupled to an AND signal control line) and transistor 407-2 (coupled to an OR signal control line) respectively, as shown in FIG. 4. Operation of logic selection transistors 752 and 754 are similar based on the state of the TT and FT selection signals and the data values on the respective complementary sense lines at the time the ISO signal is asserted. Logic selection transistors 762 and 764 also operate in a similar manner to control continuity of the swap transistors 742. That is, to OPEN (e.g., turn on) the swap transistors 742, either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 742 will not be OPENed by a particular logic selection transistor.

The PASS* control signal is not necessarily complementary to the PASS control signal. For instance, it is possible for the PASS and PASS* control signals to both be activated or both be deactivated at the same time. However, activation of both the PASS and PASS* control signals at the same time shorts the pair of complementary sense lines together, which may be a disruptive configuration to be avoided. Logical operations results for the sensing circuitry illustrated in FIG. 7 are summarized in the logic table illustrated in FIG. 8.

FIG. 8 is a logic table illustrating selectable logic operation results implementable by the sensing circuitry shown in FIG. 7 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 706 and compute component 731. The four control signals, in conjunction with a particular data value present on the complementary sense lines, controls the continuity of the pass gates 707-1 and 707-2 and swap transistors 742, which in turn affects the data value in the compute component 731 and/or sense amplifier 706 before/after firing. The capability to selectably control continuity of the swap transistors 742 facilitates implementing logical operations involving inverse data values (e.g., inverse operands and/or inverse result), among others.

The logic table illustrated in FIG. 8 shows the starting data value stored in the compute component 731 shown in column A at 844, and the starting data value stored in the sense amplifier 706 shown in column B at 845. The other 3 top column headings (NOT OPEN, OPEN TRUE, and OPEN INVERT) in the logic table of FIG. 8 refer to the continuity of the pass gates 707-1 and 707-2, and the swap transistors 742, which can respectively be controlled to be OPEN or CLOSED depending on the state of the four logic selection control signals (e.g., TF, TT, FT, and FF), in conjunction with a particular data value present on the pair of complementary sense lines 705-1 and 705-2 when the ISO control signal is asserted. The "Not Open" column corresponds to the pass gates 707-1 and 707-2 and the swap transistors 742 both being in a non-conducting condition, the "Open True" corresponds to the pass gates 707-1 and 707-2 being in a conducting condition, and the "Open Invert" corresponds to the swap transistors 742 being in a conducting condition. The configuration corresponding to the pass gates 707-1 and 707-2 and the swap transistors 742 both being in a conducting condition is not reflected in the logic table of FIG. 8 since this results in the sense lines being shorted together.

Via selective control of the continuity of the pass gates 707-1 and 707-2 and the swap transistors 742, each of the three columns of the first set of two rows of the upper portion of the logic table of FIG. 8 can be combined with each of the three columns of the second set of two rows below the first set to provide 3×3=9 different result combinations, corresponding to nine different logical operations, as indicated by the various connecting paths shown at 875. The nine different selectable logical operations that can be implemented by the sensing circuitry 750 are summarized in the logic table illustrated in FIG. 8.

The columns of the lower portion of the logic table illustrated in FIG. 8 show a heading 880 that includes the state of logic selection control signals. For example, the state of a first logic selection control signal is provided in row 876, the state of a second logic selection control signal is provided in row 877, the state of a third logic selection control signal is provided in row 878, and the state of a fourth logic selection control signal is provided in row 879. The particular logical operation corresponding to the results is summarized in row 847.

As such, the sensing circuitry shown in FIG. 7 can be used to perform various logical operations as shown in FIG. 8. For example, the sensing circuitry 750 can be operated to perform various logical operations (e.g., AND and OR logical operations) in association with comparing data patterns in memory in accordance with a number of embodiments of the present disclosure.

CONCLUSION

The present disclosure includes apparatuses and methods related to performing comparison operations in a memory. An example apparatus might include a first address space of a memory array comprising a first number of memory cells coupled to a sense line and to a first number of select lines. A first value can be stored in the first address space. A second address space of the memory array comprises a second number of memory cells coupled to the sense line and to a second number of select lines. A second value can be stored in the second address space. A third address space of the memory array comprises a third number of memory cells coupled to the sense line and to a third number of select lines. A result can be stored in the third address space. Sensing circuitry can be configured to receive the first value and the second value, compare the first value with the second value to determine which of the first value and the second value is greater, and store the result of the comparison operation in the third address space.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a first address space of a memory array comprising a first number of memory cells coupled to a sense line and to a first number of select lines wherein the first address space can store a first value;
a second address space of the memory array comprising a second number of memory cells coupled to the sense line and to a second number of select lines wherein the second address space can store a second value;
a third address space of the memory array comprising a third number of memory cells coupled to the sense line and to a third number of select lines wherein the third address space can store a result of a comparison operation; and
a controller configured to control sensing circuitry to:
perform a plurality of logical operations to perform the comparison operation on the first value and the second value, wherein at least one of the plurality of logical operations includes sequentially activating a single select line at a time; and
store the result of the comparison operation in the third address space.

2. The apparatus of claim 1, wherein the controller is configured to control the sensing circuitry to determine, sequentially from a most significant bit to a least significant bit, whether a bit from a logical representation of the first value is equal to a corresponding bit from a logical representation of the second value.

3. The apparatus of claim 2, wherein the controller is configured to control the sensing circuitry to, responsive to a determination that the bit from the logical representation of the first value is equal to the corresponding bit from the logical representation of the second value; and if all previous bits from the logical representation of the first value are equal to all corresponding bits from the logical representation of the second value, store a bit in the third address space that indicates that the first value is equal to the second value.

4. The apparatus of claim 2, wherein the controller is configured to control the sensing circuitry to, responsive to a determination that the bit from the logical representation of the first value is not equal to the corresponding bit from the logical representation of the second value, determine whether the bit from the logical representation of the first value is greater than the corresponding bit from the logical representation of the second value.

5. The apparatus of claim 4, wherein the controller is configured to control the sensing circuitry to, responsive to a determination that the bit from the logical representation of the first value is greater than the corresponding bit from the logical representation of the second value, store a bit in the third address space that indicates that the first value is greater than the second value.

6. The apparatus of claim 4, wherein the controller is configured to control the sensing circuitry to, responsive to a determination that the corresponding bit from the logical representation of the second value is greater than the bit from the logical representation of the first value, store a bit in the third address space that indicates that the second value is greater than the first value.

7. An apparatus, comprising:
an array of memory cells;
sensing circuitry coupled to the array; and
a controller coupled to the array, wherein the controller is configured to control the sensing circuitry to:
perform a plurality of logical operations to compare a first value to a second value, wherein a logical representation of the first value is stored in a first portion of a number of memory cells coupled to a sense line of the array and a logical representation of the second value is stored in a second portion of the number of memory cells coupled to the sense line of the array, and
wherein performing at least one of the plurality of logical operations comprises sequentially activating a single select line at a time.

8. The apparatus of claim 7, wherein the controller is further configured to control the sensing circuitry to store a logical representation of a result of the plurality of logical operations in a third portion of the number of memory cells coupled to the sense line of the array.

9. The apparatus of claim 7, wherein the controller is further configured to control the sensing circuitry to perform the plurality of logical operations to determine whether the first value is different than the second value.

10. The apparatus of claim 9, wherein the controller is further configured to control the sensing circuitry to perform the plurality of logical operations to determine one of:
whether the second value is greater than the first value; and
whether the first value is greater than the second value.

11. The apparatus of claim 7, wherein the controller is further configured to control the sensing circuitry to perform the plurality of logical operations to determine whether the first value is equal to the second value.

12. An apparatus, comprising:
an array of memory cells comprising a plurality of pairs of complementary sense lines and a plurality of select lines;
sensing circuitry coupled to the array, wherein the sensing circuitry comprises a sense amplifier and a compute component coupled to each of the plurality of pairs of complementary sense lines; and
a controller coupled to the array, wherein the controller is configured to control the sensing circuitry to:
compare a number of first values to a number of second values using the compute component coupled to each of the plurality of pairs of complementary sense lines and without activating more than one of the plurality of select lines concurrently,
wherein the number of first values are stored in a first number of memory cells coupled to a number of the plurality of pairs of complementary sense lines, and
wherein the number of second values are stored in a second number of memory cells to the number of the plurality of pairs of complementary sense lines.

13. The apparatus of claim 12, wherein the controller is further configured to control the sensing circuitry to perform a plurality of logical operations to compare the number of first values to the number of second values.

14. The apparatus of claim 13, wherein the controller is further configured to control the sensing circuitry to compare each of the number of first values to each the number of second values using a same quantity of the plurality of logical operations.

15. The apparatus of claim 12, wherein the controller is further configured to control the sensing circuitry to store a number of results of comparing the number of first values to the number of second values in a third number of memory cells coupled to the number of the plurality of pairs of complementary sense lines.

16. The apparatus of claim 12, wherein each of the first number of memory cells is coupled to a different sense line of the first number of sense lines.

17. The apparatus of claim 12, wherein each of the second number of memory cells is coupled to a different sense line of the second number of sense lines.

18. The apparatus of claim 12, wherein the controller is further configured to control the sensing circuitry to compare a respective first value from the number of first values to a respective second value from the number of second values,
wherein the respective first value and the respective second value are stored in memory cells coupled to a same sense line of the number of the plurality of pairs of complementary sense lines.

19. The apparatus of claim 12, wherein the sensing circuitry further comprises logical operation selection logic, and
wherein the controller is further configured to control the logical operation selection logic to select each of the plurality of logical operations.

20. The apparatus of claim 12, wherein the compute component comprises a number of transistors formed on pitch with a number of transistors of the sense amplifier.

* * * * *